(12) United States Patent
Misaki et al.

(10) Patent No.: US 10,957,990 B2
(45) Date of Patent: Mar. 23, 2021

(54) SCANNING ANTENNA

(71) Applicant: SHARP KABUSHIKI KAISHA, Sakai (JP)

(72) Inventors: Katsunori Misaki, Yonago (JP); Satoshi Ueda, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 205 days.

(21) Appl. No.: 16/305,804

(22) PCT Filed: May 26, 2017

(86) PCT No.: PCT/JP2017/019713
§ 371 (c)(1),
(2) Date: Nov. 29, 2018

(87) PCT Pub. No.: WO2017/208996
PCT Pub. Date: Dec. 7, 2017

(65) Prior Publication Data
US 2020/0328528 A1    Oct. 15, 2020

(30) Foreign Application Priority Data

May 30, 2016   (JP) .............................. JP2016-107369

(51) Int. Cl.
H01Q 21/06 (2006.01)
H01Q 9/04 (2006.01)
(Continued)

(52) U.S. Cl.
CPC ............ H01Q 21/065 (2013.01); G02F 1/13 (2013.01); G02F 1/1333 (2013.01);
(Continued)

(58) Field of Classification Search
CPC .. H01Q 21/065; H01Q 9/0407; H01Q 21/064; H01Q 21/06; H01Q 9/04;
(Continued)

(56) References Cited

U.S. PATENT DOCUMENTS 7,466,269 B2   12/2008   Haziza
7,847,894 B2   12/2010   Rho
(Continued)

FOREIGN PATENT DOCUMENTS

JP   2002-217640 A   8/2002
JP   2007-116573 A   5/2007
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

Primary Examiner — Hai V Tran
(74) Attorney, Agent, or Firm — ScienBiziP, P.C.

(57) ABSTRACT

A scanning antenna provided with an array of a plurality of antenna units includes a TFT substrate, a slot substrate, and a liquid crystal layer disposed between the TFT substrate and the slot substrate. The slot substrate includes a second dielectric substrate, a slot electrode supported on a first main surface of the second dielectric substrate, and a first dielectric layer disposed between the second dielectric substrate and the slot electrode. The slot electrode has tensile stress. The first dielectric layer has compressive stress.

11 Claims, 23 Drawing Sheets

(51) Int. Cl.
*H01L 27/12* (2006.01)
*G02F 1/13* (2006.01)
*G02F 1/1343* (2006.01)
*G02F 1/1333* (2006.01)

(52) U.S. Cl.
CPC ............ *G02F 1/1343* (2013.01); *H01L 27/12* (2013.01); *H01L 27/124* (2013.01); *H01L 27/1255* (2013.01); *H01Q 9/04* (2013.01); *H01Q 9/0407* (2013.01); *H01Q 21/06* (2013.01); *H01Q 21/064* (2013.01)

(58) Field of Classification Search
CPC ... H01L 27/12; H01L 27/124; H01L 27/1255; G02F 1/1343; G02F 1/1333; G02F 1/13
USPC ......................................................... 343/720
See application file for complete search history.

(56) References Cited

U.S. PATENT DOCUMENTS

| | | | |
|---|---|---|---|
| 2007/0085108 | A1 | 4/2007 | White et al. |
| 2012/0092577 | A1 | 4/2012 | Shi et al. |
| 2012/0138922 | A1 | 6/2012 | Yamazaki et al. |
| 2012/0194399 | A1 | 8/2012 | Bily et al. |
| 2013/0320334 | A1 | 12/2013 | Yamazaki et al. |
| 2014/0286076 | A1 | 9/2014 | Aoki et al. |
| 2014/0346504 | A1* | 11/2014 | Misaki ............... H01L 21/0217 257/43 |
| 2015/0169107 | A1* | 6/2015 | Misaki ................. G06F 3/0412 345/174 |
| 2018/0138593 | A1* | 5/2018 | Nakazawa ............. G02F 1/292 |
| 2018/0138594 | A1* | 5/2018 | Orui ........................ H01Q 3/34 |
| 2018/0287254 | A1* | 10/2018 | Nakano ................. G02F 1/1368 |
| 2018/0294542 | A1* | 10/2018 | Minoura ............... H01Q 13/22 |
| 2019/0115660 | A1* | 4/2019 | Inukai ...................... H01Q 3/36 |
| 2020/0286931 | A1* | 9/2020 | Takahashi ............. H01Q 13/22 |
| 2020/0295457 | A1* | 9/2020 | Yasuo ................... H01Q 15/14 |
| 2020/0303817 | A1* | 9/2020 | Mizusaki ............... H01Q 21/06 |
| 2020/0328236 | A1* | 10/2020 | Misaki ................ H01L 27/1255 |
| 2020/0335874 | A1* | 10/2020 | Mizusaki ................. H01Q 3/44 |

FOREIGN PATENT DOCUMENTS

| | | |
|---|---|---|
| JP | 2007-523574 A | 8/2007 |
| JP | 2007-295044 A | 11/2007 |
| JP | 2009-538565 A | 11/2009 |
| JP | 2012-134475 A | 7/2012 |
| JP | 2012-248982 A | 12/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |

OTHER PUBLICATIONS

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 DIGESTpp.824-826.

Kuki, "New Functional Element Using Liquid Crystal" Polymer, vol. 55, August issue, pp. 599-602 (2006) (A concise explanation of the relevance can be found in paragraph [0061] of the specification of the subject application).

Co-pending letter regarding a related co-pending U.S. Appl. No. 15/542,488, filed Jul. 10, 2017.

* cited by examiner

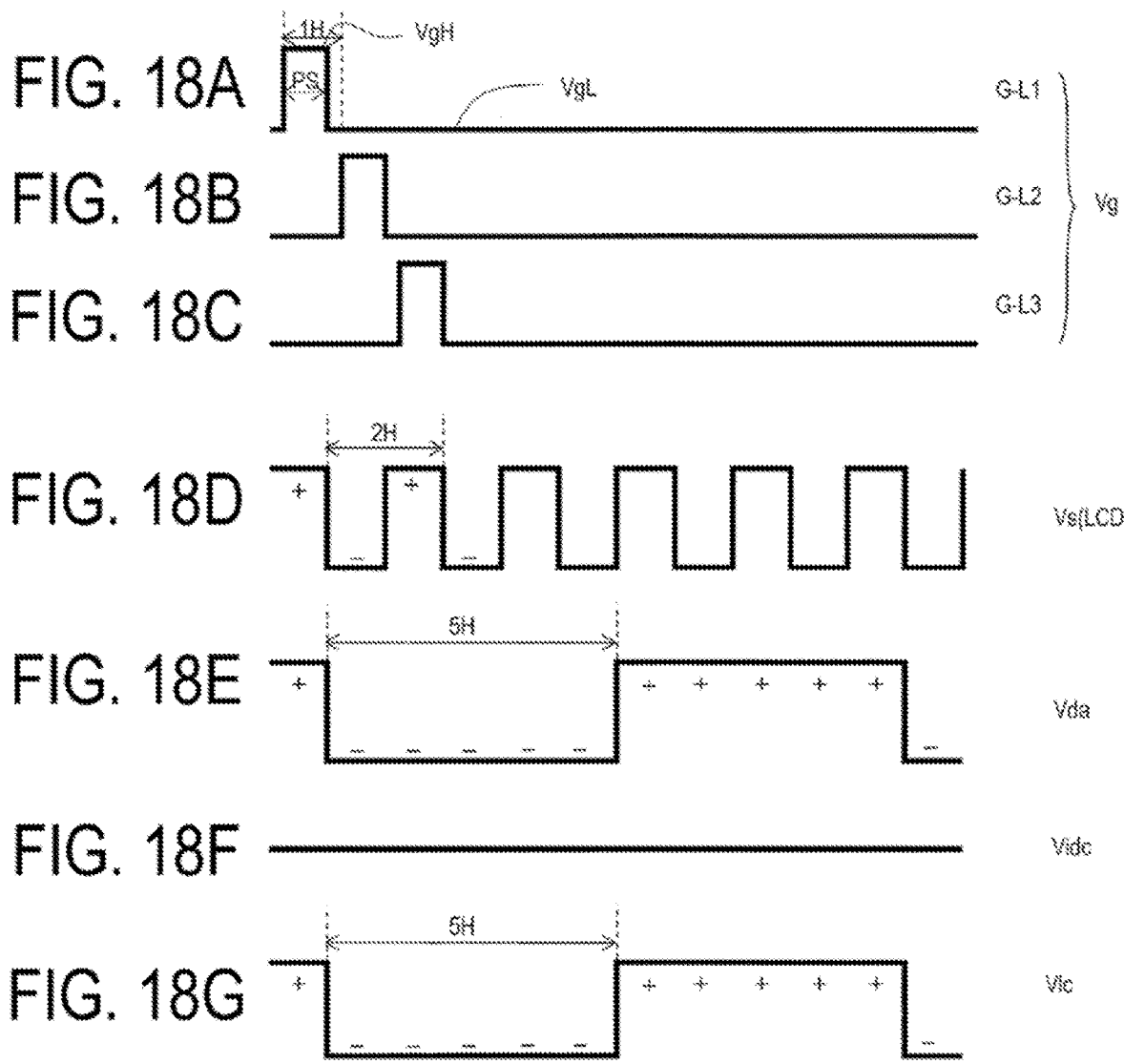

FIG. 19E ——————————————————— 0  Vlc(OFF)

SCANNING ANTENNA

TECHNICAL FIELD

The disclosure relates to a scanning antenna.

BACKGROUND ART

An antenna for mobile communication or satellite broadcasting requires a function to change a beam direction (referred to as "beam scanning" or "beam steering"). As the antenna having such a function (hereinafter referred to as a "scanned antenna"), a phased array antenna including antenna units is known. However, an existing phased array antenna is expensive and thus, has an obstacle for popularization as a consumer product. Particularly, as the number of antenna units increases, the cost rises considerably.

Therefore, a scanning antenna utilizing high dielectric anisotropy (birefringence) of a liquid crystal material (including nematic liquid crystal and polymer dispersed liquid crystal) has been proposed (PTL 1 to PTL 4 and NPL 1). Since a dielectric constant of a liquid crystal material has frequency dispersion, a dielectric constant in a frequency band for microwaves (may also be referred to as a "dielectric constant for microwaves") is particularly denoted herein by a "dielectric constant M ($\varepsilon_M$)."

PTL 3 and NPL 1 each describe an inexpensive scanning antenna that can be obtained by utilizing liquid crystal display device (hereinafter referred to as "LCD") technology.

CITATION LIST

Patent Literature

PTL 1: JP 2007-116573 A
PTL 2: JP 2007-295044 A
PTL 3: JP 2009-538565 A
PTL 4: JP 2013-539949 A

Non Patent Literature

NPL 1: R. A. Stevenson et al., "Rethinking Wireless Communications: Advanced Antenna Design using LCD Technology", SID 2015 DIGEST, pp. 827-830.
NPL 2: M. ANDO et al., "A Radial Line Slot Antenna for 12 GMz Satellite TV Reception", IEEE Transactions of Antennas and Propagation, Vol. AP-33, No. 12, pp. 1347-1353 (1985).

SUMMARY

Technical Problem

As described above, although the idea of realizing an inexpensive scanning antenna by applying the LCD technology is known, there is no document specifically describing a structure, a manufacturing method, and a driving method of a scanning antenna utilizing the LCD technology.

Therefore, an object of the disclosure is to provide a scanning antenna that can be mass-produced by utilizing existing LCD manufacturing technology, and to provide a manufacturing method of the same.

Solution to Problem

A scanning antenna according to an embodiment of the disclosure is a scanning antenna provided with an array of a plurality of antenna units. The scanning antenna includes a thin-film transistor (TFT) substrate including a first dielectric substrate, a plurality of TFTs supported on the first dielectric substrate, a plurality of gate bus lines, a plurality of source bus lines, and a plurality of patch electrodes; a slot substrate including a second dielectric substrate, a slot electrode supported on a first main surface of the second dielectric substrate, and a first dielectric layer disposed between the second dielectric substrate and the slot electrode; a liquid crystal layer provided between the TFT substrate and the slot substrate; and a reflective conductive plate disposed to face via a dielectric layer a second main surface opposite the first main surface of the second dielectric substrate. The slot electrode includes a plurality of slots disposed corresponding to the plurality of patch electrodes. The plurality of patch electrodes are each connected to a drain of a corresponding TFT. The slot electrode has tensile stress. The first dielectric layer has compressive stress.

In an embodiment, the slot electrode includes a Cu layer, and has a thickness of from approximately 2 μm to approximately 6 μm, inclusive.

In an embodiment, the first dielectric layer includes a silicon nitride layer, and has a thickness of from approximately 200 nm to approximately 900 nm, inclusive.

In an embodiment, the first dielectric layer includes a silicon oxide layer, and has a thickness of from approximately 200 nm to approximately 900 nm, inclusive.

In an embodiment, the first dielectric layer includes a silicon nitride layer and a silicon oxide layer, the silicon nitride layer is closer to the slot electrode than the silicon oxide layer, and the first dielectric layer has a thickness of from approximately 200 nm to approximately 900 nm, inclusive.

In an embodiment, the first dielectric layer includes a silicon nitride layer and a silicon oxide layer, the silicon oxide layer is closer to the slot electrode than the silicon nitride layer, and the first dielectric layer has a thickness of from approximately 200 nm to approximately 900 nm, inclusive.

In an embodiment, the silicon nitride layer has a hydrogen removal amount of approximately $3\times10^{16}/cm^2$ or less.

In an embodiment, the silicon nitride layer has a refractive index of approximately 1.805 or greater.

In an embodiment, the silicon oxide layer has a refractive index of from approximately 1.4 to approximately 1.6, inclusive.

In an embodiment, the second dielectric substrate is a glass substrate, and has a thickness of from approximately 0.65 mm to approximately 0.74 mm, inclusive.

In an embodiment, the slot substrate further includes a conductive layer covering a surface of the slot electrode.

A method of manufacturing a scanning antenna according to an embodiment of the disclosure is a method of manufacturing a scanning antenna according to any one of the above-described embodiments, and the method includes the step of preparing the slot substrate. The step of preparing the slot substrate includes the steps of (A) providing the second dielectric substrate, (B) forming the first dielectric layer having compressive stress on the first main surface of the second dielectric substrate, and (C) forming the slot electrode having tensile stress on the surface of the first dielectric layer.

A scanning antenna according to another embodiment of the disclosure is a scanning antenna provided with an array of a plurality of antenna units. The scanning antenna includes a TFT substrate including a first dielectric substrate, a plurality of TFTs supported on the first dielectric substrate, a plurality of gate bus lines, a plurality of source bus lines, and a plurality of patch electrodes; a slot substrate including a second dielectric substrate, and a slot electrode supported on a first main surface of the second dielectric substrate; a liquid crystal layer provided between the TFT substrate and the slot substrate; and a reflective conductive plate disposed to face via a dielectric layer a second main surface opposite the first main surface of the second dielectric substrate. The slot electrode includes a plurality of slots disposed corresponding to the plurality of patch electrodes. The plurality of patch electrodes are each connected to a drain of a corresponding TFT. The slot substrate further includes a conductive layer covering a surface of the slot electrode.

In an embodiment, the slot electrode includes a Cu layer or an Al layer.

In an embodiment, the conductive layer includes a high melting-point metal layer, and has a thickness of from approximately 30 nm to approximately 200 nm, inclusive.

In an embodiment, the conductive layer includes a high melting-point metal layer and a transparent conductive oxide layer, the high melting-point metal layer is closer to the slot electrode than the transparent conductive oxide layer, and the conductive layer has a thickness of from approximately 30 nm to approximately 200 nm, inclusive.

In an embodiment, the high melting-point metal layer is formed of any one of Ti, MoNb, and MoNbNi.

In an embodiment, the transparent conductive oxide layer is formed of indium tin oxide or indium zinc oxide.

A method of manufacturing a scanning antenna according to another embodiment of the disclosure is a method of manufacturing a scanning antenna according to any one of the above-described embodiments, and the method includes the step of preparing the slot substrate. The step of preparing the slot substrate includes the steps of (A) providing the second dielectric substrate, (B) forming the slot electrode on the first main surface of the second dielectric substrate, and (C) forming the conductive layer covering the surface of the slot electrode.

Advantageous Effects of Disclosure

According to an embodiment of the disclosure, there are provided a scanning antenna that can be mass-produced by utilizing existing LCD manufacturing technology, and a manufacturing method of the same.

BRIEF DESCRIPTION OF DRAWINGS

FIG. 10A to FIG. 1C are cross-sectional views illustrating a gate terminal section GT, a source terminal section ST, and a transfer terminal section PT of a TFT substrate 103 in a third embodiment, respectively.

FIG. 168 is a schematic cross-sectional view of a liquid crystal panel 100Pb including the heater resistive film 68.

FIG. 18A to FIG. 18C, and FIG. 18E to FIG. 18G are each a view illustrating an example of a waveform of each signal used for driving the scanning antenna according to an embodiment, and FIG. 18D is a view illustrating a waveform of a display signal of an LCD panel in which dot inversion driving is performed.

FIG. 19A to FIG. 19E are each a view illustrating another example of a waveform of each signal used for driving the scanning antenna according to an embodiment.

FIG. 21B is a schematic cross-sectional view of an LCD panel 900a.

DESCRIPTION OF EMBODIMENTS

Hereinafter, a scanning antenna and a manufacturing method of the same according to an embodiment of the disclosure will be described with reference to the drawings. In the following description, first, a structure of a known TFT-type LCD (hereinafter referred to as a "TFT-LCD") and a manufacturing method of the TFT-LCD will be described. However, the description of matters well-known within the technical field of LCDs may be omitted. As for basic TFT-LCD technology, refer to, for example, Liquid Crystals, Applications and Uses, Vol. 1-3 (Editor: Birenda Bahadur, Publisher: World Scientific Pub Co Inc), or the like. The entire contents of the disclosures of the above documents are incorporated herein by reference.

A structure and an action of a typical transmissive TFT-LCD (hereinafter simply referred to as an "LCD") 900 will be described with reference to FIG. 21A and FIG. 21B. Here, the LCD 900 having a vertical electric field mode (for example, a Twisted Nematic (TN) mode or a vertical alignment mode) in which a voltage is applied in a thickness direction of a liquid crystal layer will be described as an example. A frame frequency (typically twice a polarity inversion frequency) of a voltage applied to liquid crystal capacitance of the LCD is 240 Hz even at quad speed driving, and a dielectric constant ε of the liquid crystal layer serving as a dielectric layer of the liquid crystal capacitance of the LCD is different from the dielectric constant M ($\varepsilon_M$) for microwaves (for example, satellite broadcasting, a Ku band (from 12 to 18 GHz), a K band (from 18 to 26 GHz), and a Ka band (from 26 to 40 GHz)).

Figure 21A:
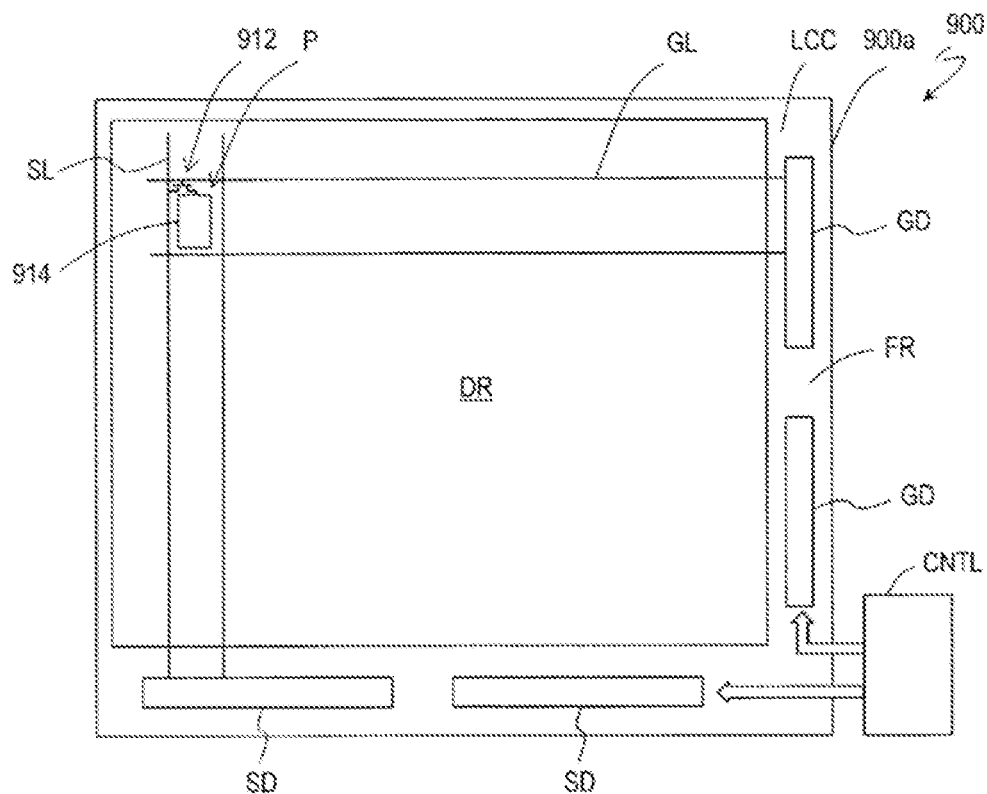
FIG. 21A is a schematic view illustrating a structure of an existing LCD 900.

As schematically illustrated in FIG. 21A, the transmissive LCD 900 includes a liquid crystal display panel 900a, a control circuit CNTL, a backlight (not illustrated), a power source circuit (not illustrated), and the like. The liquid crystal display panel 900a includes a liquid crystal display cell LCC and a driving circuit including a gate driver GD and a source driver SD. The driving circuit may be, for example, mounted on a TFT substrate 910 of the liquid crystal display cell LCC, or all or a part of the driving circuit may be integrated (monolithic integration) with the TFT substrate 910.

Figure 21B:
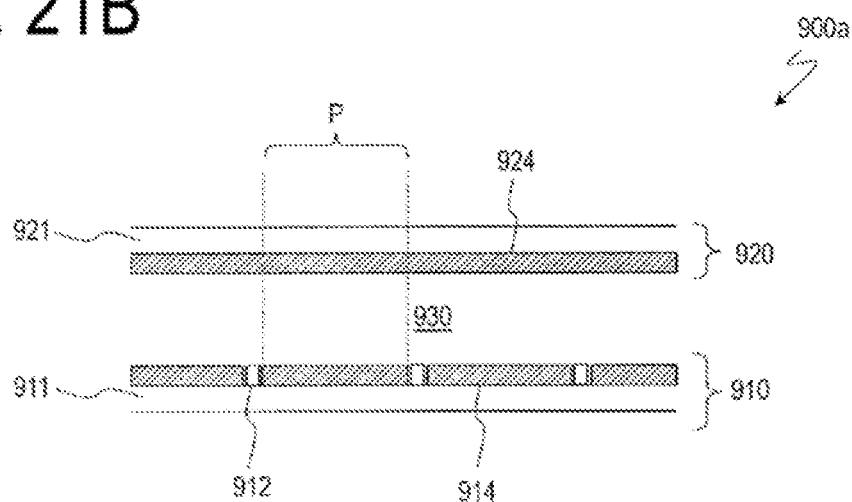

FIG. 21B illustrates a schematic cross-sectional view of the liquid crystal display panel (hereinafter referred to as the "LCD panel") 900a of the LCD 900. The LCD panel 900a includes the TFT substrate 910, a counter substrate 920, and a liquid crystal layer 930 provided between the TFT substrate 910 and the counter substrate 920. The TFT substrate 910 and the counter substrate 920 include transparent substrates 911 and 921 such as glass substrates, respectively. In addition to glass substrates, plastic substrates may also be used as the transparent substrates 911 and 921. The plastic substrates are formed of, for example, a transparent resin (for example, polyester) and glass fiber (for example, non-woven fabric).

A display region DR of the LCD panel 900a includes pixels P arranged in a matrix shape. A frame region FR not contributing to display is formed around the display region DR. A liquid crystal material is sealed in the display region DR by a sealing portion (not illustrated) formed to surround the display region DR. The sealing portion is formed by curing a sealing member including, for example, an ultraviolet curable resin and a spacer (for example, resin beads or silica beads), and bonds and fixes the TFT substrate 910 and the counter substrate 920 to each other. The spacer in the sealing member controls a gap between the TFT substrate 910 and the counter substrate 920, that is, a thickness of the liquid crystal layer 930, to be constant. To suppress an in-plane variation in the thickness of the liquid crystal layer 930, a columnar spacer is formed on a light blocking portion (for example, on a wiring line) in the display region DR by using an ultraviolet curable resin. In recent years, as seen in an LCD panel for a liquid crystal television and a smart phone, a width of the frame region FR not contributing to display is very reduced.

In the TFT substrate 910, a TFT 912, a gate bus line (scanning line) GL, a source bus line (display signal line) SL, a pixel electrode 914, an auxiliary capacitance electrode (not illustrated), and a CS bus line (auxiliary capacity line) (not illustrated) are formed on the transparent substrate 911. The CS bus line is provided parallel to the gate bus line. Alternatively, the gate bus line of the next stage may be used as the CS bus line (CS on-gate structure).

The pixel electrode 914 is covered with an alignment film (for example, a polyimide film) configured to control liquid crystal alignment. The alignment film is provided to come into contact with the liquid crystal layer 930. The TFT substrate 910 is often disposed on the backlight side (the side opposite to the viewer side).

The counter substrate 920 is often disposed on the viewer side of the liquid crystal layer 930. The counter substrate 920 includes a color filter layer (not illustrated), a counter electrode 924, and an alignment film (not illustrated) on the transparent substrate 921. Since the counter electrode 924 is provided in common to a plurality of the pixels P constituting the display region DR, the counter electrode 924 is also referred to as a common electrode. The color filter layer includes a color filter (for example, a red filter, a green filter, and a blue filter) provided for each pixel P, and a black matrix (light shielding layer) configured to block light unnecessary for display. The black matrix is disposed, for example, to block light between the pixels P in the display region DR and to block light at the frame region FR.

The pixel electrode 914 of the TFT substrate 910, the counter electrode 924 of the counter substrate 920, and the liquid crystal layer 930 disposed between the pixel electrode 914 and the counter electrode 924 constitute liquid crystal capacitance Clc. Individual liquid crystal capacitance correspond to a pixel. To retain a voltage applied to the liquid crystal capacitance Clc (to increase a so-called voltage retention rate), auxiliary capacitance CS electrically connected in parallel to the liquid crystal capacitance Clc is formed. The auxiliary capacitance CS typically includes an electrode having the same potential as a potential of the pixel electrode 914, an inorganic insulating layer (for example, a gate insulating layer ($SiO_2$ layer)), and an auxiliary capacitance electrode connected to the CS bus line. Typically, the same common voltage as a voltage of the counter electrode 924 is supplied from the CS bus line.

Factors responsible for lowering a voltage (effective voltage) applied to the liquid crystal capacitance Clc are (1) a factor based on a CR time constant which is a product of a capacitance value $C_{Clc}$ of the liquid crystal capacitance Clc and a resistance value R, and (2) interfacial polarization due to an ionic impurity incorporated in the liquid crystal material and/or orientation polarization of liquid crystal molecules. Among these, contribution of the CR time constant of the liquid crystal capacitance Clc is large, and the CR time constant can be increased by providing the auxiliary capacitance CS electrically connected in parallel to the liquid crystal capacitance Clc. Note that a volume resistivity of the liquid crystal layer 930 serving as the dielectric layer of the liquid crystal capacitance Clc exceeds the order of $10^{12}$ Ω·cm in the case of a nematic liquid crystal material widely used.

A display signal supplied to the pixel electrode 914 is a display signal supplied to the source bus line SL connected to the TFT 912 when the TFT 912 selected by a scanning signal supplied from the gate driver GD to the gate bus line GL is turned on. Accordingly, TFTs 912 connected to a certain gate bus line GL are simultaneously turned on, and at that time, a corresponding display signal is supplied from the source bus line SL connected to the TFT 912 of each of the pixels P in that row. This action is sequentially performed from a first row (for example, an uppermost row of a display surface) to an mth row (for example, a lowermost row of the display surface) and thus, one image (frame) is written and displayed in the display region DR including m rows of the pixels. Assuming that the pixels P are arranged in a matrix shape of m rows and n columns, at least one source bus line SL is provided corresponding to each pixel column, and at least n source bus lines SL are provided in total.

Such scanning is referred to as line-sequential scanning, time after one pixel row is selected until the next pixel row is selected is referred to as a horizontal scan period, (1H), and time after a certain row is selected until the certain row is again selected is referred to as a vertical scanning period (1V) or a frame. Note that, in general, 1V (or 1 frame) is obtained by adding a blanking period to a period m·H in which all the m pixel rows are selected.

For example, when an input video signal is an NTSC signal, 1V (=1 frame) of an existing LCD panel is 1/60 seconds (16.7 milliseconds). The NTSC signal is an interlaced signal, a frame frequency is 30 Hz, and a field frequency is 60 Hz, but in an LCD panel, since it is necessary to supply display signals to all the pixels in each field, the LCD panel is driven with 1V=(1/60) seconds (driven at 60 Hz). Note that, in recent years, to improve moving picture display characteristics, there are also an LCD panel driven at double speed driving (120 Hz driving, 1V=(1/120) seconds), and an LCD panel driven at quad speed (240 Hz driving, 1V=(1/240) seconds) for 3D display.

When a DC voltage is applied to the crystal layer 930, an effective voltage decreases and luminance of the pixel P decreases. Since the interface polarization and/or the orientation polarization contribute to the decrease in the effective voltage as described above, it is difficult to completely prevent the decrease in the effective voltage even when the auxiliary capacitance CS is provided. For example, when a display signal corresponding to a certain intermediate gray scale is written into each pixel for each frame, the luminance fluctuates for each frame and is observed as flicker. In addition, when a DC voltage is applied to the liquid crystal layer 930 for an extended period of time, electrolysis of the liquid crystal material may occur. In addition, impurity ions segregate in the electrode on one side, and the effective voltage may not be applied to the liquid crystal layer and the liquid crystal molecules may not move. To prevent this, in the LCD panel 900a, so-called AC driving is performed. Typically, frame-reversal driving at which a polarity of a display signal is inverted for each frame (for each vertical scanning period) is performed. For example, in an existing LCD panel, polarity inversion is performed every 1/60 seconds (a polarity inversion period is 30 Hz).

In addition, dot inversion driving, line reversal driving, or the like is performed to uniformly distribute the pixels having different polarities of applied voltage even within one frame. This is because it is difficult to completely match magnitudes of the effective voltage applied to the liquid crystal layer between a positive polarity and a negative polarity. For example, in a case where the volume resistivity of the liquid crystal material exceeds the order of 10 Ω·cm, and the dot inversion or line reversal driving is performed every 1/60 seconds, flicker is almost visually unrecognizable.

The scanning signal and the display signal in the LCD panel 900a are supplied from the gate driver GD and the source driver SD to the gate bus line GL and the source bus line SL, respectively, on the basis of signals supplied from the control circuit CNTL to the gate driver GD and the source driver SD. For example, the gate driver GD and the source driver SD are each connected to a corresponding terminal provided on the TFT substrate 910. The gate driver GD and the source driver SD may be mounted on the frame region FR of the TFT substrate 910 as a driver IC, for example, or may be formed monolithically in the frame region FR of the TFT substrate 910.

The counter electrode 924 of the counter substrate 920 is electrically connected to a terminal (not illustrated) of the TFT substrate 910 via a conductive portion (not illustrated) referred to as a transfer. The transfer is formed, for example, to overlap with the sealing portion, or to impart conductivity to a part of the sealing portion. This is for the purpose of narrowing the frame region FR. A common voltage is directly or indirectly supplied from the control circuit CNTL to the counter electrode 924. Typically, the common voltage is also supplied to the CS bus line as described above.

Basic Structure of Scanning Antenna

A scanning antenna using antenna units utilizing anisotropy (birefringence) of a large dielectric constant M ($\varepsilon_M$) of a liquid crystal material controls a voltage applied to each liquid crystal layer of each antenna unit corresponding to a pixel of an LCD panel, and changes the effective dielectric constant M ($\varepsilon_M$) of the liquid crystal layer of each antenna unit to form a two-dimensional pattern with the antenna units having different electrostatic capacitance (corresponding to display of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed with the antenna units having different electrostatic capacitance (beam scanning). For example, an electromagnetic wave emitted from an antenna is obtained by integrating, in consideration for the phase difference given by each antenna unit, a spherical wave obtained as a result of an input electromagnetic wave entering each antenna unit and being scattered by each antenna unit. It can also be considered that each antenna unit functions as a "phase shifter." As for a basic structure and action principles of a scanning antenna using a liquid crystal material, refer to PTL 1 to PTL 4 and NPL 1 and NPL 2. NPL 2 discloses a basic structure of a scanning antenna in which spiral slots are arranged. The entire contents of the disclosures of PTL 1 to PTL 4 and NPL 1 and NPL 2 are incorporated herein by reference.

Figure 1:
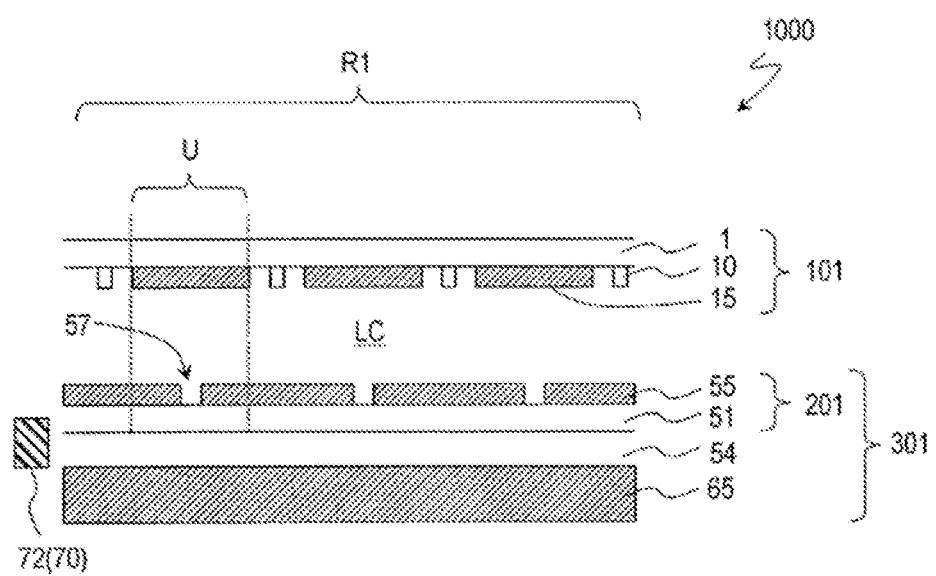
FIG. 1 is a cross-sectional view schematically illustrating a portion of a scanning antenna 1000 according to a first embodiment.

Note that although the antenna units in the scanning antenna according to an embodiment of the disclosure are similar to pixels of an LCD panel, a structure of each antenna unit is different from a structure of each pixel of the LCD panel, and arrangement of the plurality of antenna units is also different from arrangement of the pixels in the LCD panel. A basic structure of the scanning antenna according to an embodiment of the disclosure will be described with reference to FIG. 1 illustrating a scanning antenna 1000 of a first embodiment described in detail below. Although the scanning antenna 1000 is a radial in-line slot antenna in which slots are arranged in a concentric circle shape, the scanning antenna according to an embodiment of the disclosure is not limited to this. For example, the arrangement of the slots may be any of various types of known arrangement.

FIG. 1 is a cross-sectional view schematically illustrating a portion of the scanning antenna 1000 of the present embodiment, and schematically illustrates a part of a cross section along a radial direction from a power feed pin 72 (see FIG. 2B) provided near or at the center of the slots arranged in a concentric circle shape.

The scanning antenna 1000 includes a TFT substrate 101, a slot substrate 201, a liquid crystal layer LC disposed between the TFT substrate 101 and the slot substrate 201, and a reflective conductive plate 65 disposed to face the slot substrate 201 via an air layer 54. The scanning antenna 1000 transmits and receives microwaves from the TFT substrate 101 side.

The TFT substrate 101 includes a dielectric substrate 1 such as a glass substrate, and a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on the liquid crystal layer LC side of the dielectric substrate 51. The slot electrode 55 includes a plurality of slots 57.

The reflective conductive plate 65 is disposed to face the slot substrate 201 via the air layer 54. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 disposed between the slot electrode 55 and the reflective conductive plate 65 function as a waveguide 301.

Figure 17:
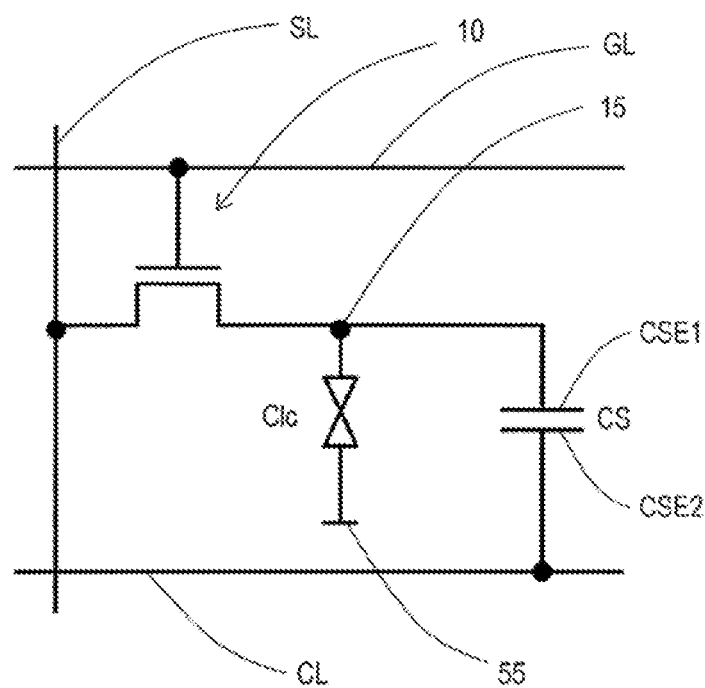
FIG. 17 is a view illustrating an equivalent circuit of one antenna unit in a scanning antenna according to an embodiment of the disclosure.

The patch electrode 15, the portion of the slot electrode 55 including the slots 57, and the liquid crystal layer LC disposed between the patch electrode 15 and the portion of the slot electrode 55 constitute an antenna unit U. In each antenna unit U, one patch electrode 15 faces via the liquid crystal layer LC the portion of the slot electrode 55 including one slot 57, and constitutes the liquid crystal capacitance. The structure in which the patch electrode 15 and the slot electrode 55 face each other via the liquid crystal layer LC is similar to the structure illustrated in FIG. 21B in which the pixel electrode 914 and the counter electrode 924 of the LCD panel 900a face each other via the liquid crystal layer 930. That is, the antenna unit U of the scanning antenna 1000 and the pixel P in the LCD panel 900a have a similar configuration. In addition, the antenna unit has a configuration similar to the configuration of the pixel P in the LCD panel 900a in that the antenna unit has auxiliary capacitance electrically connected in parallel to the liquid crystal capacitance (see FIG. 13A and FIG. 17). However, the scanning antenna 1000 has many differences from the LCD panel 900a.

First, performance required of the dielectric substrates 1 and 51 of the scanning antenna 1000 is different from performance required of a substrate of an LCD panel.

Generally, a substrate transparent to visible light is used for an LCD panel. For example, a glass substrate or a plastic substrate is used for an LCD panel. In a reflective LCD panel, since a substrate on the back side does not need transparency, a semiconductor substrate may be used for the substrate on the back side. In contrast, it is preferable that the dielectric substrates 1 and 51 used for the antenna each have a small dielectric loss for microwaves (a dielectric tangent for microwaves is denoted by tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. A glass substrate is more excellent than a plastic substrate in dimensional stability and heat resistance, and is suitable for forming a circuit element such as a TFT, a wiring line, and an electrode by using LCD technology. For example, in a case where a material forming a waveguide includes air and glass, a dielectric loss of glass is greater and thus, from a viewpoint that thinner glass can reduce a waveguide loss, a thickness of the glass substrate is preferably less than or equal to 400 µm, and more preferably less than or equal to 300 µm. There is no particular lower limit in the thickness, as long as the glass can be handled without break in a manufacturing process.

Conductive materials used for electrodes are also different. An ITO film is often used as a transparent conductive film for a pixel electrode or a counter electrode of an LCD panel. However, ITO has a large tan $\delta_M$ for microwaves, and cannot be used as a conductive layer in an antenna. The slot electrode 55 functions as a wall of the waveguide 301 together with the reflective conductive plate 65. Accordingly, to suppress transmission of microwaves in the wall of the waveguide 301, it is preferable that a thickness of the wall of the waveguide 301, that is, a thickness of the metal layer (Cu layer or Al layer) be large. It is known that in a case where the thickness of the metal layer is three times a skin depth, electromagnetic waves are attenuated to 1/20 (−26 dB), and that in a case where the thickness of the metal layer is five times the skin depth, electromagnetic waves are attenuated to about 1/150 (−43 dB). Accordingly, in a case where the thickness of the metal layer is five times the skin depth, a transmittance of electromagnetic waves can be reduced to 1%. For example, for microwaves of 10 GHz, in a case where a Cu layer having a thickness of greater than or equal to 3.3 µm and an Al layer having a thickness of greater than or equal to 4.0 µm are used, the microwaves can be reduced to 1/150. In addition, for microwaves of 30 GHz, in a case where a Cu layer having a thickness of greater than or equal to 1.9 µm and an Al layer having a thickness of greater than or equal to 2.3 µm are used, the microwaves can be reduced to 1/150. In this way, the slot electrode 55 is preferably formed of a relatively thick Cu layer or Al layer. There is no particular upper limit in the thickness of the Cu layer or the Al layer, and the thicknesses of the Cu layer or the Al layer can be set appropriately in consideration for film formation time and cost. When the Cu layer is used, an advantage of enabling formation of the metal layer thinner than in the case of using the Al layer can be obtained. The relatively thick Cu layer or Al layer can be formed not only by a thin film deposition method used in an LCD manufacturing process, but also by other methods such as bonding Cu foil or Al foil to a substrate. The thickness of the metal layer is, for example, from 2 µm to 30 µm, inclusive. When the thin film deposition method is used, the thickness of the metal layer is preferably less than or equal to 5 µm. Note that an aluminum plate, a copper plate, or the like having a thickness of several mm can be used as the reflective conductive plate 65, for example.

Since the patch electrode 15 does not constitute the waveguide 301 as with the slot electrode 55, a Cu layer or an Al layer having a smaller thickness than a thickness of the slot electrode 55 can be used. However, the patch electrode 15 preferably has low resistance to avoid a loss resulting from oscillation of free electrons near the slot 57 of the slot electrode 55 changing to heat when oscillation of free electrons in the patch electrode 15 is induced. From a viewpoint of mass productivity, the Al layer is preferably used rather than the Cu layer, and a thickness of the Al layer is preferably, for example, from 0.4 µm to 2 µm, inclusive.

In addition, an arrangement pitch of the antenna units U is considerably different from a pixel pitch. For example, considering an antenna for microwaves of 12 GHz (Ku band), a wavelength λ is 25 mm, for example. Then, as described in PTL 4, since the pitch of the antenna units U is less than or equal to λ/4 and/or less than or equal to λ/5, the arrangement pitch of the antenna units U becomes less than or equal to 6.25 mm and/or less than or equal to 5 mm. This is ten times greater than the pixel pitch of the LCD panel. Accordingly, a length and a width of each antenna unit U are also approximately ten times greater than a length and a width of each pixel of an LCD panel.

Of course, arrangement of the antenna units U may be different from arrangement of the pixels in the LCD panel. Although an example in which the antenna units U are arranged in a concentric circle shape (for example, refer to JP 2002-217640 A) is described here, the arrangement of the antenna units U is not limited to such arrangement, and the antenna units may be arranged in a spiral shape as described in NPL 2, for example. Further, the antenna units may be arranged in a matrix shape as described in PTL 4.

Properties required of the liquid crystal material of the liquid crystal layer LC of the scanning antenna 1000 are different from properties required of a liquid crystal material of an LCD panel. In the LCD panel, a change in a refractive index of the liquid crystal layer of pixels gives a phase difference to polarized visible light (wavelength of from 380 nm to 830 nm) to change a polarization state (for example, to rotate a polarization axis direction of linearly polarized light, or to change a degree of circular polarization of circularly polarized light) and thus, display is performed. In contrast, in the scanning antenna 1000 according to the embodiment, a phase of microwaves excited (re-radiated) from each patch electrode is changed by changing an electrostatic capacitance value of the liquid crystal capacitance of the antenna unit U. Accordingly, the liquid crystal layer preferably has large anisotropy ($\Delta\varepsilon_M$) of the dielectric constant M ($\varepsilon_M$) for microwaves, and the tan $\delta_M$ is preferably small. For example, the $\Delta\varepsilon_M$ of greater than or equal to 4 and the tan $\delta_M$ of less than or equal to 0.02 (a value of 19 GHz in any of the cases) as described in M. Witteck et al, SID 2015 DIGEST pp. 824-826 can be used suitably. In addition, a liquid crystal material having the $\Delta\varepsilon_M$ of greater than or equal to 0.4 and the tan $\delta_M$ of less than or equal to 0.04 as described in Kuki, POLYMERS 55 vol. August issue pp. 599-602 (2006) can be used.

In general, a dielectric constant of a liquid crystal material has frequency dispersion, but the dielectric anisotropy $\Delta\varepsilon_M$ for microwaves has a positive correlation with refractive index anisotropy Δn for visible light. Accordingly, it can be said that a liquid crystal material for an antenna unit for microwaves is preferably a material having a large refractive index anisotropy Δn for visible light. The refractive index anisotropy Δn of a liquid crystal material for LCD is evaluated with refractive index anisotropy for light having a wavelength of 550 nm. Here again, when the Δn (birefringence) for light having a wavelength of 550 nm is used as an index, nematic liquid crystal having the Δn of greater than or equal to 0.3, preferably greater than or equal to 0.4, can be used for the antenna unit for microwaves. There is no particular upper limit in the Δn. However, since a liquid crystal material having a large Δn tends to have a strong polarity, such a liquid crystal material may decrease reliability. From a viewpoint of reliability, the Δn is preferably less than or equal to 0.4. A thickness of the liquid crystal layer is, for example, from 1 μm to 500 μm.

Hereinafter, a structure and a manufacturing method of an scanning antenna according to an embodiment of the disclosure will be described in more detail.

First Embodiment

First, description will be given with reference to FIG. 1 and FIGS. 2A and 2B. FIG. 1 is a schematic partial cross-sectional view of a portion near the center of the scanning antenna 1000 as described above in detail, and FIG. 2A and FIG. 2B are schematic plan views illustrating a TFT substrate 101 and a slot substrate 201 in the scanning antenna 1000, respectively.

The scanning antenna 1000 includes a plurality of antenna units U arranged two-dimensionally. In the scanning antenna 1000 exemplified here, the plurality of antenna units are arranged in a concentric circle shape. In the following description, a region of the TFT substrate 101 and a region of the slot substrate 201 corresponding to the antenna units U, respectively will be referred to as "antenna unit regions," and be denoted by the same reference sign U as the reference sign of the antenna units. In addition, as illustrated in FIG. 2A and FIG. 2B, in the TFT substrate 101 and the slot substrate 201, a region defined by a plurality of the antenna unit regions two-dimensionally arranged is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

Figure 2A:
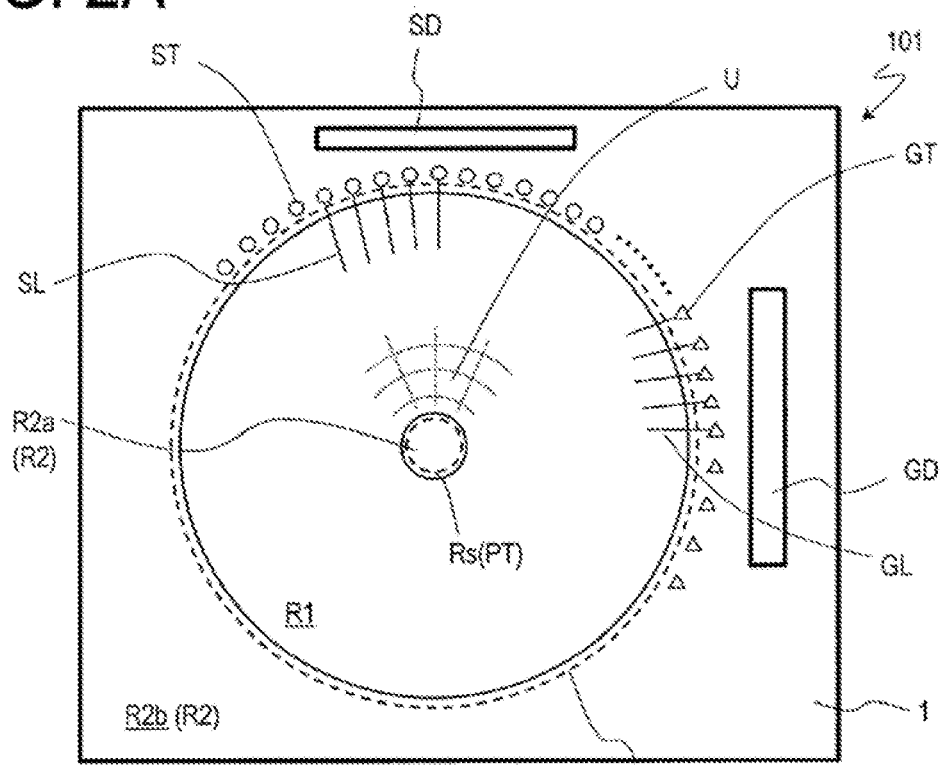
FIG. 2A and FIG. 2B are schematic plan views illustrating a TFT substrate 101 and a slot substrate 201 in the scanning antenna 1000, respectively.

FIG. 2A is a schematic plan view illustrating the TFT substrate 101 in the scanning antenna 1000.

In the illustrated example, the transmission and/or reception region R1 has a donut shape as viewed from a normal direction of the TFT substrate 101. The non-transmission and/or reception region R2 includes a first non-transmission and/or reception region R2a located at a central portion of the transmission and/or reception region R1 and a second non-transmission and/or reception region R2b located at a peripheral portion of the transmission and/or reception region R1. An outer diameter of the transmission and/or reception region R1, for example, is from 200 mm to 1500 mm, and is set according to a data traffic volume or the like.

A plurality of gate bus lines GL and a plurality of source bus lines SL supported on a dielectric substrate 1 are provided in the transmission and/or reception region R1 of the TFT substrate 101, and the antenna unit regions U are defined by these wiring lines. The antenna unit regions U are arranged, for example, in a concentric circle shape in the transmission and/or reception region R1. Each of the antenna unit regions U includes a TFT and a patch electrode electrically connected to the TFT. A source electrode of the TFT is electrically connected to a source bus line SL, and a gate electrode is electrically connected to a gate bus line GL. In addition, a drain electrode is electrically connected to the patch electrode.

In the non-transmission and/or reception region R2 (R2a, R2b), a seal region Rs is disposed to surround the transmission and/or reception region R1. A sealing member (not illustrated) is applied to the seal region Rs. The sealing member bonds the TFT substrate 101 and the slot substrate 201 to each other, and also encloses liquid crystal between these substrates 101 and 201.

A gate terminal section GT, A gate driver GD, a source terminal section ST, and a source driver SD are provided outside the sealing region Rs in the non-transmission and/or reception region R2. Each of the gate bus lines GL is connected to the gate driver GD via the gate terminal section GT. Each of the source bus lines SL is connected to the source driver SD via the source terminal section ST. Note that, in this example, although the source driver SD and the gate driver GD are formed on the dielectric substrate 1, one or both of these drivers may be provided on another dielectric substrate.

In addition, a plurality of transfer terminal sections PT are provided in the non-transmission and/or reception region R2. Each transfer terminal section PT is electrically connected to the slot electrode 55 (FIG. 2B) of the slot substrate 201. Herein, a connection section between each transfer terminal section PT and a slot electrode 55 is referred to as a "transfer section." As illustrated in the figure, the transfer terminal sections PT (transfer sections) may be disposed in the seal region Rs. In this case, a resin containing conductive particles may be used as the sealing member. In this way, liquid crystal is enclosed between the TFT substrate 101 and the slot substrate 201, and electrical connection between each transfer terminal section PT and the slot electrode 55 of the slot substrate 201 can be secured. In this example, although the transfer terminal sections PT are disposed in both the first non-transmission and/or reception region R2a and the second non-transmission and/or reception region R2b, the transfer terminal sections PT may be disposed in only any one of the first non-transmission and/or reception region R2a and the second non-transmission and/or reception region R2b.

Note that the transfer terminal sections PT (transfer sections) may not be disposed in the seal region Rs. For example, the transfer terminal sections PT may be disposed outside the seal region Rs in the non-transmission and/or reception region R2.

Figure 2B:
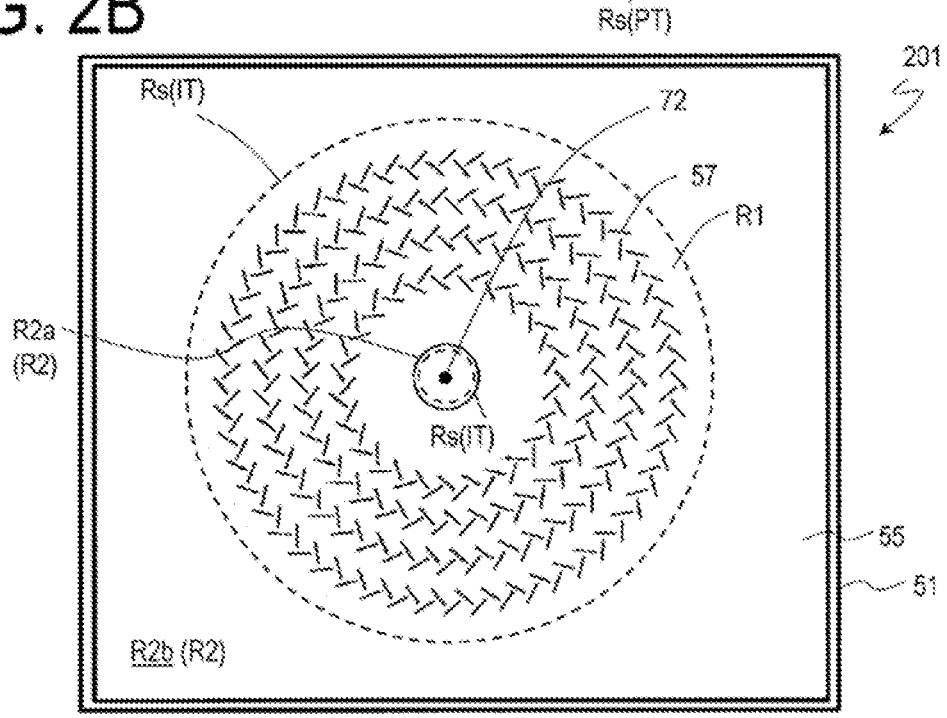

FIG. 2B is a schematic plan view illustrating the slot substrate 201 in the scanning antenna 1000, and illustrates a surface on a liquid crystal layer LC side of the slot substrate 201.

In the slot substrate 201, the slot electrode 55 is formed on a dielectric substrate 51 extending across the transmission and/or reception region R1 and the non-transmission and/or reception region R2.

In the transmission and/or reception region R1 of the slot substrate 201, a plurality of slots 57 are disposed in the slot electrode 55. Each slot 57 is disposed corresponding to each antenna unit region U on the TFT substrate 101. In the illustrated example, the plurality of slots 57 are arranged in pairs, and a pair of the slots 57 extend in a direction substantially orthogonal to each other and pairs of the slots 57 are arranged in a concentric circle shape to constitute a radial inline slot antenna. Since the scanning antenna 1000 includes the slots substantially orthogonal to each other, the scanning antenna 1000 can transmit and receive a circularly polarized wave.

A plurality of terminal sections IT of the slot electrode 55 are provided in the non-transmission and/or reception region R2. The terminal sections IT are electrically connected to the transfer terminal sections PT (FIG. 2A) of the TFT substrate 101. In this example, the terminal sections IT are disposed in the seal region Rs, and are electrically connected to the corresponding transfer terminal sections PT by a sealing member containing conductive particles.

In addition, a power feed pin 72 is disposed on a rear surface side of the slot substrate 201 in the first non-transmission and/or reception region R2a. Microwaves are inserted by the power feed pin 72 into a waveguide 301 including the slot electrode 55, a reflective conductive plate 65, and the dielectric substrate 51. The power feed pin 72 is connected to a power feed device 70. Power feed is performed from the center of the concentric circle in which the slots 57 are arranged. A power feed method may be any of a direct coupling power feed method and an electromagnetic coupling method, and a known power feed structure can be adopted.

Hereinafter, each constituent element of the scanning antenna 1000 will be described in detail with reference to the drawings.

Structure of TFT Substrate 101

Antenna Unit Region U

Figure 3A:
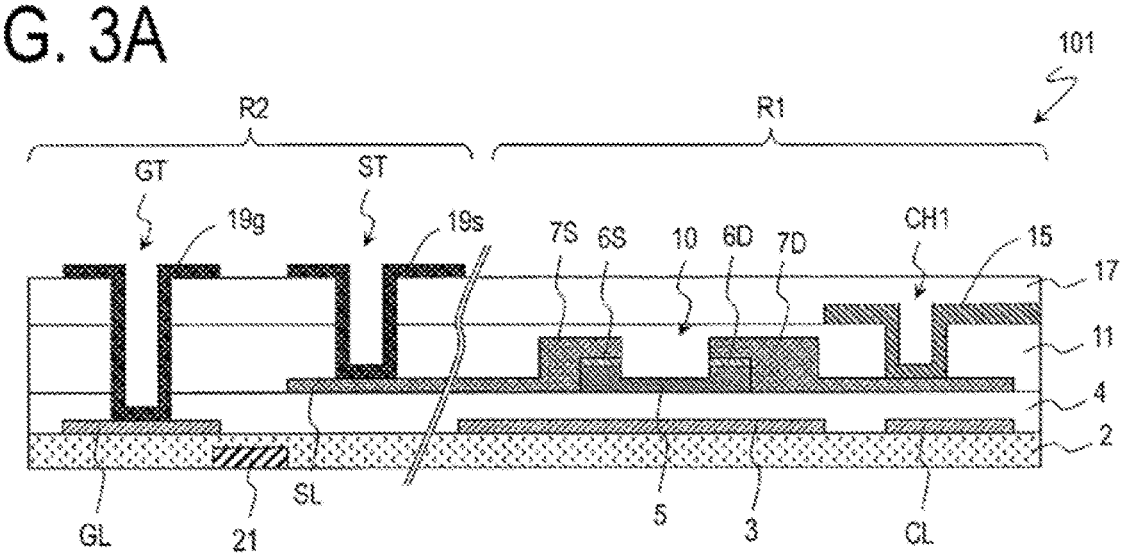
FIG. 3A and FIG. 3B are a cross-sectional view and a plane view schematically illustrating an antenna unit region U of the TFT substrate 101, respectively.
Figure 3B:
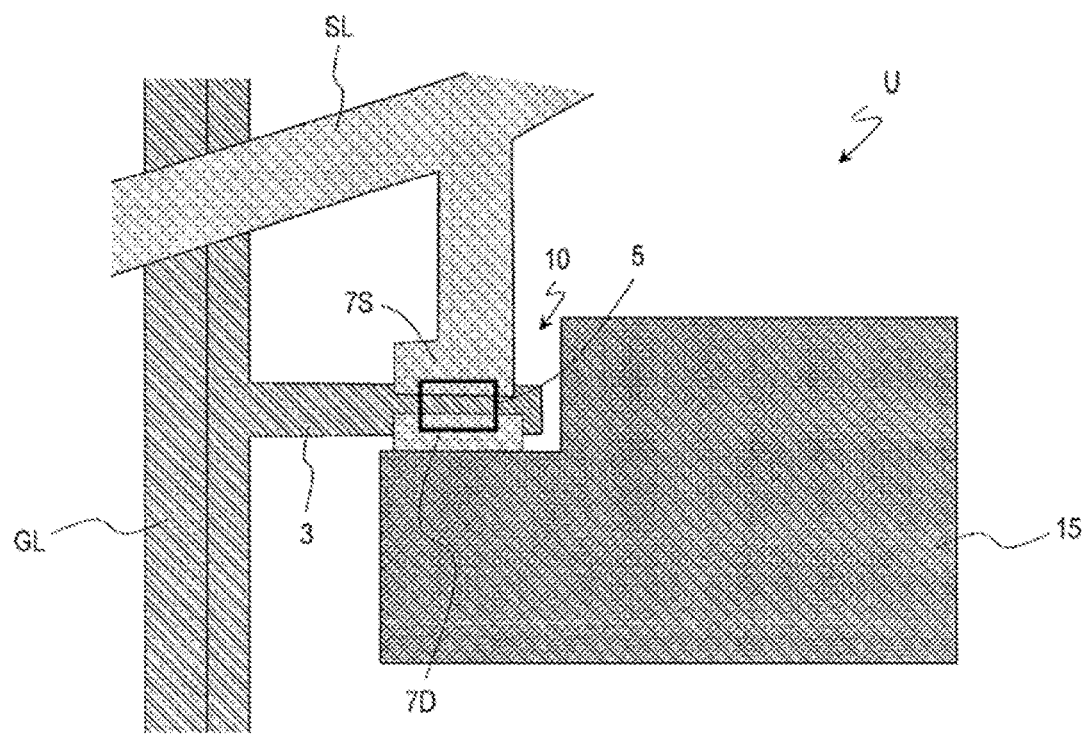

FIG. 3A and FIG. 3B are a cross-sectional view and a plane view schematically illustrating the antenna unit region U of the TFT substrate 101, respectively.

Each of the antenna unit regions U includes a dielectric substrate (not illustrated), a TFT 10 supported on the dielectric substrate, a first insulating layer 11 covering the TFT 10, a patch electrode 15 formed on the first insulating layer 11 and electrically connected to the TFT 10, and a second insulating layer 17 covering the patch electrode 15. The TFT 10 is disposed, for example, at or near an intersection point of each gate bus line GL and each source bus line SL.

The TFT 10 includes a gate electrode 3, a semiconductor layer 5 having an island shape, a gate insulating layer 4 disposed between the gate electrode 3 and the semiconductor layer 5, a source electrode 7S, and a drain electrode 7D. A structure of the TFT 10 is not particularly limited. In this example, the TFT 10 is a channel etched type TFT having a bottom gate structure.

The gate electrode 3 is electrically connected to the gate bus line GL, and a scanning signal is supplied from the gate bus line GL. The source electrode 7S is electrically connected to the source bus line SL, and a data signal is supplied from the source bus line SL. The gate electrode 3 and the gate bus line GL may be formed of the same conductive film (gate conductive film). The source electrode 7S, the drain electrode 7D, and the source bus line SL may be formed of the same conductive film (source conductive film). The gate conductive film and the source conductive film are, for example, metal films. Herein, a layer formed by using the gate conductive film may be referred to as a "gate metal layer," and a layer formed by using the source conductive film may be referred to as a "source metal layer."

The semiconductor layer 5 is disposed to overlap with the gate electrode 3 via the gate insulating layer 4. In the illustrated example, a source contact layer 6S and a drain contact layer 6D are formed on the semiconductor layer 5. The source contact layer 6S and the drain contact layer 6D are disposed respectively on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be $n^+$ type amorphous silicon ($n^+$-a-Si) layers.

The source electrode 7S is provided to come into contact with the source contact layer 6S and is connected to the semiconductor layer 5 via the source contact layer 6S. The drain electrode 7D is provided to come into contact with the drain contact layer 6D and is connected to the semiconductor layer 5 via the drain contact layer 6D.

The first insulating layer 11 includes a contact hole CH1 reaching at least the drain electrode 7D of the TFT 10.

The patch electrode 15 is provided on the first insulating layer 11 and in the contact hole CH1, and is in contact with the drain electrode 7D in the contact hole CH1. The patch electrode 15 includes a metal layer. The patch electrode 15 may be a metal electrode formed of a metal layer alone. A material of the patch electrode 15 may be the same as a material of the source electrode 7S and the drain electrode 7D. However, a thickness of the metal layer in the patch electrode 15 (a thickness of the patch electrode 15 when the patch electrode 15 is a metal electrode) is set to be greater than a thickness of each of the source electrode 7S and the drain electrode 7D. In a case where the metal layer in the patch electrode 15 is formed by using an Al layer, the thickness of the metal layer in the patch electrode 15 is set to be, for example, greater than or equal to 0.4 µm.

A CS bus line CL may be provided by using the same conductive film as a conductive film of the gate bus line GL. The CS bus line CL may be disposed to overlap with the drain electrode (or an extending portion of the drain electrode) 7D via the gate insulating layer 4, and may constitute auxiliary capacity CS including the gate insulating layer 4 as a dielectric layer.

An alignment mark (for example, a metal layer) 21 and a base insulating film 2 covering the alignment mark 21 may be formed at a position closer to the dielectric substrate than a position of the gate bus line GL. For example, when m TFT substrates are prepared from one glass substrate, and the number of photomasks is n (where n<m), it is necessary to perform each exposure step multiple times. In this way, when the number (n) of photomasks is less than the number (m) of TFT substrates 101 prepared from one glass substrate 1, the alignment mark 21 is used for alignment of the photomasks. The alignment mark 21 may be omitted.

In the present embodiment, the patch electrode 15 is formed in a layer different from the source metal layer. In this way, the following advantages can be obtained.

Since the source metal layer is typically formed by using a metal film, it is also conceivable to form the patch electrode in the source metal layer (as in the TFT substrate of the reference example). However, the patch electrode preferably has low resistance to the extent that electron oscillation is not inhibited, and the patch electrode is formed of, for example, a relatively thick Al layer having a thickness of 0.4 µm or greater. For this reason, in the TFT substrate of the reference example, the source bus line SL or the like is also formed of such a thick metal film, and there is a problem in controllability of patterning that reduces when a wiring line is formed. In contrast, in the present embodiment, since the patch electrode 15 is formed separately from the source metal layer, a thickness of the source metal layer and a thickness of the patch electrode 15 can be controlled independently. Accordingly, controllability can be secured when the source metal layer is formed, and the patch electrode 15 having a desired thickness can be formed.

In the present embodiment, the thickness of the patch electrode 15 can be set with a high degree of freedom separately from the thickness of the source metal layer. Note that since a size of the patch electrode 15 does not need to be controlled as strictly as the source bus line SL or the like, a line width shift (deviation from a design value) may be increased by thickening the patch electrode 15. Note that a case where the thickness of the patch electrode 15 is equal to the thickness of the source metal layer is not excluded.

The patch electrode 15 may include a Cu layer or an Al layer as a main layer. Performance of the scanning antenna correlates with electric resistance of the patch electrode 15, and a thickness of the main layer is set to obtain desired resistance. From a viewpoint of the electric resistance, there is a possibility that the Cu layer can reduce the thickness of the patch electrode 15 more than the Al layer.

Figure 4A:
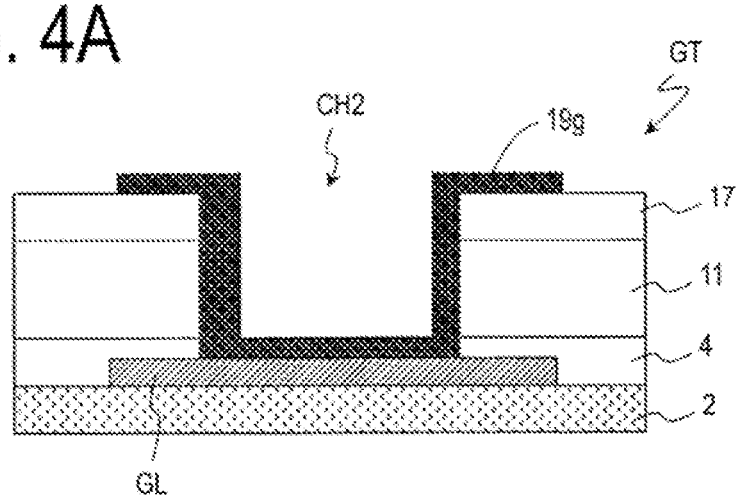
FIG. 4A to FIG. 4C are cross-sectional views schematically illustrating a gate terminal section GT, a source terminal section ST, and a transfer terminal section PT of the TFT substrate 101, respectively.
Figure 4B:
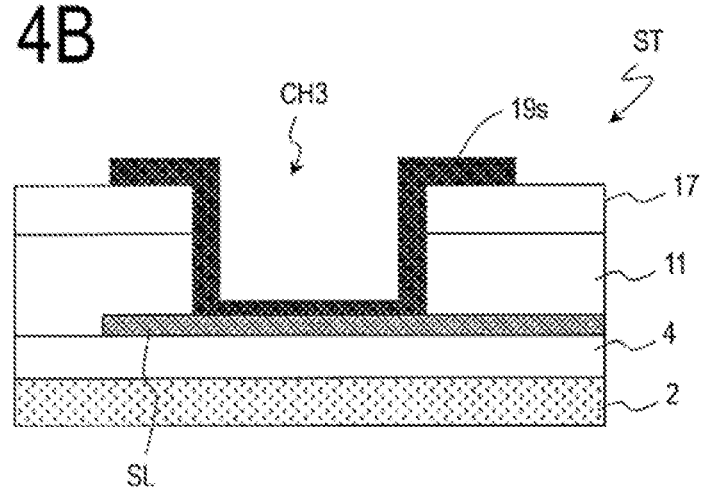
Figure 4C:
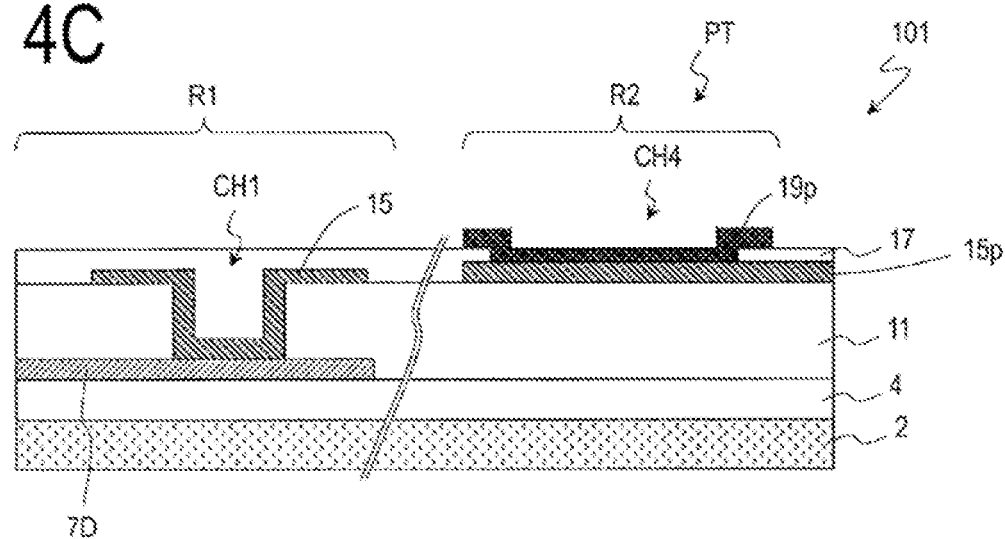

Gate Terminal Section GT, Source Terminal Section ST, and Transfer Terminal Section PT FIG. 4A to FIG. 4C are cross-sectional views schematically illustrating the gate terminal section GT, the source terminal section ST, and the transfer terminal section PT, respectively.

The gate terminal section GT includes the gate bus line GL formed on the dielectric substrate, an insulating layer covering the gate bus line GL, and a gate terminal upper connection section 19g. The gate terminal upper connection section 19g is in contact with the gate bus line GL in a contact hole CH2 formed in the insulating layer. In this example, the insulating layer covering the gate bus line GL includes the gate insulating layer 4, the first insulating layer 11 and the second insulating layer 17 in order from the dielectric substrate side. The gate terminal upper connection section 19g is, for example, a transparent electrode formed of a transparent conductive film provided on the second insulating layer 17.

The source terminal section ST includes the source bus line SL formed on the dielectric substrate (here, on the gate insulating layer 4), an insulating layer covering the source bus line SL, and a source terminal upper connection section 19s. The source terminal upper connection section 19s is in contact with the source bus line SL in a contact hole CH3 formed in the insulating layer. In this example, the insulating layer covering the source bus line SL includes the first insulating layer 11 and the second insulating layer 17. The source terminal upper connection section 19s is, for example, a transparent electrode formed of a transparent conductive film provided on the second insulating layer 17.

The transfer terminal section PT includes a patch connection section 15p formed on the first insulating layer 11, the second insulating layer 17 covering the patch connection section 15p, and a transfer terminal upper connection section 19p. The transfer terminal upper connection section 19p is in contact with the patch connection section 15p in a contact hole CH4 formed in the second insulating layer 17. The patch connection section 15p is formed of the same conductive film as a conductive film of the patch electrode 15. The transfer terminal upper connection section (also referred to as an upper transparent electrode) 19p is, for example, a transparent electrode formed of a transparent conductive film provided on the second insulating layer 17. In the present embodiment, the upper connection sections 19g, 19s, and 19p of the respective terminal sections are formed of the same transparent conductive film.

In the present embodiment, there is an advantage of enabling simultaneous formation of the contact holes CH2, CH3, and CH4 of the respective terminal sections by an etching step performed after formation of the second insulating layer 17. A manufacturing process will be described in detail below.

Manufacturing Method of TFT Substrate 101

Figure 5:
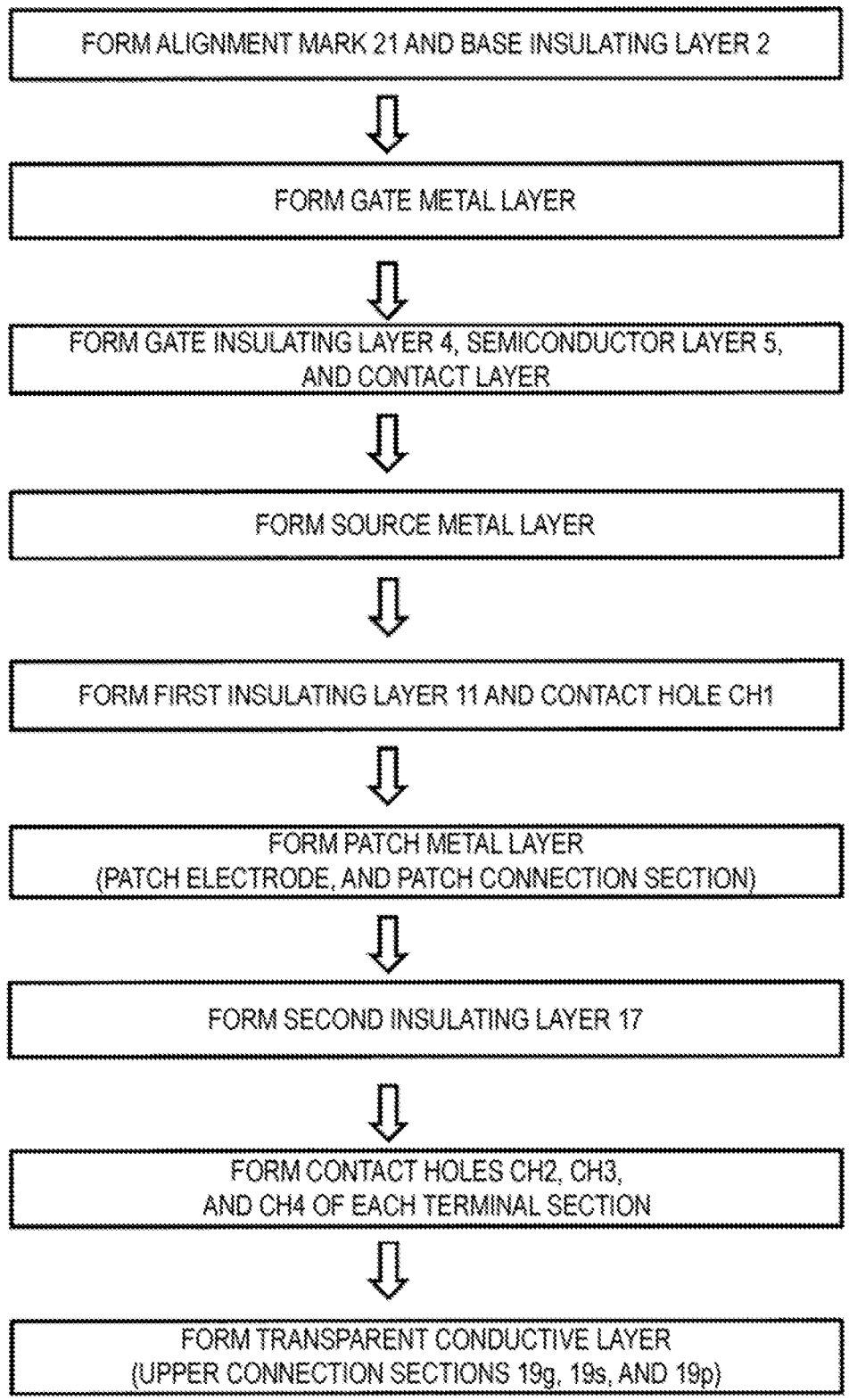
FIG. 5 is a view illustrating an example of the manufacturing steps of the TFT substrate 101.

The TFT substrate 101 can be manufactured by the following method, for example. FIG. 5 is a view exemplifying manufacturing steps of the TFT substrate 101.

First, a metal film (for example, a Ti film) is formed on a dielectric substrate and patterned to form the alignment mark 21. For example, a glass substrate, a plastic substrate (resin substrate) having heat resistance, or the like can be used as the dielectric substrate. Then, the base insulating film 2 is formed to cover the alignment mark 21. For example, an $SiO_2$ film is used as the base insulating film 2.

Subsequently, a gate metal layer including the gate electrode 3 and the gate bus line GL is formed on the base insulating film 2.

The gate electrode 3 can be formed integrally with the gate bus line GL. Here, a gate conductive film not illustrated (thickness of greater than or equal to 50 nm and less than or equal to 500 nm, for example) is formed on the dielectric substrate by sputtering or the like. Then, the gate conductive film is patterned to obtain the gate electrode 3 and the gate bus line GL. A material of the gate conductive film is not particularly limited. A film containing a metal such as aluminum (Al), tungsten (W), molybdenum (Mo), tantalum (Ta), chromium (Cr), titanium (Ti), and copper (Cu), an alloy thereof, or a metal nitride thereof can be used appropriately. Here, a layered film including MoN (thickness of 50 nm, for example), Al (thickness of 200 nm, for example), and MoN (thickness of 50 nm, for example) layered one on another in this order is formed as the gate conductive film.

Then, the gate insulating layer 4 is formed to cover the gate metal layer. The gate insulating layer 4 can be formed by CVD or the like. As the gate insulating layer 4, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used appropriately. The gate insulating layer 4 may have a layered structure. Here, an SiNx layer (thickness of 410 nm, for example) is formed as the gate insulating layer 4.

Then, the semiconductor layer 5 and a contact layer are formed on the gate insulating layer 4. Here, an intrinsic amorphous silicon film (thickness of 125 nm, for example) and an $n^+$ type amorphous silicon film (thickness of 65 nm, for example) are formed in this order and patterned to obtain the semiconductor layer 5 having an island shape and the contact layer. The semiconductor film used for the semiconductor layer 5 is not limited to an amorphous silicon film. For example, an oxide semiconductor layer may be formed as the semiconductor layer 5. In this case, the contact layer may not be provided between the semiconductor layer 5 and the source/drain electrodes.

Then, a source conductive film (thickness of greater than or equal to 50 nm and less than or equal to 500 nm, for example) is formed on the gate insulating layer 4 and on the contact layer, and patterned to form a source metal layer including the source electrode 7S, the drain electrode 7D, and the source bus line SL. At this time, the contact layer is also etched, and the source contact layer 6S and the drain contact layer 6D separated from each other are formed.

A material of the source conductive film is not particularly limited. A film containing a metal such as aluminum (Al), tungsten (W), molybdenum (Mo), tantalum (Ta), chromium (Cr), titanium (Ti), and copper (Cu), an alloy thereof, or a metal nitride thereof can be used appropriately. Here, a layered film including MoN (thickness of 30 nm, for example), Al (thickness of 200 nm, for example), and MoN (thickness of 50 nm, for example) layered one on another in this order is formed as the source conductive film. Note that alternatively, a layered film including Ti (thickness of 30 nm, for example), MoN (thickness of 30 nm, for example), Al (thickness of 200 nm, for example), and MoN (thickness of 50 nm, for example) layered one on another in this order is formed as the source conductive film.

Here, for example, the source conductive film is formed by sputtering and is patterned by wet etching (source/drain separation). Thereafter, a portion of the contact layer located on a region serving as the channel region of the semiconductor layer 5 is removed by, for example, dry etching to form a gap portion, and the source contact layer 6S and the drain contact layer 6D are separated. At this time, in the gap portion, an area around a surface of the semiconductor layer 5 is also etched (overetching).

Note that, for example, when a layered film including a Ti film and an Al film layered one on another in this order is used as the source conductive film, the Al film may be patterned by wet etching by using, for example, an aqueous solution of phosphoric acid, acetic acid, and nitric acid, and thereafter the Ti film and the contact layer ($n^+$ type amorphous silicon layer) 6 may be patterned simultaneously by dry etching. Alternatively, it is also possible to collectively etch the source conductive film and the contact layer. However, in the case of simultaneously etching the source conductive film or a lower layer of the source conductive film and the contact layer 6, it may be difficult to control distribution of an etching amount of the semiconductor layer 5 (an amount of excavation of the gap portion) in the entire substrate. In contrast, as described above, in the case where the source/drain separation and the gap portion formation are performed in the separate etching steps, the etching amount of the gap portion can be controlled more easily.

Next, the first insulating layer 11 is formed to cover the TFT 10. In this example, the first insulating layer 11 is disposed to come into contact with the channel region of the semiconductor layer 5. In addition, the contact hole CH1 reaching at least the drain electrode 7D is formed in the first insulating layer 11 by known photolithography.

The first insulating layer 11 may be, for example, an inorganic insulating layer such as a silicon oxide ($SiO_2$) film, a silicon nitride (SiNx) film, a silicon oxynitride (SiOxNy; x>y) film, and a silicon nitride oxide (SiNxOy; x>y) film. Here, as the first insulating layer 11, an SiNx layer having a thickness of, for example, 330 nm is formed by, for example, CVD.

Then, a patch conductive film is formed on the first insulating layer 11 and in the contact hole CH1, and is patterned. In this way, the patch electrode 15 is formed in the transmission and/or reception region R1, and the patch connection section 15p is formed in the non-transmission and/or reception region R2. The patch electrode 15 is in contact with the drain electrode 7D in the contact hole CH1. Note that herein, the layer including the patch electrode 15 and the patch connection section 15p and formed of the patch conductive film may be referred to as a "patch metal layer."

The same material as the material of the gate conductive film or the source conductive film can be used as a material of the patch conductive film. However, the patch conductive film is set to have a thickness larger than a thickness of each of the gate conductive film and the source conductive film. In this way, a transmittance of electromagnetic waves is kept low and sheet resistance of the patch electrode is reduced. Thus, a loss resulting from oscillation of free electrons in the patch electrode changing to heat can be reduced. A suitable thickness of the patch conductive film is, for example, greater than or equal to 0.4 μm. In a case where the thickness of the patch conductive film is less than 0.4 μm, the transmittance of electromagnetic waves becomes approximately greater than or equal to 30%, and the sheet resistance becomes greater than or equal to 0.075 Ω/sq. As a result, there is a possibility that a problem of an increase in a loss occur. In a case where the thickness of the patch conductive film is large, there is a possibility that a problem of deterioration in patterning characteristics of the slot occur. On the other hand, the thickness of the patch conductive film is, for example, less than or equal to 3 μm, and more preferably less than or equal to 2 μm. In a case where the thickness of the patch conductive film is greater than 3 μm, warp of the substrate may occur.

Here, a layered film (MoN/Al/MoN) including MoN (thickness of 50 nm, for example), Al (thickness of 1000 nm, for example), and MoN (thickness of 50 nm, for example) layered one on another in this order is formed as the patch conductive film. Note that alternatively, a layered film (MoN/Al/MoN/Ti) including Ti (thickness of 50 nm, for example), MoN (thickness of 50 nm, for example), Al (thickness of 2000 nm, for example), and MoN (thickness of 50 nm, for example) layered one on another in this order may be formed. Alternatively, a layered film (MoN/Al/MoN/Ti) including Ti (thickness of 50 nm, for example), MoN (thickness of 50 nm, for example), Al (thickness of 500 nm, for example), and MoN (thickness of 50 nm, for example) layered one on another in this order may be formed. Alternatively, a layered film (Ti/Cu/Ti) including a Ti film, a Cu film, and a Ti film layered one on another in this order, or a layered film (Cu/Ti) including a Ti film and a Cu film layered one on another in this order may be used.

Then, the second insulating layer (thickness of greater than or equal to 100 nm and less than or equal to 300 nm, for example) 17 is formed on the patch electrode 15 and the first insulating layer 11. The second insulating layer 17 is not particularly limited, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used appropriately as the second insulating layer 17. Here, as the second insulating layer 17, for example, an SiNx layer having a thickness of 200 nm is formed.

Thereafter, the inorganic insulating films (the second insulating layer 17, the first insulating layer 11, and the gate insulating layer 4) are etched collectively by dry etching using a fluorine-based gas, for example. During the etching, the patch electrode 15, the source bus line SL, and the gate bus line GL each function as an etch stop. In this way, the contact hole CH2 reaching at least the gate bus line GL is formed in the second insulating layer 17, the first insulating layer 11, and the gate insulating layer 4, and the contact hole CH3 reaching at least the source bus line SL is formed in the second insulating layer 17 and the first insulating layer 11. In addition, the contact hole CH4 reaching at least the patch connection section 15p is formed in the second insulating layer 17.

In this example, since the inorganic insulating films are etched collectively, side surfaces of the second insulating layer 17, the first insulating layer 11, and the gate insulating layer 4 are aligned on a side wall of the contact hole CH2 obtained, and side walls of the second insulating layer 17 and the first insulating layer 11 are aligned on a side wall of the contact hole CH3. Note that herein, the expression "side surfaces" of different two or more layers "are aligned" in the contact hole does not only refer to a case where the side surfaces exposed in the contact hole in these layers are flush in a vertical direction, but also refers to a case where inclined surfaces such as surfaces having tapered shapes are continuously formed. Such a configuration can be obtained, for example, by etching these layers by using the same mask, or by using one of these layers as a mask to etch the other layers.

Next, a transparent conductive film (thickness of greater than or equal to 50 nm and less than or equal to 200 nm) is formed on the second insulating layer 17 and in the contact holes CH2, CH3, and CH4 by sputtering, for example. An indium tin oxide (ITO) film, an IZO film, a zinc oxide (ZnO) film or the like can be used as the transparent conductive film. Here, an ITO film having a thickness of, for example, 100 nm is used as the transparent conductive film.

Then, the transparent conductive film is patterned to form the gate terminal upper connection section 19g, the source terminal upper connection section 19s, and the transfer terminal upper connection section 19p. The gate terminal upper connection section 19g, the source terminal upper connection section 19s, and the transfer terminal upper connection section 19p are used for protecting the electrodes or wiring lines exposed at respective terminal sections. In this way, the gate terminal section GT, the source terminal section ST, and the transfer terminal section PT are obtained.

Structure of Slot Substrate 201

Then, a structure of the slot substrate 201 will be described specifically.

Figure 6A:
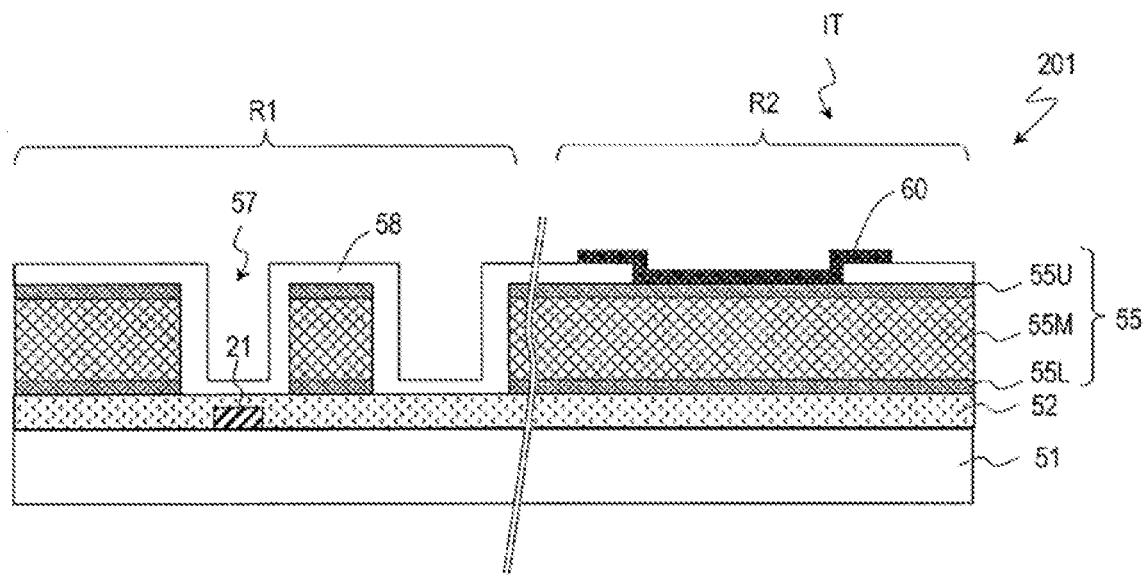
FIG. 6A is a cross-sectional view schematically illustrating an antenna unit region U and a terminal section IT in the slot substrate 201.

FIG. 6A is a cross-sectional view schematically illustrating the antenna unit region U and the terminal section IT in the slot substrate 201.

The slot substrate 201 includes the dielectric substrate 51 including a surface and a rear surface, a third insulating layer 52 formed on the surface of the dielectric substrate 51, the slot electrode 55 formed on the third insulating layer 52, and a fourth insulating layer 58 covering the slot electrode 55. A reflective conductive plate 65 is disposed to face the rear surface of the dielectric substrate 51 via a dielectric layer (air layer) 54. The slot electrode 55 and the reflective conductive plate 65 function as walls of the waveguide 301.

In the transmission and/or reception region R1, the plurality of slots 57 are formed in the slot electrode 55. Each slot 57 is an opening penetrating the slot electrode 55. In this example, one slot 57 is disposed in each antenna unit region U.

The fourth insulating layer 58 is formed on the slot electrode 55 and in the slot 57. A material of the fourth insulating layer 58 may be the same as the material of the third insulating layer 52. Since the slot electrode 55 is covered with the fourth insulating layer 58 to prevent the slot electrode 55 and the liquid crystal layer LC from being in direct contact with each other, reliability can be enhanced. In a case where the slot electrode 55 is formed of a Cu layer, Cu may elute into the liquid crystal layer LC. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is prepared by bonding aluminum foil as the Al layer on the dielectric substrate 51 with an adhesive and patterning the Al layer, a problem of the void can be avoided.

The slot electrode 55 includes a main layer 55M such as a Cu layer and an Al layer. The slot electrode 55 may include a layered structure including the main layer 55M, and an upper layer 55U and a lower layer 55L disposed to sandwich the main layer 55M between the upper layer 55U and the lower layer 55L. A thickness of the main layer 55M may be set in consideration for a skin effect depending on a material, and may be, for example, greater than or equal to 2 μm and less than or equal to 30 μm. The thickness of the main layer 55M is typically greater than the thickness of each of the upper layer 55U and the lower layer 55L.

In the illustrated example, the main layer 55M is a Cu layer, and the upper layer 55U and the lower layer 55L are Ti layers. Adhesion between the slot electrode 55 and the third insulating layer 52 can be improved by disposing the lower layer 55L between the main layer 55M and the third insulating layer 52. In addition, corrosion of the main layer 55M (for example, the Cu layer) can be suppressed by providing the upper layer 55U.

Since the reflective conductive plate 65 constitutes the wall of the waveguide 301, it is preferable that the reflective conductive plate 65 have a thickness three times or greater the skin depth, and preferably five times or greater the skin depth. For example, an aluminum plate, a copper plate, or the like prepared by a cutting out process and having a thickness of several millimeters can be used as the reflective conductive plate 65.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening reaching at least the slot electrode 55. The upper connection section 60 is in contact with the slot electrode 55 in the opening. In the present embodiment, the terminal section IT is disposed in the seal region Rs, and is connected to the transfer terminal section on the TFT substrate (transfer section) by a sealing resin containing conductive particles.

Manufacturing Method of Slot Substrate 201

The slot substrate 201 can be manufactured by the following method, for example.

First, the third insulating layer (thickness of 200 nm, for example) 52 is formed on the dielectric substrate. A substrate such as a glass substrate and a resin substrate having a high transmittance to electromagnetic waves (the dielectric constant em and the dielectric loss tan $\delta_M$ are small) can be used as the dielectric substrate. The dielectric substrate is preferably thin to suppress attenuation of electromagnetic waves. For example, constituent elements such as the slot electrode 55 may be formed on a surface of the glass substrate by a process described below, and thereafter the glass substrate may be thinned from the rear surface side. In this way, a thickness of the glass substrate can be reduced to 500 μm or less, for example.

When a resin substrate is used as the dielectric substrate, constituent elements such as TFTs may be formed directly on the resin substrate, or may be formed on the resin substrate by using a transfer method. According to the transfer method, for example, a resin film (for example, a polyimide film) is formed on the glass substrate, and the constituent elements are formed on the resin film by a process described below, and thereafter the resin film on which the constituent elements are formed is separated from the glass substrate. Generally, the dielectric constant $\varepsilon_M$ and the dielectric loss tan $\delta_M$ of a resin are smaller than the dielectric constant $\varepsilon_M$ and the dielectric loss tan $\delta_M$ of glass. A thickness of the resin substrate is, for example, from 3 μm to 300 μm. Besides polyimide, for example, a liquid crystal polymer can also be used as the resin material.

The third insulating layer 52 is not particularly limited, but, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used appropriately.

Then, a metal film is formed on the third insulating layer 52, and is patterned to obtain the slot electrode 55 including the plurality of slots 57. As the metal film, a Cu film (or an Al film) having a thickness of from 2 μm to 5 μm may be used. Here, a layered film including a Ti film, a Cu film, and a Ti film layered one on another in this order is used. Note that alternatively, a layered film including Ti (thickness of 50 nm, for example) and Cu (thickness of 5000 nm, for example) layered one on another in this order may be formed.

Thereafter, the fourth insulating layer (thickness of 100 nm or 200 nm, for example) 58 is formed on the slot electrode 55 and in the slot 57. A material of the fourth insulating layer 58 may be the same as the material of the third insulating layer. Thereafter, in the non-transmission and/or reception region R2, an opening reaching at least the slot electrode 55 is formed in the fourth insulating layer 58.

Then, a transparent conductive film is formed on the fourth insulating layer 58 and in the opening of the fourth insulating layer 58, and is patterned to form the upper connection section 60 being in contact with the slot electrode 55 in the opening. In this way, the terminal section IT is obtained.

Modification 1 of Slot Substrate 201

In the example above, the alignment mark 21 is formed on the slot substrate 201 by using the metal layer and thus, the third insulating layer 52 covering the alignment mark 21 is formed, but the alignment mark 21 can be omitted. When the alignment mark 21 is omitted, the slot electrode 55 may be formed directly on the dielectric substrate 51. In addition, in the example above, the slot electrode 55 includes a layered structure including the main layer 55M, and the upper layer 55U and the lower layer 55L disposed to sandwich the main layer 55M between the upper layer 55U and the lower layer 55L, but the slot electrode 55 can be formed of the main layer (a Cu layer, for example) 55M alone. Hereinafter, a modification of a slot substrate including a slot electrode 55 formed of a Cu layer alone on a dielectric substrate 51 will be described, but the modification is not limited to this case, and can also be applied to a case where the alignment mark 21 is provided or a case where the slot electrode 55 includes a layered structure.

As described above, the slot electrode 55 is formed of a Cu layer having a relatively large thickness such as 2 μm or greater. A Cu layer formed by a thin film deposition technique (sputtering, for example) is known to have tensile stress. Accordingly, when the slot electrode 55 is directly formed of the relatively thick Cu layer on the dielectric substrate 51, the dielectric substrate 51 may warp owing to the tensile stress of the slot electrode 55. Of course, a magnitude of the warp depends on the thickness of the Cu layer and the material of the dielectric substrate 51. However, for example, when a glass substrate including one side of 500 mm or greater is used as the dielectric substrate 51, problems such as transport trouble, substrate chipping, or substrate cracking may occur in a mass-production process. The slot substrate according to the modification described below as an example is capable of suppressing the occurrence of the problems described above.

Figure 6B:
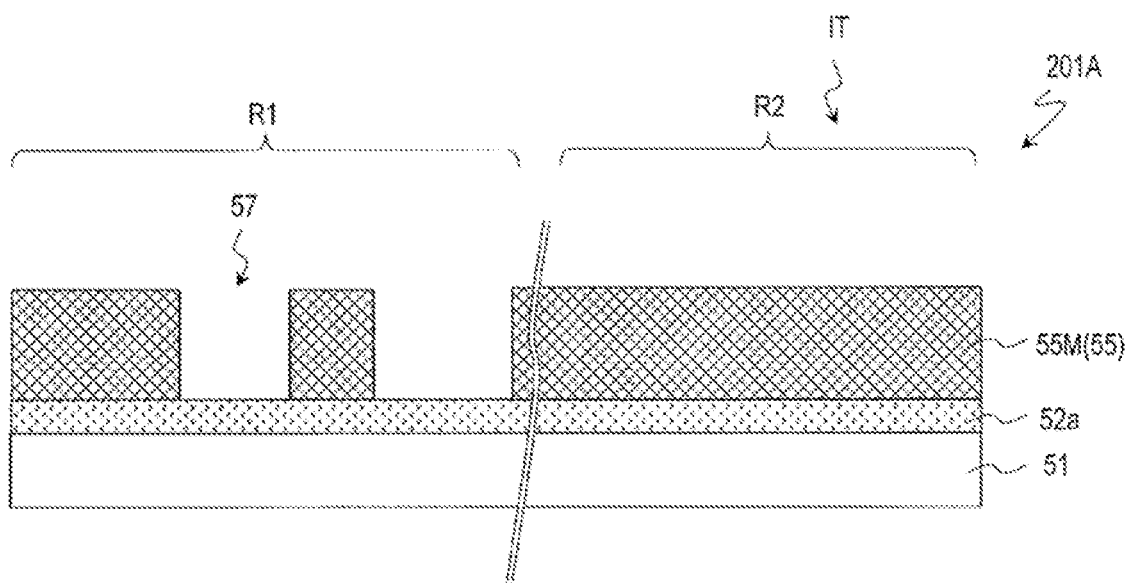
FIG. 6B is a cross-sectional view schematically illustrating an antenna unit region U and a terminal section IT in a slot substrate 201A.
Figure 6C:
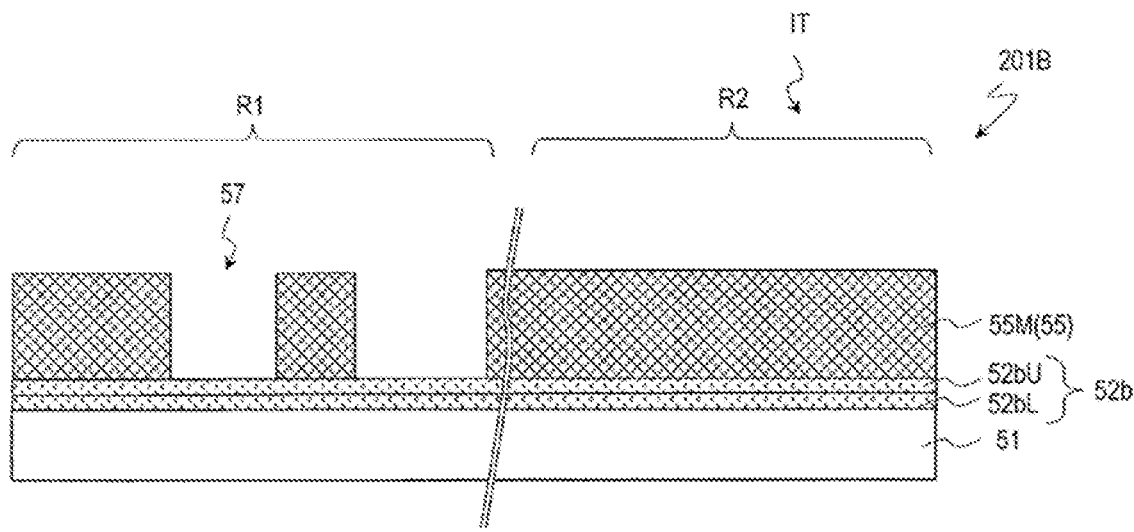
FIG. 6C is a cross-sectional view schematically illustrating an antenna unit region U and a terminal section IT in a slot substrate 201B.

FIG. 6B and FIG. 6C schematically illustrate cross-sectional structures of antenna unit regions U and terminal sections IT in slot substrates 201A and 201B, respectively.

The slot substrate 201A illustrated in FIG. 6B includes a dielectric substrate 51, a slot electrode 55 supported on a first main surface of the dielectric substrate 51, and a third insulating layer 52a disposed between the dielectric substrate 51 and the slot electrode 55. The dielectric substrate 51 is, for example, a glass substrate 51, and has a thickness of, for example, 0.65 mm to 0.74 mm, inclusive. The slot electrode 55 is formed of a Cu layer (main layer 55M) alone. A thickness of the slot electrode 55 is, for example, from 2 μm to 6 μm, inclusive.

Here, the slot electrode 55 has tensile stress, and the third insulating layer 52a has compressive stress. The third insulating layer 52a having compressive stress is formed between the dielectric substrate 51 and the slot electrode 55 to negate (alleviate) the tensile stress due to the slot electrode 55 and thus, it is possible to reduce warp of the slot substrate 201A. As a result, occurrence of problems such as transport trouble, substrate chipping, or substrate cracking is suppressed.

The third insulating layer 52a having compressive stress includes, for example, a silicon nitride layer ($Si_xN_y$). The third insulating layer 52a is, for example, a silicon nitride layer having a thickness of from 200 nm to 900 nm, inclusive. When a hydrogen removal amount of the silicon nitride layer is $3 \times 10^{16}/cm^2$ or less, the silicon nitride layer has compressive stress. The hydrogen removal amount of the silicon nitride layer is measured by thermal desorption spectrometry. In addition, it is known that when a refractive index of the silicon nitride layer is approximately 1.805 or greater, the silicon nitride layer has compressive stress.

The third insulating layer 52a may include a silicon oxide layer ($SiO_x$). The third insulating layer 52a is, for example, a silicon oxide layer having a thickness of from 200 nm to 900 nm, inclusive. It is known that when a refractive index of the silicon oxide layer is from 1.4 to 1.6, inclusive, the silicon oxide layer has compressive stress.

A silicon nitride layer or a silicon oxide layer having a thickness of from 200 nm to 900 nm, inclusive is formed and thus, it is possible to effectively negate (alleviate) the tensile stress of the slot electrode 55 having a thickness of from 2 µm to 6 µm, inclusive.

The slot substrate 201B illustrated in FIG. 6C includes a dielectric substrate 51, a slot electrode 55 supported on a first main surface of the dielectric substrate 51, and a third insulating layer 52b disposed between the dielectric substrate 51 and the slot electrode 55. The slot substrate 201B differs from the slot substrate 201A in that the third insulating layer 52b is a layered film including an upper insulating layer 52bU and a lower insulating layer 52bL.

The upper insulating layer 52bU and the lower insulating layer 52bL of the third insulating layer 52b may be a silicon nitride layer and a silicon oxide layer, respectively. That is, the silicon nitride layer may be disposed closer to the slot electrode 55 than the silicon oxide layer. Alternatively, conversely, the upper insulating layer 52bU and the lower insulating layer 52bL may be a silicon oxide layer and a silicon nitride layer, respectively. That is, the silicon oxide layer may be disposed closer to the slot electrode 55 than the silicon nitride layer.

In any of the cases, since the third insulating layer 52b only needs to have compressive stress as a whole, any one of the upper insulating layer 52bU and the lower insulating layer 52bL may have compressive stress. A thickness of the third insulating layer 52b is preferably from 200 nm to 900 nm, inclusive. A thickness of the upper insulating layer 52bU is preferably from 10 nm to 890 nm, inclusive, and a thickness of the lower insulating layer 52bL is preferably from 10 nm to 890 nm, inclusive.

The slot substrates 201A and 201B can be manufactured by the following method, for example.

First, as the dielectric substrate 51, for example, a glass substrate (thickness of 0.7 mm, for example) is provided.

Next, the third insulating layer 52a or 52b is formed on the glass substrate. A silicon nitride film and/or a silicon oxide film constituting the third insulating layer 52a or 52b is formed by the following method, for example.

Examples of conditions for forming the silicon nitride film: $SiH_4/NH_3/N_2$: from 100 to 500/from 100 to 1000/from 1000 to 6000 sccm, pressure: from 100 to 300 Pa, and radio frequency (RF) power: from 400 to 4000 W.

Examples of conditions for forming the silicon oxide film: $SiH_4/N_2O$: from 50 to 300/from 1000 to 7000 sccm, pressure: from 100 to 300 Pa, and RF power: from 400 to 3000 W.

Then, a metal film is formed on the third insulating layer 52a or 52b, and is patterned to obtain the slot electrode 55 including a plurality of slots 57. As the metal film, a Cu film (thickness of 3 µm, for example) is used.

These steps can be executed easily by using a manufacturing apparatus for an LCD panel.

Modification 2 of Slot Substrate 201

A slot substrate according to modification 2 can effectively prevent a metal incorporated in a slot electrode 55 from eluting into a liquid crystal layer LC. Here again, a modification of the slot substrate including the slot electrode 55 formed of a Cu layer alone on a dielectric substrate 51 will be described, but the modification is not limited to this case, and may be applied to a case where an alignment mark 21 is provided or a case where the slot electrode 55 includes a layered structure.

Figure 6D:
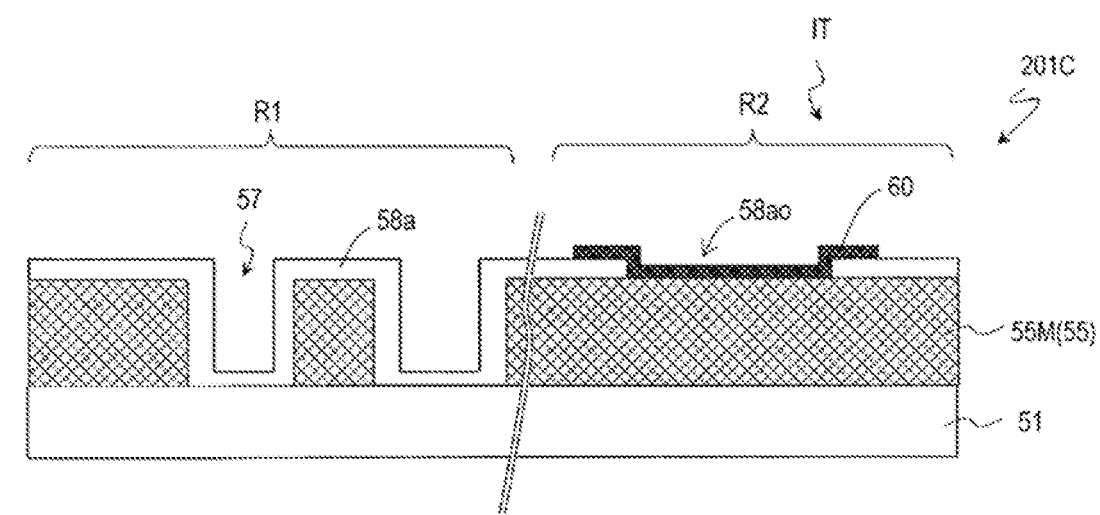
FIG. 6D is a cross-sectional view schematically illustrating an antenna unit region U and a terminal section IT in a slot substrate 201C.

FIG. 6D schematically illustrates a cross-sectional structure of an antenna unit region U and a terminal section IT in a slot substrate 201C. The slot substrate 201C includes a fourth insulating layer 58a as with the fourth insulating layer 58 of the slot substrate 201. The slot electrode 55 may include a Cu layer or an Al layer. In the slot substrate 201C, a main layer 55M is formed of Cu or Al, or an upper portion and a lower portion are each formed of a Cu layer and a Ti layer layered one on another (Cu/Ti), or the upper portion and the lower portion are each formed of an Mo layer and an Al layer layered one on another (Mo/Al). Of course, the slot electrode 55 of the slot substrate 201C may have a three-layered structure as with the slot electrode 55 illustrated in FIG. 6A.

The fourth insulating layer 58a covers a surface of the slot electrode 55 to prevent the slot electrode 55 from coming into direct contact with the liquid crystal layer LC. Note that the "surface of the slot electrode 55" refers to a surface including an upper face of the slot electrode 55 and a side face of the slot electrode 55 in a slot 57. The fourth insulating layer 58a does not need to cover a surface of the dielectric substrate 51 in the slot 57. However, in consideration for a manufacturing process, the fourth insulating layer 58a realistically covers the surface of dielectric substrate 51 in the slot 57.

The fourth insulating layer 58a functioning as a protection layer of the slot electrode 55 includes, for example, a silicon nitride layer. The fourth insulating layer 58a is, for example, a silicon nitride layer having a thickness of from 30 nm to 200 nm, inclusive. Alternatively, the fourth insulating layer 58a may include a silicon oxide layer. The fourth insulating layer 58a is, for example, a silicon oxide layer having a thickness of from 30 nm to 200 nm, inclusive.

Note that, when the fourth insulating layer 58a is omitted, that is, when the slot electrode 55 is simply covered with an alignment film, it has not been possible to sufficiently suppress elution of a metal.

The slot substrate 201C can be manufactured by the following method, for example.

A metal film is formed on the dielectric substrate 51 used in the slot substrate 201, and is patterned to obtain the slot electrode 55 including a plurality of the slots 57. As the metal film, a Cu film or an Al film is used, or a layered film including a Ti film and a Cu film layered one on another in this order is used, or a layered film including an Al film and an Mo film layered one on another in this order is used.

Thereafter, the fourth insulating layer 58a is formed on the slot electrode 55 and in the slot 57. A material of the fourth insulating layer 58a is a silicon oxide film or a silicon nitride film.

An opening 58ao reaching at least the slot electrode 55 is formed in the fourth insulating layer 58a.

Then, a transparent conductive film is formed on the fourth insulating layer 58a and in the opening 58ao of the fourth insulating layer 58a, and is patterned to form an upper connection section 60 being in contact with the slot electrode 55 in the opening. In this way, the terminal section IT is obtained.

Next, other examples of modification 2 will be described with reference to FIG. 6E and FIG. 6F.

Figure 6E:
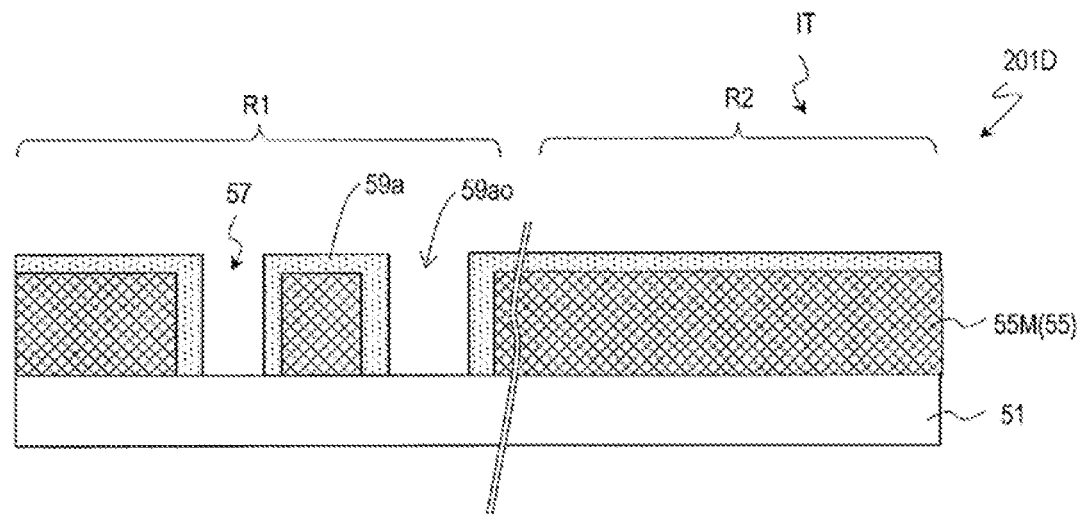
FIG. 6E is a cross-sectional view schematically illustrating an antenna unit region U and a terminal section IT in a slot substrate 201D.
Figure 6F:
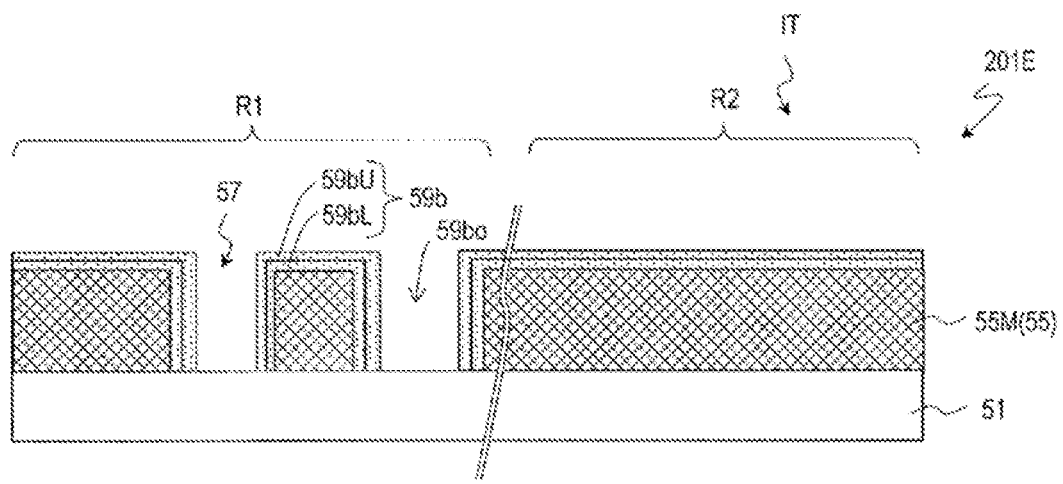
FIG. 6F is a cross-sectional view schematically illustrating an antenna unit region U and a terminal section IT in a slot substrate 201E.

FIG. 6E and FIG. 6F schematically illustrate cross-sectional structures of antenna unit regions U and terminal sections IT in slot substrates 201D and 201E, respectively.

The slot substrate 201D illustrated in FIG. 6E includes a conductive layer 59a instead of the fourth insulating layer 58 of the slot substrate 201. The conductive layer 59a covers a surface (including a side face) of a slot electrode 55 to prevent the slot electrode 55 from coming into direct contact with a liquid crystal layer LC. However, the conductive layer 59a, unlike the fourth insulating layer 58, includes an opening 59ao reaching at least a dielectric substrate 51 in a slot 57. This is because when the conductive layer 59a is formed in the slot 57, the slot 57 cannot function as the slot 57.

The conductive layer 59a functioning as a protection layer of the slot electrode 55 includes, for example, a high melting-point metal layer. The conductive layer 59a is, for example, a high melting-point metal layer having a thickness of from 30 nm to 200 nm, inclusive. The high melting-point metal layer is, for example, formed of any of Ti, MoNb, and MoNbNi.

In addition, the conductive layer 59a may be a transparent oxide layer. The transparent conductive oxide layer is, for example, formed of indium tin oxide (ITO) or indium zinc oxide.

The slot substrate 201E illustrated in FIG. 6F includes a conductive layer 59b, instead of the conductive layer 59a of the slot substrate 201D. The conductive layer 59b includes an upper conductive layer 59bU and a lower conductive layer 59bL. The conductive layer 59b also, as with the conductive layer 59a, covers a surface of the slot electrode 55, and includes an opening 59bo exposing a surface of a dielectric substrate 51 in a slot.

The conductive layer 59b includes, for example, a high melting-point metal layer and a transparent conductive oxide layer. The high melting-point metal layer is preferably disposed closer to the slot electrode than the transparent conductive oxide layer. The transparent conductive oxide layer prevents oxidation of the high melting-point metal layer. The conductive layer 59b includes, for example, the upper conductive layer 59bU and the lower conductive layer 59bL. The upper conductive layer 59bU is a transparent conductive oxide layer, and the lower conductive layer 59bL is a high melting-point metal layer. A thickness of the conductive layer 59b is, for example, from 30 nm to 200 nm, inclusive. A thickness of the high melting-point metal layer is, for example, 10 nm to 190 nm, inclusive, and a thickness of the transparent conductive oxide layer is, for example, 10 nm to 190 nm, inclusive.

In the terminal section IT of the slot substrate 201D or 201E, the conductive layer 59a or 59b covering the slot electrode 55 protects the slot electrode 55. Thus, when the conductive layer 59a or 59b is used, it is possible to simplify a structure of the terminal section IT more than when an insulating layer is used. In the slot substrate 201C using the fourth insulating layer 58a, the opening 58ao is provided in the fourth insulating layer 58a of the terminal section IT, and the upper conductive layer 60 being in contact with the slot electrode 55 is formed in the opening 58a, as illustrated in FIG. 6D. In contrast, in the terminal section IT of the slot substrate 201D or 201E, it is only necessary to form the conductive layer 59a or 59b.

The slot substrates 201D and 201E can be manufactured by the following method, for example.

First, as with the slot substrate 201C, the slot electrode 55 is formed on the dielectric substrate 51.

Thereafter, a conductive film is formed on the slot electrode 55 and in the slot 57, and the opening 59ao or 59bo reaching at least the dielectric substrate 51 is formed in the slot 57 to obtain the conductive layer 59a or 59b.

Modification 1 and modification 2 can be combined as desired. For example, the slot electrode 55 of the slot substrate 201A or 201B may be covered with the fourth insulating layer 58a, as with the slot substrate 201C. In addition, the slot electrode 55 of the slot substrate 201A or 201B may be covered with the conductive layer 59a as with the slot substrate 201D, or may be covered with the conductive layer 59a as with the slot substrate 201E.

Transfer Section

Figure 7:
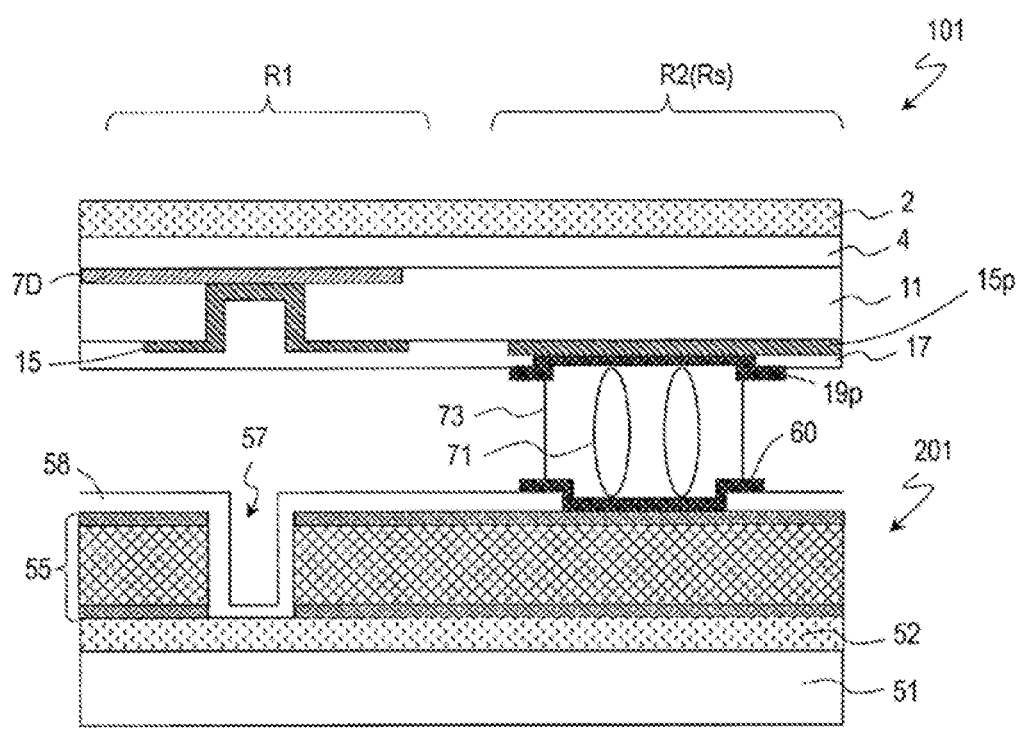
FIG. 7 is a schematic cross-sectional view for illustrating a transfer section in the TFT substrate 101 and the slot substrate 201.

FIG. 7 is a schematic cross-sectional view for explaining the transfer section configured to connect the transfer terminal section PT of the TFT substrate 101 and the terminal section IT of the slot substrate 201. In FIG. 7, the same constituent elements as the constituent elements in FIG. 1 to FIG. 4C are denoted by the same reference signs.

In the transfer section, the upper connection section 60 of the terminal section IT is electrically connected to the transfer terminal upper connection section 19p of the transfer terminal section PT in the TFT substrate 101. In the present embodiment, the upper connection section 60 and the transfer terminal upper connection section 19p are connected via a resin (sealing resin) 73 (may also be referred to as a sealing portion 73) including conductive beads 71.

Any of the upper connection sections 60 and 19p is a transparent conductive layer such as an ITO film or an IZO film, and an oxide film may be formed on a surface of the transparent conductive layer. When the oxide film is formed, there is a possibility that electrical connection between the transparent conductive layers cannot be ensured, and that contact resistance increase. In contrast, in the present embodiment, since these transparent conductive layers are bonded via a resin including the conductive beads (for example, Au beads) 71, even in a case where a surface oxide film is formed, the conductive beads pierce (penetrate) the surface oxide film and thus, it is possible to suppress an increase in contact resistance. The conductive beads 71 may penetrate not only the surface oxide film but also may penetrate the upper connection sections 60 and 19p which are the transparent conductive layers, and may be in direct contact with the patch connection section 15p and the slot electrode 55.

The transfer section may be disposed at each of a central portion and a peripheral portion of the scanning antenna 1000 (that is, inside and outside of the transmission and/or reception region R1 having a donut shape as viewed from the normal direction of the scanning antenna 1000), or may be disposed only at any one of the central portion and the peripheral portion of the scanning antenna 1000. The transfer section may be disposed in the seal region Rs in which the liquid crystal is enclosed, or may be disposed outside the seal region Rs (opposite to the liquid crystal layer).

Material and Structure of TFT 10

In the present embodiment, the TFT including the semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, an oxide semiconductor incorporated in the oxide semiconductor layer may be an amorphous oxide semiconductor or may be a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially orthogonal to a layer surface.

The oxide semiconductor layer may include a layered structure of two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer includes a two-layer structure including an upper layer and a lower layer, an energy gap of the oxide semiconductor incorporated in the upper layer is preferably greater than an energy gap of the oxide semiconductor incorporated in the lower layer. However, when a difference in the energy gap between these layers is relatively small, the energy gap of the oxide semiconductor in the lower layer may be larger than the energy gap of the oxide semiconductor in the upper layer.

JP 2014-007399 A, for example, describes materials and structures of an amorphous oxide semiconductor and of each of the above-described crystalline oxide semiconductors, a film formation method, a configuration of an oxide semiconductor layer including a layered structure, and the like. The entire contents of the disclosure of JP 2014-007399 A are incorporated herein by reference.

The oxide semiconductor layer may include, for example, at least one metal element of In, Ga, and Zn. In the present embodiment, the oxide semiconductor layer includes, for example, an In—Ga—Zn—O based semiconductor (for example, indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including the In—Ga—Zn—O based semiconductor. Note that a channel etched type TFT including an active layer including an oxide semiconductor such as the In—Ga—Zn—O based semiconductor may be referred to as a "CE-OS-TFT."

The In—Ga—Zn—O based semiconductor may be an amorphous semiconductor or a crystalline semiconductor. A crystalline In—Ga—Zn—O based semiconductor having a c-axis oriented substantially orthogonal to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A described above. The entire contents of disclosures of JP 2012-134475 A and JP 2014-209727 A are incorporated herein by reference. Since a TFT including an In—Ga—Zn—O based semiconductor layer has high mobility (more than 20 times in comparison with an a-Si TFT) and low leakage current (less than 1/100th in comparison with an a-Si TFT), such a TFT can suitably be used as a driving TFT (for example, a TFT incorporated in a driving circuit provided in the non-transmission and/or reception region) and a TFT provided in each antenna unit region.

The oxide semiconductor layer may include another oxide semiconductor in place of the In—Ga—Zn—O based semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an in-Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 3A and FIG. 3B, the TFT 10 is a channel etched type TFT including a bottom gate structure. The "channel etched type TFT" does not include an etch stop layer formed on a channel region, and a lower face of an end portion on the channel side of each of source and drain electrodes is disposed to come into contact with an upper face of a semiconductor layer. The channel etched type TFT is formed by, for example, forming a conductive film for the source/drain electrode on the semiconductor layer and performing source/drain separation. In the source/drain separation step, a surface portion of the channel region may be etched.

Note that the TFT 10 may be an etch stop type TFT including an etch stop layer formed on a channel region. In the etch stop type TFT, a lower face of an end portion on the channel side of each of source and drain electrodes is located, for example, on the etch stop layer. The etch stop type TFT is formed by, for example, forming the etch stop layer covering a portion serving as the channel region in a semiconductor layer, and thereafter forming a conductive film for the source/drain electrode on the semiconductor layer and on the etch stop layer to perform source/drain separation.

In addition, although the TFT 10 includes a top contact structure in which the source and drain electrodes are in contact with the upper face of the semiconductor layer, the source and drain electrodes may be disposed to be in contact with the lower face of the semiconductor layer (a bottom contact structure). Further, the TFT 10 may include a bottom gate structure including a gate electrode on the dielectric substrate side of the semiconductor layer, or may include a top gate structure including the gate electrode above the semiconductor layer.

Second Embodiment

A scanning antenna of a second embodiment will be described with reference to the drawings. A TFT substrate of the scanning antenna of the present embodiment differs from the TFT substrate 101 illustrated in FIG. 2A in that a transparent conductive layer serving as an upper connection section of each terminal section is provided between a first insulating layer and a second insulating layer in the TFT substrate.

Figure 8A:
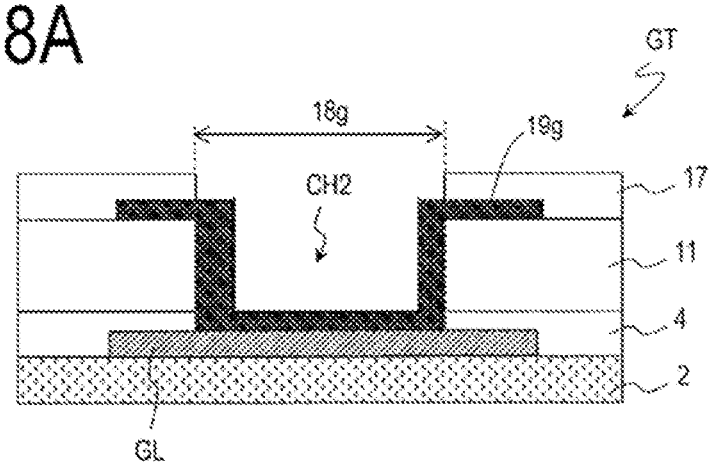
FIG. 8A to FIG. 8C are cross-sectional views illustrating a gate terminal section GT, a source terminal section ST, and a transfer terminal section PT of a TFT substrate 102 in a second embodiment, respectively.
Figure 8B:
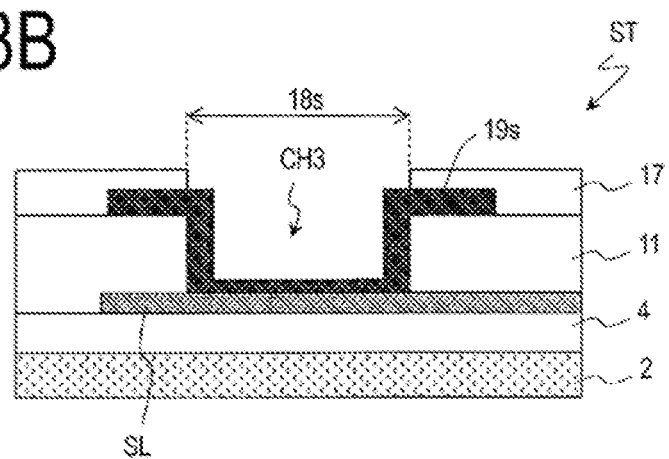
Figure 8C:
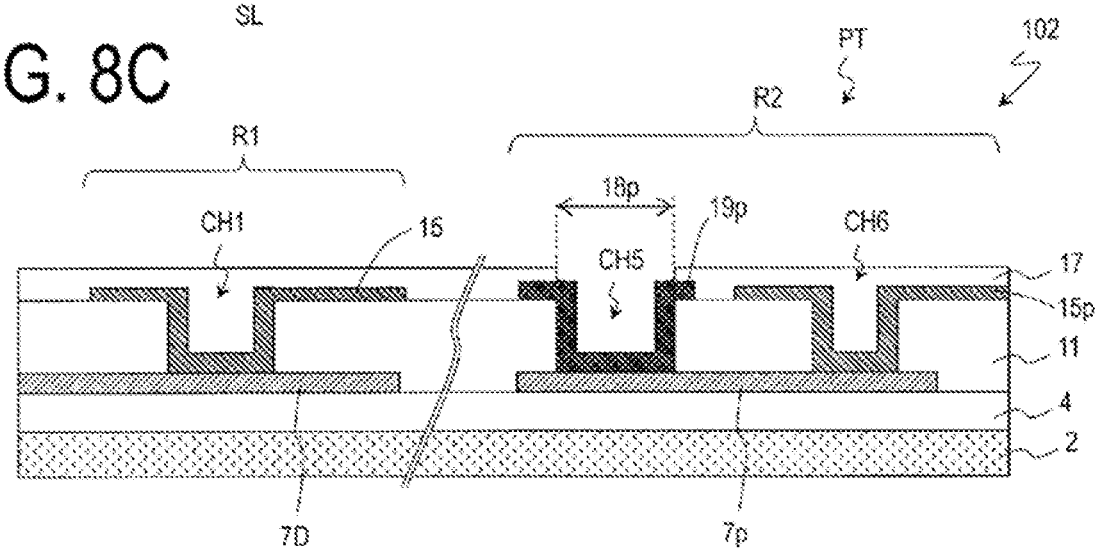

FIG. 8A to FIG. 8C are cross-sectional views illustrating a gate terminal section GT, a source terminal section ST, and a transfer terminal section PT of a TFT substrate 102 in the present embodiment, respectively. The same constituent elements as the constituent elements in FIG. 4A to FIG. 4C are denoted by the same reference signs, and description of these constituent elements will be omitted. Note that since a cross-sectional structure of an antenna unit region U is similar to the cross-sectional structure of the antenna unit region U of the above-described embodiment (FIG. 3A and FIG. 3B), illustration and description of the cross-sectional structure of the antenna unit region U will be omitted.

The gate terminal section GT in the present embodiment includes a gate bus line GL formed on a dielectric substrate, an insulating layer covering the gate bus line GL, and a gate terminal upper connection section 19g. The gate terminal upper connection section 19g is in contact with the gate bus line GL in a contact hole CH2 formed in the insulating layer. In this example, the insulating layer covering the gate bus line GL includes a gate insulating layer 4 and a first insulating layer 11. A second insulating layer 17 is formed on the gate terminal upper connection section 19g and on the first insulating layer 11. The second insulating layer 17 includes an opening 18g exposing a part of the gate terminal upper connection section 19g. In this example, the opening 18g of the second insulating layer 17 may be disposed to expose entirely the contact hole CH2.

The source terminal section ST includes a source bus line SL formed on the dielectric substrate (here, on the gate insulating layer 4), an insulating layer covering the source bus line SL, and a source terminal upper connection section 19s. The source terminal upper connection section 19s is in contact with the source bus line SL in a contact hole CH3 formed in the insulating layer. In this example, the insulating layer covering the source bus line SL includes only the first insulating layer 11. The second insulating layer 17 extends on the source terminal upper connection section 19s and on the first insulating layer 11. The second insulating layer 17 includes an opening 18s exposing a part of the source terminal upper connection section 19s. The opening 18s of the second insulating layer 17 may be disposed to expose entirely the contact hole CH3.

The transfer terminal section PT includes a source connection wiring line 7p formed of the same conductive film (source conductive film) as a conductive film of the source bus line SL, the first insulating layer 11 extending on the source connection wiring line 7p, and a transfer terminal upper connection section 19p and a patch connection section 15p formed on the first insulating layer 11.

Contact holes CH5 and CH6 are provided in the first insulating layer 11 to expose the source connection wiring line 7p. The transfer terminal upper connection section 19p is disposed on the first insulating layer 11 and in the contact hole CH5, and is in contact with the source connection wiring line 7p in the contact hole CH5. The patch connection section 15p is disposed on the first insulating layer 11 and in the contact hole CH6, and is in contact with the source connection wiring line 7p in the contact hole CH6. The transfer terminal upper connection section 19p is a transparent electrode formed of a transparent conductive film. The patch connection section 15p is formed of the same conductive film as a conductive film of a patch electrode 15.

Note that the upper connection sections 19g, 19s, and 19p of the respective terminal sections may be formed of the same transparent conductive film.

The second insulating layer 17 extends on the transfer terminal upper connection section 19p, the patch connection section 15p, and the first insulating layer 11. The second insulating layer 17 includes an opening 18p exposing a part of the transfer terminal upper connection section 19p. In this example, the opening 18p of the second insulating layer 17 is disposed to expose entirely the contact hole CH5. On the other hand, the patch connection section 15p is covered with the second insulating layer 17.

In this way, in the present embodiment, the source connection wiring line 7p formed in a source metal layer electrically connects the transfer terminal upper connection section 19p of the transfer terminal section PT and the patch connection section 15p. Although not illustrated in the drawings, as with the above-described embodiment, the transfer terminal upper connection section 19p is connected to a slot electrode of a slot substrate 201 by a sealing resin containing conductive particles.

In the above-described embodiment, the contact holes CH1 to CH4 having different depths are collectively formed after formation of the second insulating layer 17. For example, while the relatively thick insulating layers (the gate insulating layer 4, the first insulating layer 11 and the second insulating layer 17) are etched on the gate terminal section GT, only the second insulating layer 17 is etched in the transfer terminal section PT. For this reason, there is a possibility that a conductive film (for example, a patch electrode conductive film) serving as a base of a shallow contact hole be considerably damaged during etching.

In contrast, in the present embodiment, the contact holes CH1 to CH3. CH5, and CH6 are formed prior to the formation of the second insulating layer 17. Since these contact holes are formed only in the first insulating layer 11 or in a layered film of the first insulating layer 11 and the gate insulating layer 4, a difference in a depth among the contact holes collectively formed can be reduced more than in the above-described embodiment. Accordingly, a damage to a conductive film serving as a base of a contact hole can be reduced. Particularly, when an Al film is used for the patch electrode conductive film, and an ITO film is brought into direct contact with the Al film, favorable contact cannot be obtained and thus, a cap layer such as an MoN layer may be formed on an upper layer of the Al film. In such a case, it is unnecessary to increase a thickness of the cap layer in consideration for a damage during etching and thus, such a case is advantageous.

Manufacturing Method of TFT Substrate 102

Figure 9:
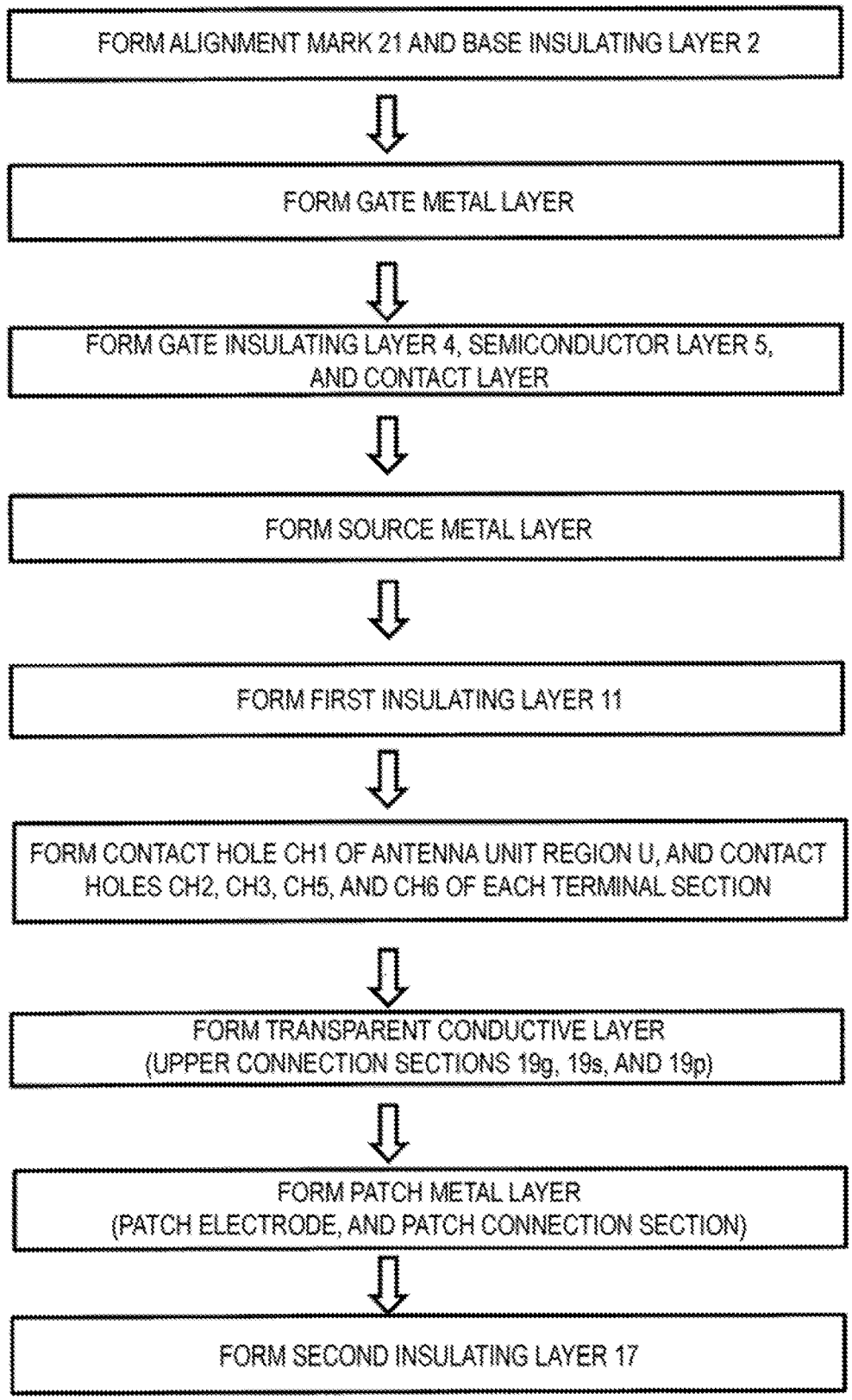
FIG. 9 is a view illustrating an example of the manufacturing steps of the TFT substrate 102.

The TFT substrate 102 is manufactured by the following method, for example. FIG. 9 is a view illustrating an example of manufacturing steps of the TFT substrate 102. Note that hereinafter, in a case where a material, a thickness, a formation method, and the like of each layer are the same as in the case of the TFT substrate 101 described above, description of the material, the thickness, the formation method, and the like of each layer will be omitted.

First, an alignment mark, a base insulating layer, a gate metal layer, a gate insulating layer, a semiconductor layer, a contact layer, and a source metal layer are formed on a dielectric substrate by the same method as in the case of the TFT substrate 101, and a TFT is obtained. In the step of forming the source metal layer, in addition to source and drain electrodes and a source bus line, the source connection wiring line 7p is also formed of a source conductive film.

Next, the first insulating layer 11 is formed to cover the source metal layer. Thereafter, the first insulating layer 11 and the gate insulating layer 4 are collectively etched to form the contact holes CH1 to CH3, CH5, and CH6. During the etching, each of the source bus line SL and the gate bus line GL functions as an etch stop. In this way, in a transmission and/or reception region R1, the contact hole CH1 reaching at least the drain electrode of the TFT is formed in the first insulating layer 11. In addition, in a non-transmission and/or reception region R2, the contact hole CH2 reaching at least the gate bus line GL is formed in the first insulating layer 11 and the gate insulating layer 4, and the contact hole CH3 reaching at least the source bus line SL and the contact holes CH5 and CH6 reaching at least the source connection wiring line 7p are formed in the first insulating layer 11. The contact hole CH5 may be disposed in the seal region Rs and the contact hole CH6 may be disposed outside the seal region Rs. Alternatively, both the contact hole CH5 and the contact hole CH6 may be disposed outside the seal region Rs.

Then, a transparent conductive film is formed on the first insulating layer 11 and in the contact holes CH1 to CH3, CH5, and CH6, and is patterned. In this way, the gate terminal upper connection section 19g being in contact with the gate bus line GL in the contact hole CH2, the source terminal upper connection section 19s being in contact with the source bus line SL in the contact hole CH3, and the transfer terminal upper connection section 19p being in contact with the source connection wiring line 7p in the contact hole CH5 are formed.

Next, a patch electrode conductive film is formed on the first insulating layer 11, the gate terminal upper connection section 19g, the source terminal upper connection section 19s, and the transfer terminal upper connection section 19p, and in the contact holes CH1 and CH6, and is patterned. In this way, the patch electrode 15 being in contact with a drain electrode 7D in the contact hole CH1 is formed in the transmission and/or reception region R1, and the patch connection section 15p being in contact with the source connection wiring line 7p in the contact hole CH6 is formed in the non-transmission and/or reception region R2. The patterning of the patch electrode conductive film may be performed by wet etching. Here, an etchant capable of increasing an etching selection ratio between the transparent conductive film (ITO or the like) and the patch electrode conductive film (for example, an Al film) is used. In this way, when the patch electrode conductive film is patterned, the transparent conductive film can function as an etch stop. Since portions of the source bus line SL, the gate bus line GL, and the source connection wiring line 7p exposed by the contact holes CH2, CH3, and CH5 are covered with an etch stop (transparent conductive film), the portions are not etched.

Subsequently, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the transfer terminal upper connection section 19p are provided in the second insulating layer 17. In this way, the TFT substrate 102 is obtained.

Third Embodiment

A scanning antenna of a third embodiment will be described with reference to the drawings. A TFT substrate in the scanning antenna of the present embodiment differs from the TFT substrate 102 illustrated in FIGS. 8A to 8C in that an upper connection section including a transparent conductive film is not provided in a transfer terminal section.

Figure 10A:
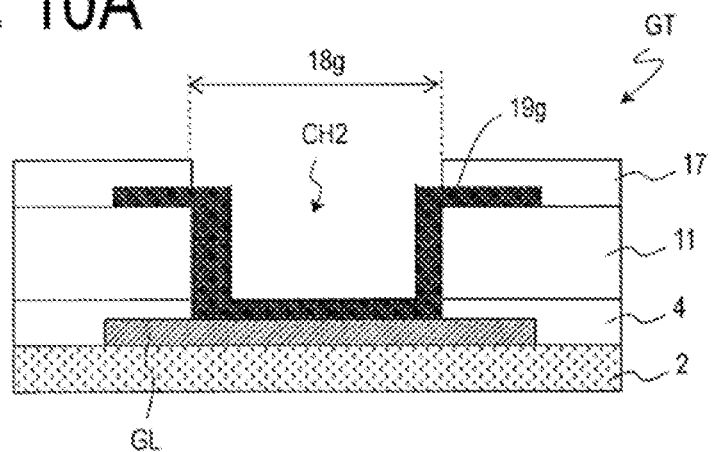
Figure 10B:
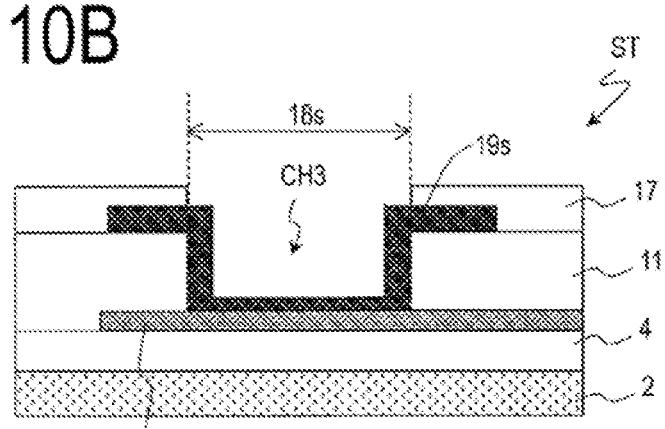
Figure 10C:
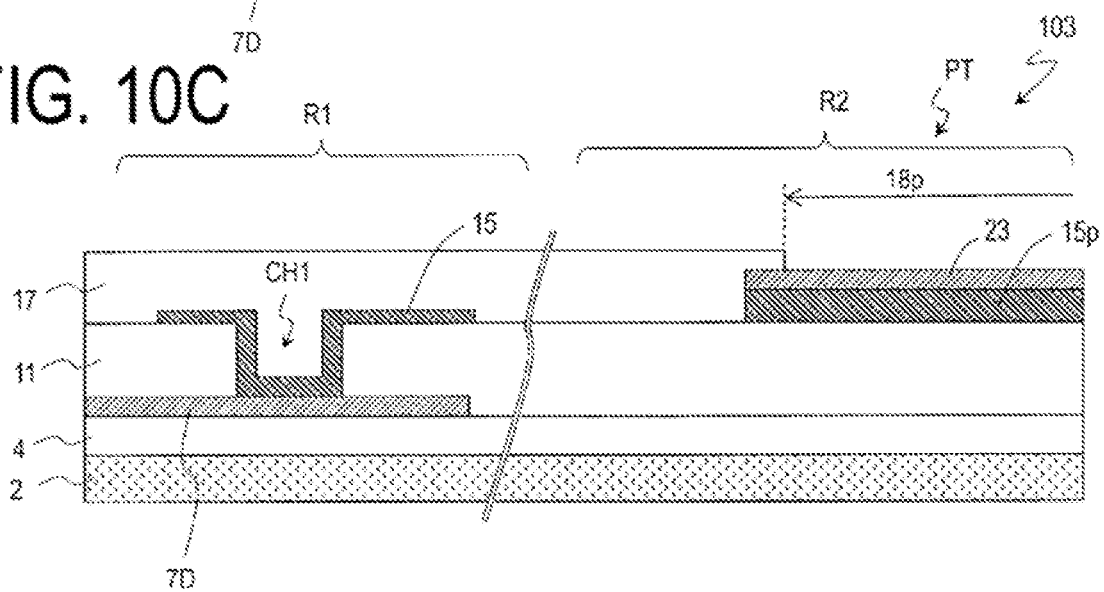

FIG. 10A to FIG. 10C are cross-sectional views illustrating a gate terminal section GT, a source terminal section ST, and a transfer terminal section PT of a TFT substrate 103 in the present embodiment, respectively. The same constituent elements as the constituent elements in FIG. 8A to FIG. 8C are denoted by the same reference signs, and description of these constituent elements will be omitted. Note that since a structure of an antenna unit region U is similar to the structure of the antenna unit region U in the above-described embodiment (FIG. 3A and FIG. 3B), illustration and description of the structure of the antenna unit region U will be omitted.

Structures of the gate terminal section GT and the source terminal section ST are similar to the structures of the gate terminal section and the source terminal section of the TFT substrate 102 illustrated in FIG. 8A and FIG. 8B.

The transfer terminal section PT includes a patch connection section 15p formed on a first insulating layer 11 and a protective conductive layer 23 layered on the patch connection section 15p. A second insulating layer 17 extends on the protective conductive layer 23 and includes an opening 18p exposing a part of the protective conductive layer 23. On the other hand, a patch electrode 15 is covered with the second insulating layer 17.

Manufacturing Method of TFT Substrate 103

Figure 11:
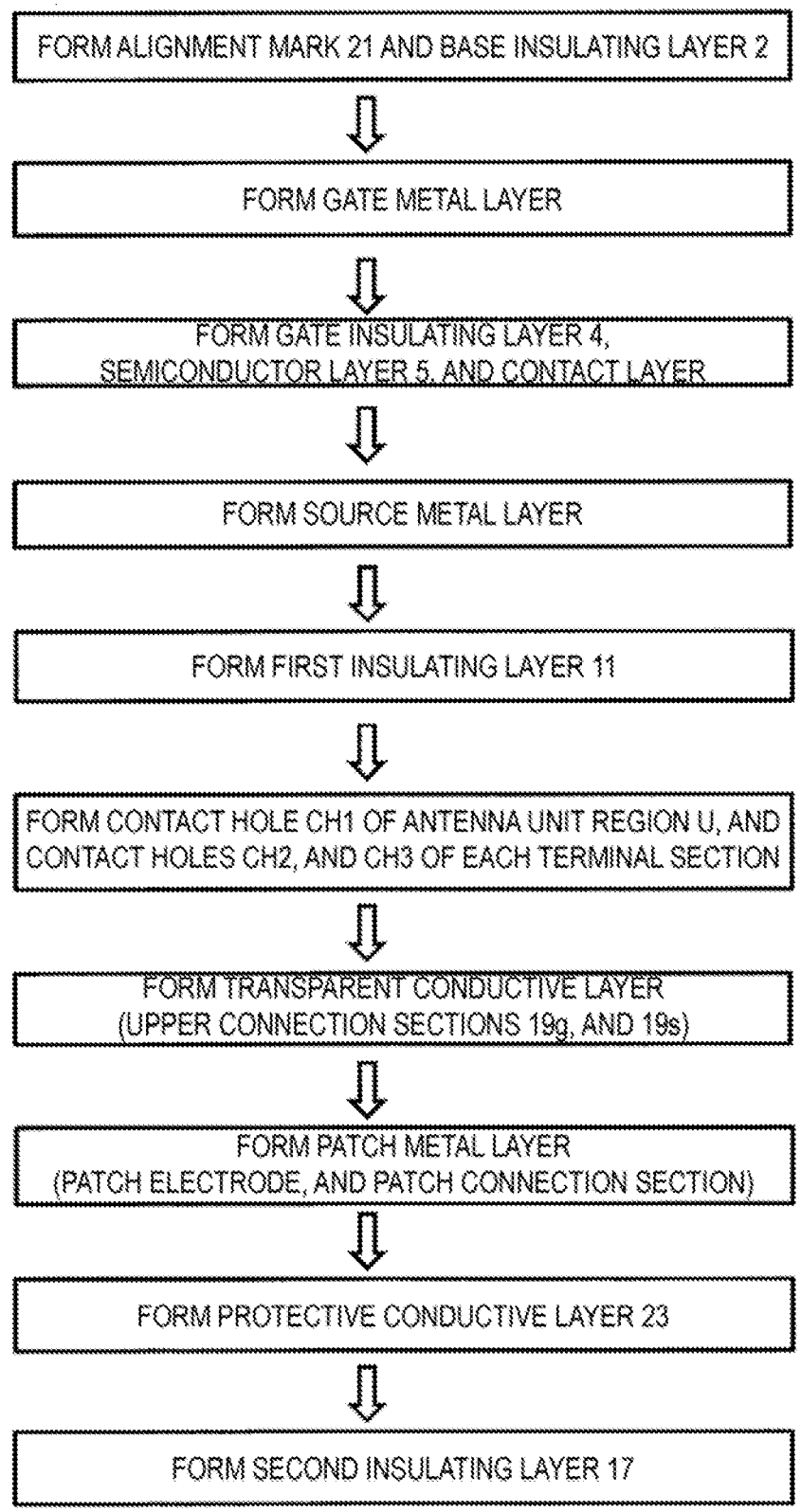
FIG. 11 is a view illustrating an example of the manufacturing steps of the TFT substrate 103.

A TFT substrate 103 is manufactured by the following method, for example. FIG. 11 is a view illustrating an example of manufacturing steps of the TFT substrate 103. Note that hereinafter, in a case where a material, a thickness, a formation method, and the like of each layer are the same as in the case of the TFT substrate 101 described above, description of the material, the thickness, the formation method, and the like of each layer will be omitted.

First, an alignment mark, a base insulating layer, a gate metal layer, a gate insulating layer, a semiconductor layer, a contact layer, and a source metal layer are formed on a dielectric substrate in the same method as in the case of the TFT substrate 101, and a TFT is obtained.

Next, the first insulating layer 11 is formed to cover the source metal layer. Thereafter, the first insulating layer 11 and a gate insulating layer 4 are collectively etched to form contact holes CH1 to CH3. During the etching, each of a source bus line SL and a gate bus line GL functions as an etch stop. In this way, the contact hole CH1 reaching at least a drain electrode of the TFT is formed in the first insulating layer 11, the contact hole CH2 reaching at least the gate bus line GL is formed in the first insulating layer 11 and the gate insulating layer 4, and the contact hole CH3 reaching at least the source bus line SL is formed in the first insulating layer 11. No contact hole is formed in a region where the transfer terminal section is formed.

Then, a transparent conductive film is formed on the first insulating layer 11 and in the contact holes CH1, CH2, and CH3, and is patterned. In this way, a gate terminal upper connection section 19g being in contact with the gate bus line GL in the contact hole CH2 and a source terminal upper connection section 19s being in contact with the source bus line SL in the contact hole CH3 are formed. In a region where the transfer terminal section is formed, the transparent conductive film is removed.

Next, a patch electrode conductive film is formed on the first insulating layer 11, the gate terminal upper connection section 19g and the source terminal upper connection section 19s, and in the contact hole CH1, and is patterned. In this way, the patch electrode 15 being in contact with a drain electrode 7D in the contact hole CH1 is formed in a transmission and/or reception region R1, and the patch connection section 15p is formed in a non-transmission and/or reception region R2. As with the above-described embodiments, an etchant capable of ensuring an etching selection ratio between the transparent conductive film (ITO or the like) and the patch electrode conductive film is used for patterning the patch electrode conductive film.

Subsequently, the protective conductive layer 23 is formed on the patch connection section 15p. A Ti layer, an ITO layer, an indium zinc oxide (IZO) layer (thickness of greater than or equal to 50 nm and less than or equal to 100 nm, for example), and the like can be used as the protective conductive layer 23. Here, a Ti layer (thickness of 50 nm, for example) is used as the protective conductive layer 23. Note that the protective conductive layer may be formed on the patch electrode 15.

Then, the second insulating layer 17 is formed. Thereafter, the second insulating layer 17 is patterned by, for example, dry etching using a fluorine-based gas. In this way, an opening 18g exposing the gate terminal upper connection section 19g, an opening 18s exposing the source terminal upper connection section 19s, and an opening 18p exposing the protective conductive layer 23 are provided in the second insulating layer 17. In this way, the TFT substrate 103 is obtained.

Structure of Slot Substrate 203

Figure 12:
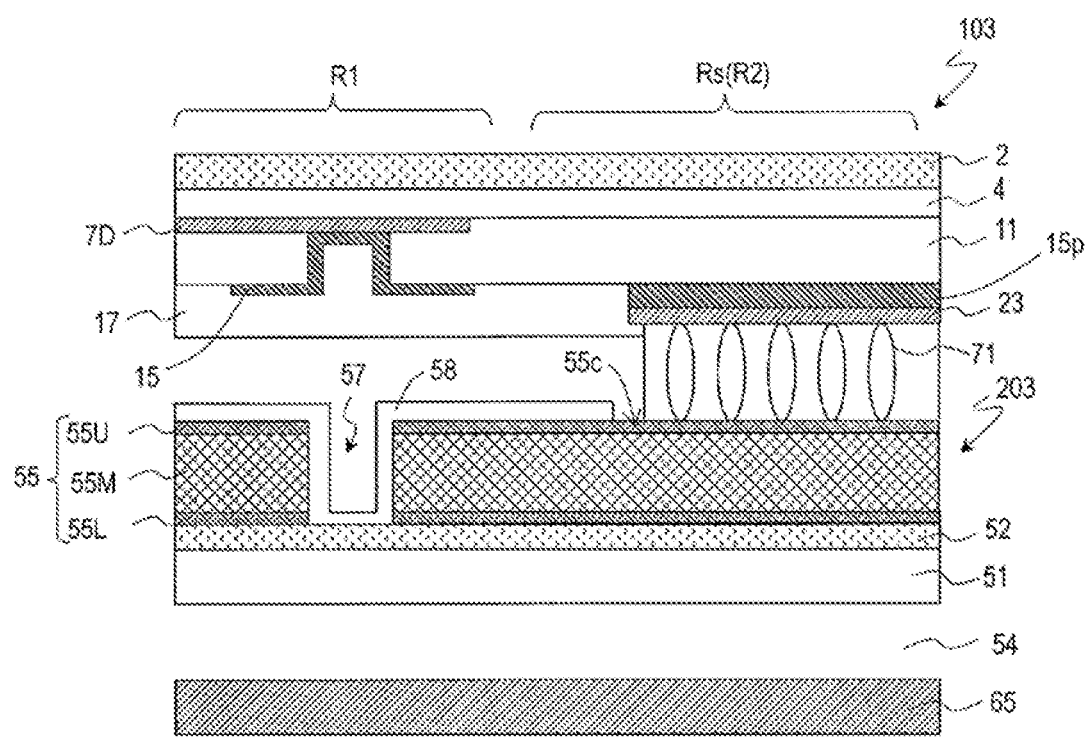
FIG. 12 is a schematic cross-sectional view for explaining a transfer section in the TFT substrate 103 and a slot substrate 203.

FIG. 12 is a schematic cross-sectional view for explaining a transfer section configured to connect the transfer terminal section PT of the TFT substrate 103 and a terminal section IT of a slot substrate 203 in the present embodiment. In FIG. 12, the same constituent elements as the constituent elements in the embodiments described above are denoted by the same reference signs.

First, the slot substrate 203 in this embodiment will be described. The slot substrate 203 includes a dielectric substrate 51, a third insulating layer 52 formed on a surface of the dielectric substrate 51, a slot electrode 55 formed on the third insulating layer 52, and a fourth insulating layer 58 covering the slot electrode 55. A reflective conductive plate 65 is disposed to face a rear surface of the dielectric substrate 51 via a dielectric layer (air layer) 54. The slot electrode 55 and the reflective conductive plate 65 function as walls of a waveguide 301.

The slot electrode 55 includes a layered structure including a Cu layer or an Al layer as a main layer 55M. In the transmission and/or reception region R1, a plurality of slots 57 are formed in the slot electrode 55. A structure of the slot electrode 55 in the transmission and/or reception region R1 is the same as the structure of the slot substrate 201 described above with reference to FIG. 6A to FIG. 6F.

The terminal section IT is provided in the non-transmission and/or reception region R2. The terminal section IT includes an opening exposing a surface of the slot electrode 55 and provided in the fourth insulating layer 58. An exposed area of the slot electrode 55 serves as a contact surface 55c. In this way, in the present embodiment, the contact surface 55c of the slot electrode 55 is not covered with the fourth insulating layer 58.

In the transfer section, the protective conductive layer 23 covering the patch connection section 15p of the TFT substrate 103 and the contact surface 55c of the slot electrode 55 of the slot substrate 203 are connected to each other via a resin (sealing resin) containing conductive beads 71.

As with the above-described embodiments, the transfer section in the present embodiment may be disposed at each of a central portion and a peripheral portion of the scanning antenna, or may be disposed in only any one of the central portion and the peripheral portion of the scanning antenna. In addition, the transfer section may be disposed in a seal region Rs or may be disposed outside the seal region Rs (opposite to the liquid crystal layer).

In the present embodiment, no transparent conductive film is provided on the transfer terminal section PT and the contact surface of the terminal section IT. Thus, the protective conductive layer 23 and the slot electrode 55 of the slot substrate 203 can be connected to each other via a sealing resin containing conductive particles.

In addition, in the present embodiment, since a difference in a depth among the contact holes collectively formed is small in comparison with the first embodiment (FIG. 3A to FIG. 4C), a damage to a conductive film serving as a base of a contact hole can be reduced.

Manufacturing Method of Slot Substrate 203

The slot substrate 203 is manufactured as follows. Since a material, a thickness, and a formation method of each layer are the same as in the case of the slot substrate 201, description of the material, the thickness, and the formation method of each layer will be omitted.

First, the third insulating layer 52 and the slot electrode 55 are formed on the dielectric substrate by the same method as in the case of the slot substrate 201, and the plurality of slots 57 are formed in the slot electrode 55. Then, the fourth insulating layer 58 is formed on the slot electrode 55 and in each slot. Thereafter, the opening 18p is provided in the fourth insulating layer 58 to expose a region serving as the contact surface of the slot electrode 55. In this way, the slot substrate 203 is manufactured.

A structure of the slot substrate 203 in the transmission and/or reception region R1 may be the same as the structures of the slot substrates 201A to 201E described above with reference to FIGS. 6B to 6F.

Internal Heater Structure

As described above, it is preferable that dielectric anisotropy $\Delta\varepsilon_M$ of a liquid crystal material used for an antenna unit of an antenna be large. However, viscosity of a liquid crystal material (nematic liquid crystal) having large dielectric anisotropy $\Delta\varepsilon_M$ is high, and there is a problem of a slow response speed. Particularly, as temperature decreases, viscosity increases. An environmental temperature of a scanning antenna mounted on a moving body (for example, a ship, an aircraft, and an automobile) fluctuates. Accordingly, it is preferable that a temperature of the liquid crystal material can be adjusted to a certain extent, for example 30° C. or greater, or 45° C. or greater. A set temperature is preferably set to cause the viscosity of the nematic liquid crystal material to be about 10 cP (centipoise) or less.

In addition to the above-described structure, the scanning antenna according to an embodiment of the disclosure preferably includes an internal heater structure. A resistance heating type heater utilizing Joule heat is preferable as the internal heater. A material of a heater resistive film is not particularly limited, but, for example, a conductive material having relatively high specific resistance such as ITO and IZO can be used. In addition, to adjust a resistance value, the resistive film may be formed of thin lines or meshes made of a metal (for example, nichrome, titanium, chromium, platinum, nickel, aluminum, and copper). Thin lines or meshes made of ITO and IZO can also be used. The resistance value may be set according to a required calorific value.

For example, to set a heat generation temperature of the resistive film to 30° C. in the area (roughly 90000 mm$^2$) of a circle having a diameter of 340 mm with 100 V AC (60 Hz), the resistance value of the resistive film may be set to 139Ω, a current may be set to 0.7 A, and power density may be set to 800 W/m². To set the heat generation temperature of the resistive film to 45° C. in the same area with 100 V AC (60 Hz), the resistance value of the resistive film may be set to 82Ω, a current may be set to 1.2 A, and power density may be set to 1350 W/m².

Figure 13A:
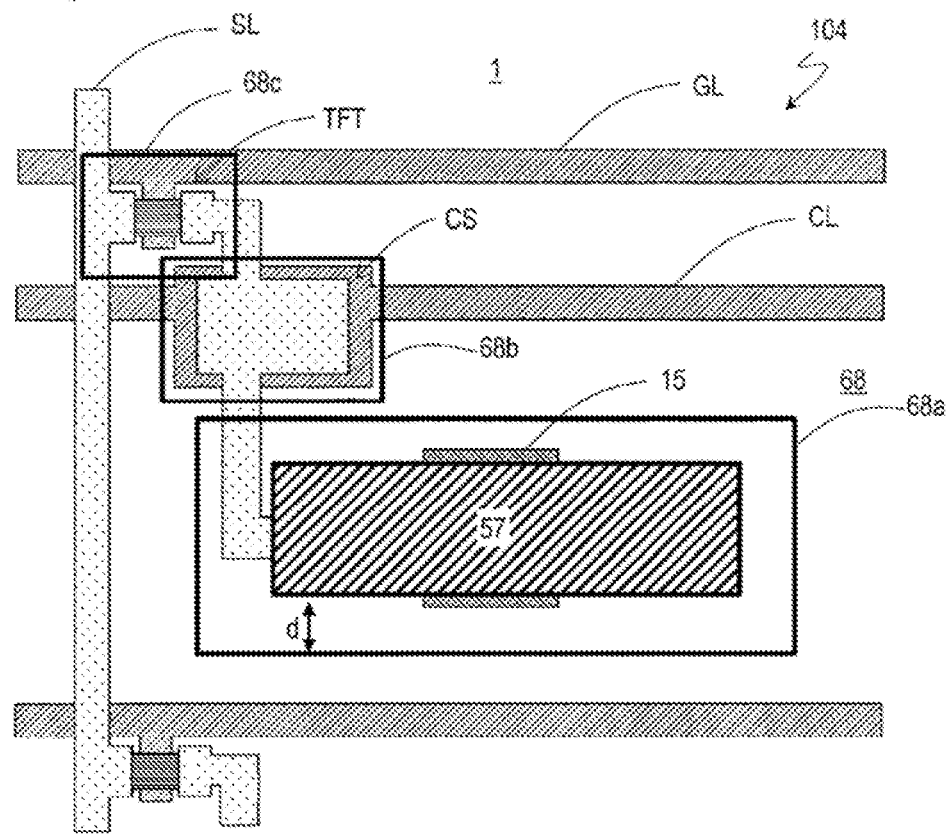
FIG. 13A is a schematic plan view of a TFT substrate 104 including a heater resistive film 68.

The heater resistive film may be provided anywhere as long as the heater resistive film does not affect an action of the scanning antenna, but to efficiently heat the liquid crystal material, the resistive film is preferably provided near the liquid crystal layer. For example, as illustrated in a TFT substrate 104 illustrated in FIG. 13A, a resistive film 68 may be formed almost entirely on a surface of a dielectric substrate 1. FIG. 13A is a schematic plan view of the TFT substrate 104 including the heater resistive film 68. The resistive film 68 is covered with, for example, the base insulating film 2 illustrated in FIG. 3A. The base insulating film 2 is formed to have sufficient dielectric strength voltage.

The resistive film 68 preferably includes openings 68a, 68b, and 68c. When the TFT substrate 104 and a slot substrate are bonded to each other, each slot 57 is located to face a patch electrode 15. At this time, the opening 68a is disposed to prevent the resistive film 68 from being present around in a distance d from an edge of the slot 57. The distance d is 0.5 mm, for example. In addition, it is also preferable to dispose the opening 68b under auxiliary capacitance CS and to dispose the opening 68c under a TFT.

Figure 13B:
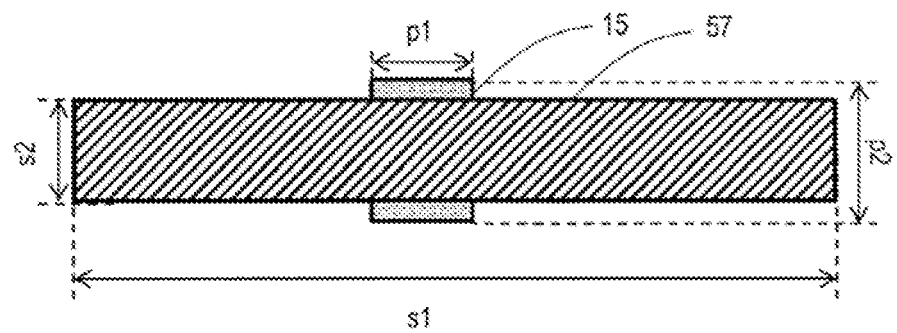
FIG. 13B is a schematic plan view for explaining sizes of a slot 57 and a patch electrode 15.

Note that a size of an antenna unit U is, for example, 4 mm×4 mm. In addition, as illustrated in FIG. 13B, a width s2 of the slot 57 is 0.5 mm, a length s1 of the slot 57 is 3.3 mm, a width p2 of the patch electrode 15 in a width direction of the slot 57 is 0.7 mm, and a width p1 of the patch electrode 15 in a length direction of the slot is 0.5 mm. Note that sizes, shapes, disposition relationships, and the like of the antenna unit U, the slot 57, and the patch electrode 15 are not limited to the examples illustrated in FIG. 13A and FIG. 13B.

To further reduce influence of an electric field from the heater resistive film 68, a shield conductive layer may be formed. The shield conductive layer is formed, for example, on the base insulating film 2 and almost entirely on the surface of the dielectric substrate 1. The shield conductive layer does not need to be provided with the openings 68a and 68b as with the resistive film 68, but is preferably provided with the opening 68c. The shield conductive layer is formed of, for example, an aluminum layer, and is set to have a ground potential.

In addition, the resistive film preferably has distribution of the resistance value to enable uniform heating of the liquid crystal layer. Temperature distribution of the liquid crystal layer preferably has a difference between a maximum temperature and a minimum temperature (temperature fluctuation) of, for example, less than or equal to 15° C. When the temperature fluctuation exceeds 15° C., defects such as variation in phase difference modulation in the plane, and failure in achieving good beam formation may occur. In addition, when the temperature of the liquid crystal layer approaches a Tni point (for example, 125° C.), the $\Delta \varepsilon_M$ becomes small and thus, such a temperature of the liquid crystal layer is not preferable.

With reference to FIG. 14A, FIG. 14, and FIG. 15A to FIG. 15C, the distribution of the resistance value in the resistive film will be described. FIG. 14A, FIG. 14B, and FIG. 15A to FIG. 15C illustrate schematic structures and current distribution of resistance heating structures 80a to 80e. The resistance heating structures each includes a resistive film and a heater terminal.

Figure 14A:
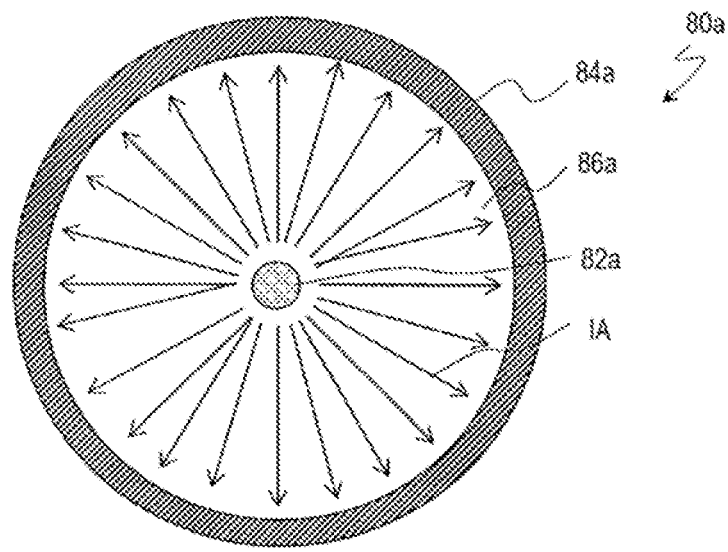
FIG. 14A and FIG. 14B are views illustrating schematic structures and current distribution of resistance heating structures 80a and 80b, respectively.

The resistance heating structure 80a illustrated in FIG. 14A includes a first terminal 82a, a second terminal 84a, and a resistive film 86a connected to the first terminal 82a and the second terminal 84a. The first terminal 82a is disposed at the center of a circle, and the second terminal 84a is disposed entirely along a circumference of the circle. Here, the circle corresponds to a transmission and/or reception region R1 When a DC voltage is applied between the first terminal 82a and the second terminal 84a, for example, a current IA flows radially from the first terminal 82a to the second terminal 84a. Accordingly, even though an in-plane resistance value is constant, the resistive film 86a can uniformly generate heat. Of course, a direction of a current flow may be a direction from the second terminal 84a to the first terminal 82a.

Figure 14B:
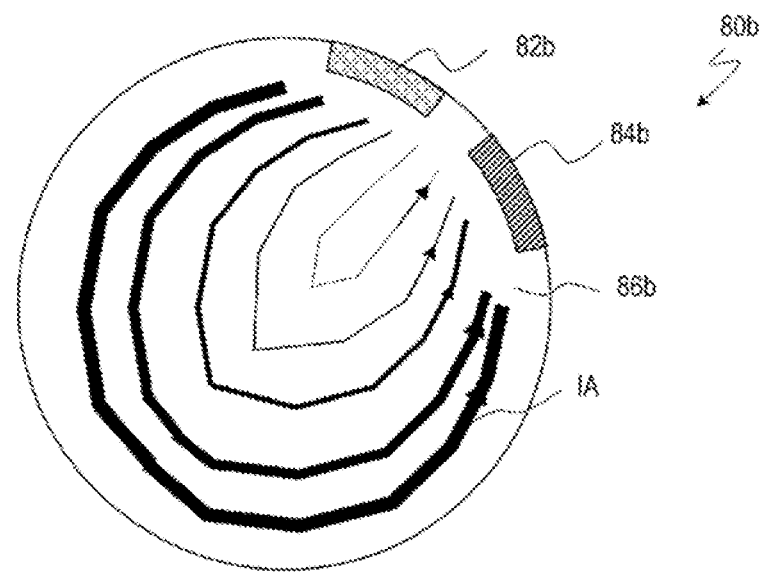

The resistance heating structure 80b illustrated in FIG. 14B includes a first terminal 82b, a second terminal 84b, and a resistive film 86b connected to the first terminal 82b and the second terminal 84b. The first terminal 82b and the second terminal 84b are disposed adjacent to each other along a circumference of a circle. A resistance value of the resistive film 86b has an in-plane distribution to cause a calorific value per unit area generated by the current IA flowing between the first terminal 82b and the second terminal 84b in the resistive film 86b to be constant. In a case where for example, the resistive film 86b is formed of thin lines, the in-plane distribution of the resistance value of the resistive film 86 may be adjusted by thicknesses of the thin lines and density of the thin lines.

Figure 15A:
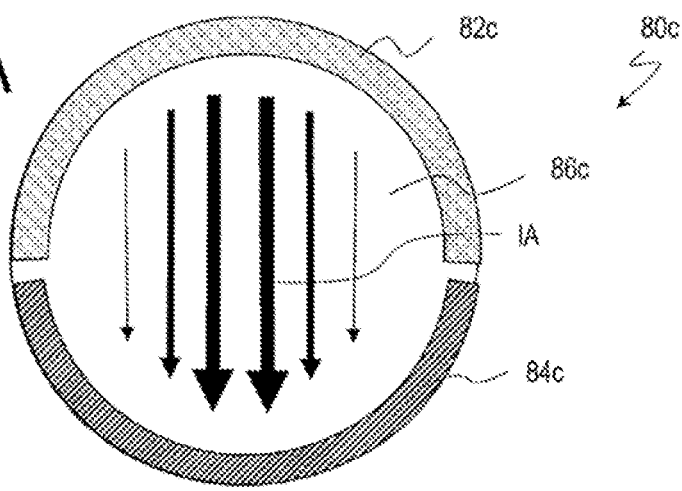
FIG. 15A to FIG. 15C are views illustrating schematic structures and current distribution of resistance heating structures 80c to 80e, respectively.
Figure 15B:
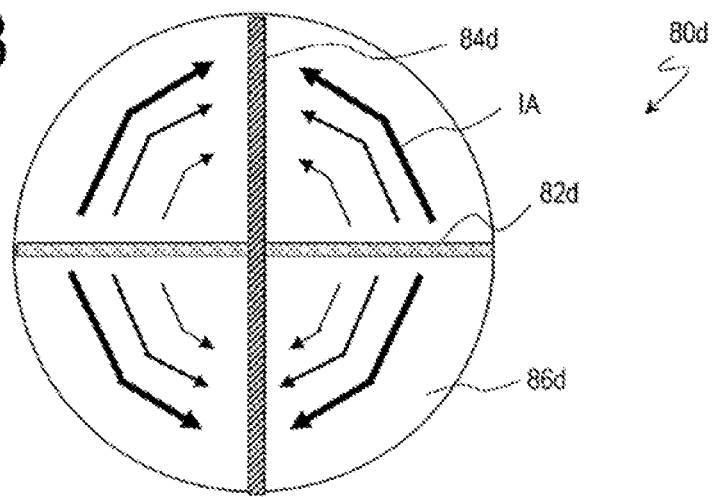

The resistance heating structure 80c illustrated in FIG. 15A includes a first terminal 82c, a second terminal 84c, and a resistive film 86c connected to the first terminal 82c and the second terminal 84c. The first terminal 82c is disposed along a circumference of an upper half of a circle, and the second terminal 84c is disposed along a circumference of a lower half of the circle. When the resistive film 86c is formed of, for example, thin lines extending vertically between the first terminal 82c and the second terminal 84c, for example thicknesses and density of the thin lines near the center are adjusted to increase to cause a calorific value per unit area generated by the current IA to be constant in the plane.

A resistance heating structure 80d illustrated in FIG. 151 includes a first terminal 82d, a second terminal 84d, and a resistive film 86d connected to the first terminal 82d and the second terminal 84d. The first terminal 82d and the second terminal 84d are provided to extend in a vertical direction and a horizontal direction, respectively, along a diameter of a circle. Although simplified in the figure, the first terminal 82d and the second terminal 84d are electrically insulated from each other.

Figure 15C:
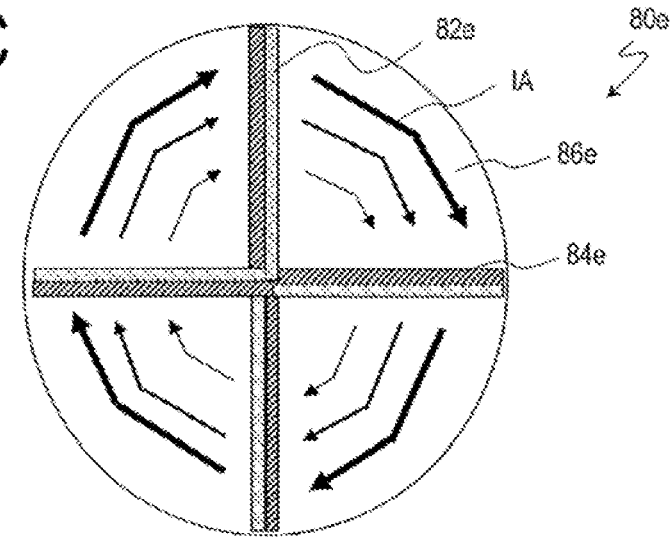

In addition, a resistance heating structure 80e illustrated in FIG. 15C includes a first terminal 82e, a second terminal 84e, and a resistive film 86e connected to the first terminal 82e and the second terminal 84e. Unlike the resistance heating structure 80d, any of the first terminal 82e and the second terminal 84e of the resistance heating structure 80e includes four portions extending from the center of a circle in four directions including the vertical direction and the horizontal direction. Each portion of the first terminal 82e and each portion of the second terminal 84e forming a 90 degree angle with each other are disposed to cause the current IA to flow clockwise.

In any of the resistance heating structure 80d and the resistance heating structure 80e, for example, the thin lines closer to the circumference of the circle are adjusted to be thick and to have higher density to cause a calorific value per unit area to be uniform in the plane and to cause the current IA to flow more as closer to the circumference of the circle.

For example, such an internal heater structure may be configured to detect a temperature of the scanning antenna to automatically act when the temperature falls below a preset temperature. Of course, the internal heater structure may be configured to act in response to an operation of a user.

External Heater Structure

Instead of the internal heater structure described above, or in addition to the internal heater structure, the scanning antenna according to an embodiment of the disclosure may include an external heater structure. As an external heater, various known heaters can be used, but a resistance heating type heater utilizing Joule heat is preferable. A part configured to generate heat in the heater will be referred to as a heater section. Hereinafter, an example in which a resistive film is used as the heater section will be described. Hereinafter, the resistive film is also denoted by reference sign 68.

Figure 16A:
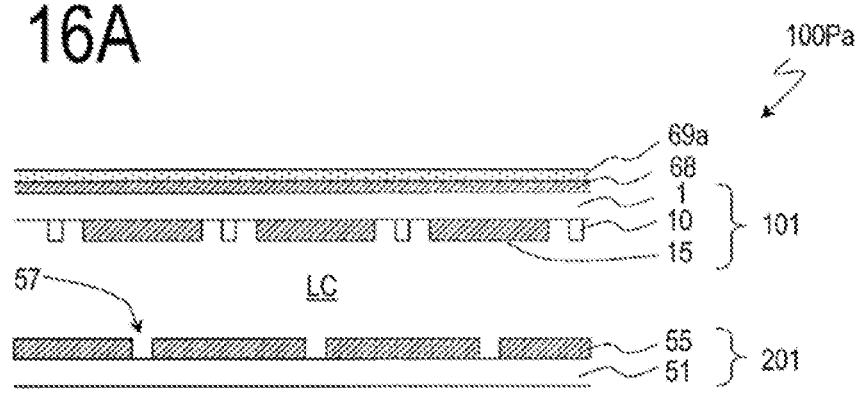
FIG. 16A is a schematic cross-sectional view of a liquid crystal panel 100Pa including the heater resistive film 68.
Figure 16B:
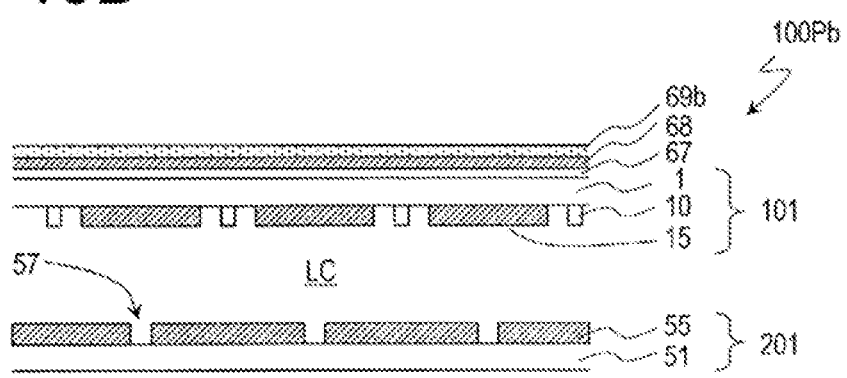

For example, the heater resistive film 68 is preferably disposed in the liquid crystal panel 100Pa or 100Pb as illustrated in FIGS. 16A and 16B. Here, the liquid crystal panels 100Pa and 100Pb each include the TFT substrate 101, the slot substrate 201, and the liquid crystal layer LC provided between the TFT substrate 101 and the slot substrate 201 of the scanning antenna 1000 illustrated in FIG. 1, and further each include a resistance heating structure including the resistive film 68 on an outer side of the TFT substrate 101. The resistive film 68 may be formed on the liquid crystal layer LC side of the dielectric substrate 1 of the TFT substrate 101. However, such a configuration complicates a manufacturing process of the TFT substrate 101 and thus, the resistive film 68 is preferably disposed on the outer side of the TFT substrate 101 (opposite to the liquid crystal layer LC).

The liquid crystal panel 100Pa illustrated in FIG. 16A includes the heater resistive film 68 formed on an outer surface of the dielectric substrate 1 of the TFT substrate 101 and a protection layer 69a covering the heater resistive film 68. The protection layer 69a may be omitted. The scanning antenna is housed in, for example, a case made of plastic and thus, a user is prevented from coming into direct contact with the resistive film 68.

The resistive film 68 can be formed on the outer surface of the dielectric substrate 1 by using, for example, a known thin film deposition technique (for example, sputtering, CVD), an application method, or a printing method. The resistive film 68 is patterned as necessary. The patterning is performed by a photolithography process, for example.

A material of the heater resistive film 68 is not particularly limited as described above for the internal heater structure, but, for example, a conductive material having relatively high specific resistance such as ITO and IZO can be used. In addition, to adjust a resistance value, the resistive film 68 may be formed of thin lines or meshes made of a metal (for example, nichrome, titanium, chromium, platinum, nickel, aluminum, and copper). Thin lines or meshes made of ITO and IZO may also be used. The resistance value may be set according to a required calorific value.

The protection layer 69a is formed of an insulating material and formed to cover the resistive film 68. The protection layer 69a may not be formed on a portion where the resistive film 68 is patterned and the dielectric substrate 1 is exposed. The resistive film 68 is patterned to prevent a decrease in antenna performance as described below. In a case where owing to presence of a material forming the protection layer 69a, the antenna performance decreases, the protection layer 69a patterned is preferably used as with the resistive film 68.

The protection layer 69a may be formed by any of a wet process and a dry process. For example, a liquid curable resin (or a precursor of a resin) or a solution is applied onto the surface of the dielectric substrate 1 on which the resistive film 68 is formed, and thereafter, the curable resin is cured to form the protection layer 69a. The liquid resin or the resin solution is applied onto the surface of the dielectric substrate 1 to have a predetermined thickness by various application methods (for example, by using a slot coater, a spin coater, or a spray) or various printing methods. Thereafter, room temperature curing, thermal curing, or light curing can be performed depending on a kind of the resin to form the protection layer 69a with an insulating resin film. The insulating resin film can be patterned by a photolithography process, for example.

A curable resin material is favorably used as a material for forming the protection layer 69a. The curable resin material includes a thermal curing type resin material and a light curing type resin material. The thermal curing type includes a thermal cross-linking type and a thermal polymerization type.

Examples of the thermal cross-linking type resin material include a combination of an epoxy-based compound (for example, an epoxy resin) and an amine-based compound, a combination of an epoxy-based compound and a hydrazide-based compound, a combination of an epoxy-based compound and an alcohol-based compound (for example, including a phenol resin), a combination of an epoxy-based compound and a carboxylic acid-based compound (for example, including an acid anhydride), a combination of an isocyanate-based compound and an amine-based compound, a combination of an isocyanate-based compound and a hydrazide-based compound, a combination of an isocyanate-based compound and an alcohol-based compound (for example, including a urethane resin), and a combination of an isocyanate-based compound and a carboxylic acid-based compound. In addition, examples of a cationic polymerization type adhesive material include a combination of an epoxy-based compound and a cationic polymerization initiator (a typical cationic polymerization initiator: an aromatic sulfonium salt). Examples of a radical polymerization type resin material include a combination of a monomer and/or a oligomer containing a vinyl group of various acrylic, methacrylic, and urethane modified acrylic (methacrylic) resins or the like and a radical polymerization initiator (a typical radical polymerization initiator: an azo-based compound (for example, AIBN (azobisisobutyronitrile))), and examples of a ring-opening polymerization type resin material include an ethylene oxide-based compound, an ethyleneimine-based compound, and a siloxane-based compound. In addition, a maleimide resin, a combination of a maleimide resin and an amine, a combination of maleimide and a methacrylic compound, a bismaleimide-triazine resin, and a polyphenylene ether resin can be used. In addition, polyimide can be used favorably. Note that "polyimide" includes a polyamic acid that is a precursor of polyimide. Polyimide is used in combination with an epoxy-based compound or an isocyanate-based compound, for example.

From a viewpoint of heat resistance, chemical stability, and mechanical characteristics, the thermal curing type resin material is preferably used. Particularly, a resin material containing an epoxy resin or a polyimide resin is preferable, and from a viewpoint of the mechanical characteristics (particularly, mechanical strength) and hygroscopicity, a resin material containing a polyimide resin is preferable. A polyimide resin and an epoxy resin can also be mixed to be used. In addition, a polyimide resin and/or an epoxy resin may be mixed with a thermoplastic resin and/or an elastomer. Further, a rubber-modified resin may be mixed as a polyimide resin and/or an epoxy resin. A thermoplastic resin or an elastomer can be mixed to improve flexibility or toughness. Even when the rubber-modified resin is used, the same effect can be obtained.

The light curing type resin material undergoes cross-linking reaction and/or polymerization reaction and cures by ultraviolet light or visible light. The light curing type includes a radical polymerization type and a cationic polymerization type, for example. A typical example of the radical polymerization type resin material includes a combination of an acrylic resin (an epoxy modified acrylic resin, a urethane modified acrylic resin, a silicone modified acrylic resin) and a photopolymerization initiator. Examples of an ultraviolet radical polymerization initiator include an acetophenone type initiator and a benzophenone type initiator. Examples of a visible light radical polymerization initiator can include a benzylic type initiator and a thioxanthone type initiator. A typical example of a cationic polymerization type resin material includes a combination of an epoxy-based compound and a photo cationic polymerization initiator. An example of the photo cationic polymerization initiator can include an iodonium salt-based compound. Note that a resin material having both light curing characteristics and thermal curing characteristics can also be used.

The liquid crystal panel 100Pb illustrated in FIG. 16B is different from the liquid crystal panel 100Pa in that the liquid crystal panel 100Pb further includes an adhesive layer 67 between the resistive film 68 and the dielectric substrate 1. Moreover, the liquid crystal panel 100Pb is different from the liquid crystal panel 100Pa in that a protection layer 69*b* is formed by using a polymer film or a glass plate prepared in advance.

For example, the liquid crystal panel 100Pb including the protection layer 69*b* formed of a polymer film is manufactured as follow.

First, an insulating polymer film serving as the protection layer 69*b* is provided. As the polymer film, for example, a polyester film made of polyethylene terephthalate, polyethylene naphthalate or the like, and a film made of super engineering plastic such as polyphenylene sulfone, polyimide, and polyamide are used. A thickness of the polymer film (that is, a thickness of the protection layer 69*b*) is greater than or equal to 5 μm and less than or equal to 200 μm, for example.

The resistive film 68 is formed on one surface of this polymer film. The resistive film 68 can be formed by the above-described method. The resistive film 68 may be patterned, and the polymer film may also be patterned as necessary.

The polymer film on which the resistive film 68 is formed (that is, a member including the protection layer 69*b* and the resistive film 68 integrally formed with each other) is bonded to the dielectric substrate 1 by using an adhesive material. As the adhesive material, the same curable resin as the curable resin used to form the protection layer 69*a* described above can be used. Further, a hot-melt type resin material (adhesive material) can also be used. The hot-melt type resin material contains a thermoplastic resin as a main component, and melts by heating and solidifies by cooling. Examples of the hot-melt type resin material include polyolefin-based (for example, polyethylene, polypropylene), polyamide-based, and ethylene vinyl acetate-based resin materials. In addition, a reactive urethane-based hot-melt resin material (adhesive material) is also commercially available. From a viewpoint of adhesiveness and durability, the reactive urethane-based resin material is preferable.

In addition, the adhesive layer 67 may be patterned as with the resistive film 68 and the protection layer (polymer film) 69*b*. However, since the adhesive layer 67 only needs to fix the resistive film 68 and the protection layer 69*b* to the dielectric substrate 1, the adhesive layer 67 may be smaller than any of the resistive film 68 and the protection layer 69*b*.

In place of the polymer film, the glass plate can also be used to form the protection layer 69*b*. A manufacturing process may be the same as in the case of using the polymer film. A thickness of the glass plate is preferably less than or equal to 1 mm and more preferably less than or equal to 0.7 mm. There is no particular lower limit of the thickness of the glass plate, but from a viewpoint of handleability, the thickness of the glass plate is preferably greater than or equal to 0.3 mm.

In the liquid crystal panel 100Pb illustrated in FIG. 16B, the resistive film 68 formed on the protection layer (the polymer film or the glass plate) 69*b* is fixed to the dielectric substrate 1 via the adhesive layer 67, but the resistive film 68 only needs to be disposed to come into contact with the dielectric substrate 1, and the resistive film 68 and the protection layer 69*b* are not necessarily fixed (bonded) to the dielectric substrate 1. That is, the adhesive layer 67 may be omitted. For example, the polymer film on which the resistive film 68 is formed (that is, the member including the protection layer 69*b* and the resistive film 68 integrally formed with each other) may be disposed to bring the resistive film 68 into contact with the dielectric substrate 1 and may be pressed against the dielectric substrate 1 with the case housing the scanning antenna. For example, since thermal contact resistance may increase when the polymer film on which the resistive film 68 is formed is merely disposed, the polymer film is preferably pressed against the dielectric substrate to decrease the thermal contact resistance. When such a configuration is adopted, the member including the resistive film 68 and the protection layer (the polymer film or the glass plate) 69*b* integrally formed with each other can be detachable.

Note that in a case where the resistive film 68 (and the protection layer 69*b*) is patterned as described below, the resistive film 68 (and the protection layer 69*b*) is preferably fixed to the dielectric substrate 1 to the extent that a position of the resistive film 68 (and the protection layer 69*b*) with respect to the TFT substrate does not shift to prevent antenna performance from decreasing.

The heater resistive film 68 may be provided anywhere as long as the heater resistive film 68 does not affect an action of the scanning antenna, but to efficiently heat the liquid crystal material, the heater resistive film 68 is preferably provided near the liquid crystal layer. Accordingly, the heater resistive film 68 is preferably provided on the outer side of the TFT substrate 101 as illustrated in FIGS. 16A and 16B. In addition, energy efficiency is higher, and controllability of temperature is higher in the case where the resistive film 68 is directly provided on the outer side of the dielectric substrate 1 of the TFT substrate 101 as illustrated in FIG. 16A than in the case where the resistive film 68 is provided on the outer side of the dielectric substrate 1 via the adhesive layer 67 as illustrated in FIG. 16B and thus, the case as illustrated in FIG. 16A is preferable.

For example, the resistive film 68 may be provided almost entirely on the surface of the dielectric substrate 1 of the TFT substrate 104 illustrated in FIG. 14A. The resistive film 68 preferably includes openings 68a, 68b, and 68c as described above for the internal heater structure.

The protection layers 69a and 69b may be each formed entirely on the surface to cover the resistive film 68. As described above, in a case where the protection layer 69a or 69b has an adverse effect on antenna characteristics, openings corresponding to the openings 68a, 68b, and 68c of the resistive film 68 may be provided. In this case, the openings of the protection layer 69a or 69b are formed inside the openings 68a, 68b, and 68c of the resistive film 68.

To further reduce influence of an electric field from the heater resistive film 68, a shield conductive layer may be formed. The shield conductive layer is formed on the dielectric substrate 1 side of the resistive film 68 via an insulating film, for example. The shield conductive layer is formed almost entirely on the surface of the dielectric substrate 1. The shield conductive layer does not need to be provided with the openings 68a and 68b as with the resistive film 68, but is preferably provided with the opening 68c. The shield conductive layer is formed of, for example, an aluminum layer, and is set to have a ground potential. In addition, the resistive film preferably has distribution of a resistance value to enable uniform heating of the liquid crystal layer. These configurations are also as described above for the internal heater structure.

Since the resistive film only needs to heat the liquid crystal layer LC in the transmission and/or reception region R1, the resistive film may be provided in a region corresponding to the transmission and/or reception region R1 as described above as an example, but is not limited to this example. For example, in the case where the TFT substrate 101 has an outline capable of defining a rectangular region including the transmission and/or reception region R1 as illustrated in FIG. 2A, the resistive film may be provided in a region corresponding to the rectangular region including the transmission and/or reception region R1. Of course, the outline of the resistive film is not limited to a rectangle, and may have any shape including the transmission and/or reception region R1.

In the above-described example, the resistive film is disposed on the outer side of the TFT substrate 101, but the resistive film may be disposed on an outer side of the slot substrate 201 (opposite to the liquid crystal layer LC). In this case, similarly, the resistive film may be formed directly on the dielectric substrate 51 as with the liquid crystal panel 100Pa in FIG. 16A, or the resistive film formed on the protection layer (the polymer film or the glass plate) via the adhesive layer may be fixed to the dielectric substrate 51 as with the liquid crystal panel 100Pb in FIG. 16B. Alternatively, the protection layer on which the resistive film is formed without the adhesive layer (that is, the member including the protection layer and the resistive film integrally formed with each other) may be disposed to bring the resistive film into contact with the dielectric substrate 51. For example, since thermal contact resistance may increase in a case where the polymer film on which the resistive film is formed is merely disposed, the polymer film is preferably pressed against the dielectric substrate 51 to decrease the thermal contact resistance. When such a configuration is adopted, the member including the resistive film and the protection layer (the polymer film or the glass plate) integrally formed with each other can be detachable. Note that in a case where the resistive film (and the protection layer) is patterned, the resistive film (and the protection layer) is preferably fixed to the dielectric substrate to the extent that a position of the resistive film (and the protection layer) with respect to the slot substrate does not shift to prevent antenna performance from decreasing.

In a case where the resistive film is disposed on the outer side of the slot substrate 201, openings are preferably provided at positions corresponding to the slots 57 of the resistive film. In addition, the resistive film has preferably a thickness sufficient to transmit microwaves.

Here, the example in which the resistive film is used as the heater section is described, but other than this, a nichrome line (for example, winding wire), an infrared light heater section, and the like can be used as the heater section, for example. In such a case, similarly, the heater section is preferably disposed to prevent antenna performance from decreasing.

For example, such an external heater structure may be configured to detect a temperature of the scanning antenna to automatically act when the temperature falls below a preset temperature. Of course, the external heater structure may be configured to act in response to an operation of a user.

As a temperature control device configured to cause the external heater structure to automatically act, various known thermostats can be used, for example. For example, a thermostat using bimetal may be connected between one of two terminals connected to the resistive film and a power source. Of course, a temperature control device using a temperature sensor to supply a current from the power source to the external heater structure to prevent the temperature from falling below a preset temperature may be used.

Driving Method

Since an antenna unit array of the scanning antenna according to an embodiment of the disclosure includes a structure similar to a structure of an LCD panel, line sequential driving is performed in the same manner as in an LCD panel. However, in a case where an existing driving method of an LCD panel is applied, the following problems may occur. Problems that may occur in the scanning antenna will be described with reference to an equivalent circuit diagram illustrated in FIG. 17 of one antenna unit of the scanning antenna.

First, as described above, specific resistance of a liquid crystal material having large dielectric anisotropy $\Delta \varepsilon_M$ (birefringence $\Delta n$ for visible light) in a microwave range is low and thus, in a case where a driving method of an LCD panel is applied as is, a voltage applied to the liquid crystal layer cannot be maintained sufficiently. Then, an effective voltage applied to the liquid crystal layer decreases, and an electrostatic capacitance value of the liquid crystal capacitance does not reach a target value.

When the voltage applied to the liquid crystal layer deviates from the predetermined value in this way, a direction in which a gain of the antenna becomes maximum deviates from a desired direction. Then, for example, a communication satellite cannot be tracked accurately. To prevent this, the auxiliary capacitance CS is provided electrically in parallel to the liquid crystal capacitance Clc to sufficiently increase a capacitance value C-Ccs of the auxiliary capacitance CS. The capacitance value C-Ccs of the auxiliary capacitance CS is preferably set appropriately to cause a voltage retention rate of the liquid crystal capacitance Clc to be 90% or greater.

In addition, when a liquid crystal material having low specific resistance is used, a voltage reduction due to interface polarization and/or orientation polarization also occurs.

To prevent the voltage reduction due to interface polarization and/or orientation polarization, it is conceivable to apply a sufficiently high voltage in anticipation of an amount of the voltage drop. However, when a high voltage is applied to the liquid crystal layer having low specific resistance, a dynamic scattering effect (DS effect) may occur. The DS effect is caused by convection of an ionic impurity in a liquid crystal layer, and the dielectric constant $\varepsilon_M$ of the liquid crystal layer approaches an average value (($\varepsilon_M$//+2$\varepsilon_M \perp$)/3). In addition, to control the dielectric constant em of the liquid crystal layer in multiple stages (multiple gray scales), it is not possible to constantly apply a sufficiently high voltage.

To suppress the above-described DS effect and/or the above-described voltage drop due to the polarization, a polarity inversion period of a voltage applied to the liquid crystal layer may be shortened sufficiently. As is well known, in a case where the polarity inversion period of the applied voltage is shortened, a threshold voltage at which the DS effect occurs increases. Accordingly, a polarity inversion frequency may be determined to cause a maximum value of a voltage (absolute value) applied to the liquid crystal layer to be less than the threshold voltage at which the DS effect occurs. When the polarity inversion frequency is 300 Hz or greater, a good action can be ensured even in a case where a voltage having an absolute value of 10 V is applied to a liquid crystal layer having specific resistance of $1 \times 10^{10}$ Ω·cm and the dielectric anisotropy Δε (@1 kHz) of about −0.6. In addition, when the polarity inversion frequency (typically equal to twice a frame frequency) is 300 Hz or greater, the above-described voltage drop due to the polarization is also suppressed. From the viewpoint of power consumption and the like, an upper limit of the polarity inversion period is preferably about less than or equal to 5 kHz.

As described above, since viscosity of the liquid crystal material depends on temperature, it is preferable that a temperature of the liquid crystal layer be appropriately controlled. Physical properties of the liquid crystal material and driving conditions described here correspond to values under an operating temperature of the liquid crystal layer. Conversely, the temperature of the liquid crystal layer is preferably controlled to enable driving under the above-described conditions.

An example of a waveform of a signal used for driving the scanning antenna will be described with reference to FIG. 18A to FIG. 18G. Note that FIG. 18D illustrates a waveform of a display signal Vs (LCD) supplied to a source bus line of an LCD panel for comparison.

FIG. 18A illustrates a waveform of a scanning signal Vg supplied to a gate bus line G-L1, FIG. 18B illustrates a waveform of the scanning signal Vg supplied to a gate bus line G-L2, FIG. 18C illustrates a waveform of the scanning signal Vg supplied to a gate bus line G-L3, FIG. 18E illustrates a waveform of a data signal Vda supplied to the source bus line, FIG. 18F illustrates a waveform of a slot voltage Vidc supplied to the slot electrode of the slot substrate (slot electrode), and FIG. 18G illustrates a waveform of a voltage applied to the liquid crystal layer of each antenna unit.

As illustrates in FIG. 18A to FIG. 18C, a voltage of the scanning signal Vg supplied to each gate bus line sequentially changes from a low level (VgL) to a high level (VgH). The VgL and the VgH can be set appropriately according to characteristics of the TFT. For example, VgL=from −5 V to 0 V, and VgH=+20 V. In addition, The VgL and the VgH may be set to VgL=−20 V and VgH=+20 V. A period from time when a voltage of the scanning signal Vg of a certain gate bus line changes from the low level (VgL) to the high level (VgH) until time when a voltage of the next gate bus line changes from the VgL to the VgH will be referred to as one horizontal scan period (1H). In addition, a period during which a voltage of each gate bus line is at the high level (VgH) will be referred to as a select period PS. In this select period PS, the TFT connected to each gate bus line is turned on, and a voltage at that time of the data signal Vda supplied to the source bus line is supplied to the corresponding patch electrode. The data signal Vda is, for example, from −15 V to +15 V (an absolute value is 15 V), and, for example, the data signal Vda having a different absolute value corresponding to 12 gray scales, or preferably corresponding to 16 gray scales is used.

Here, a case where a certain intermediate voltage is applied to all the antenna units will be described as an example. That is, it is assumed that the voltage of the data signal Vda is constant with respect to all the antenna units (assumed to be connected to m gate bus lines). This corresponds to a case where certain gray levels are displayed entirely on a surface in the LCD panel. At this time, dot inversion driving is performed in the LCD panel. That is, in each frame, a display signal voltage is supplied to cause polarities of pixels (dots) adjacent to each other to be opposite to each other.

FIG. 18D illustrates the waveform of the display signal of the LCD panel in which the dot inversion driving is performed. As illustrated in FIG. 18D, a polarity of the Vs (LCD) is inverted every 1H. A polarity of the Vs (LCD) supplied to the source bus line adjacent to the source bus line supplied with the Vs (LCD) having this waveform is opposite to the polarity of the Vs (LCD) illustrated in FIG. 18D. In addition, a polarity of a display signal supplied to each pixel is inverted for each frame. In the LCD panel, it is difficult to perfectly match magnitudes of the effective voltage applied to the liquid crystal layer between a positive polarity and a negative polarity, and a difference in the effective voltage becomes a difference in luminance viewed as flicker. To make this flicker difficult to view, the pixels (dots) to which voltage having different polarities is applied are spatially dispersed in each frame. Typically, the pixels (dots) having different polarities are arranged in a checkered pattern by performing dot inversion driving.

In contrast, in the scanning antenna, flicker itself is not problematic. That is, the electrostatic capacitance value of the liquid crystal capacitance only needs to be a desired value, and spatial distribution of a polarity in each frame is not problematic. Accordingly, from a viewpoint of low power consumption or the like, it is preferable to reduce the number of times of polarity inversion of the data signal Vda supplied from the source bus line, that is, to lengthen the period of polarity inversion. For example, as illustrated in FIG. 18E, the period of polarity inversion may be set to 10H (polarity inversion occurs every 5H). Of course, assuming that the number of the antenna units connected to each source bus line (typically equal to the number of the gate bus lines) is m, the period of polarity inversion of the data signal Vda may be 2 m-H (polarity inversion occurs every m-H). The period of polarity inversion of the data signal Vda may be equal to 2 frames (polarity inversion occurs for each frame).

In addition, the polarity of the data signal Vda supplied from each source bus line may be the same. Accordingly, for example, in a certain frame, the data signal Vda having a positive polarity may be supplied from each source bus line, and in the next frame, the data signal Vda having a negative polarity may be supplied from each source bus line.

Alternatively, the polarities of the data signals Vda supplied from the source bus lines adjacent to each other may be opposite to each other. For example, in a certain frame, the data signal Vda having a positive polarity is supplied from each odd-numbered source bus line, and the data signal Vda having a negative polarity is supplied from each even-numbered source bus line. Then, in the next frame, the data signal Vda having a negative polarity is supplied from each odd-numbered source bus line, and the data signal Vda having a positive polarity is supplied from each even-numbered source bus line. In the LCD panel, such a driving method is referred to as source line reversal driving. In a case where the data signals Vda supplied from the source bus lines adjacent to each other have opposite polarities, electric charges stored in the liquid crystal capacitance can be canceled between columns adjacent to each other by connecting (short-circuiting) the source bus lines adjacent to each other before inverting the polarities of the data signals Vda supplied between the frames. Accordingly, an advantage of enabling a reduction in an amount of electric charges supplied from the source bus line in each frame can be obtained.

As illustrated in FIG. 18F, the voltage Vidc of the slot electrode is, for example, a DC voltage, and is typically a ground potential. Since a capacitance value of capacitance (liquid crystal capacitance and auxiliary capacitance) of the antenna unit is greater than a capacitance value of pixel capacitance of an LCD panel (for example, about 30 times in comparison with a 20-inch LCD panel), there is no influence from a pull-in voltage due to parasitic capacitance of the TFT, and even in a case where the voltage Vidc of the slot electrode is a ground potential and the data signal Vda is a positive or negative symmetrical voltage on the basis of the ground potential, a voltage supplied to the patch electrode is a positive or negative symmetrical voltage. In the LCD panel, the positive and negative symmetrical voltage is applied to the pixel electrode by adjusting a voltage (common voltage) of the counter electrode in consideration for the pull-in voltage of the TFT, but this is not necessary for the slot voltage of the scanning antenna, and the slot voltage may be a ground potential. In addition, although not illustrated in FIG. 18A to FIG. 18G the same voltage as the slot voltage Vidc is supplied to the CS bus line.

The voltage applied to the liquid crystal capacitance of each antenna unit is the voltage of the patch electrode with respect to the voltage Vidc (FIG. 18F) of the slot electrode (that is, the voltage of the data signal Vda illustrated in FIG. 18E) and thus, when the slot voltage Vidc is a ground potential, the voltage applied to the liquid crystal capacitance of each antenna unit as illustrated in FIG. 18G matches the waveform of the data signal Vda illustrated in FIG. 18E.

The waveform of the signal used for driving the scanning antenna is not limited to the above example. For example, as described below with reference to FIG. 19A to FIG. 19E and FIG. 20A to FIG. 20E, a Viac having an oscillation waveform may be used as the voltage of the slot electrode.

For example, signals such as those exemplified in FIG. 19A to FIG. 19E can be used. In FIG. 19A to FIG. 19E, although the waveform of the scanning signal Vg supplied to the gate bus line is omitted, the scanning signals Vg described with reference to FIG. 18A to FIG. 18C are also used here.

Figure 19A:
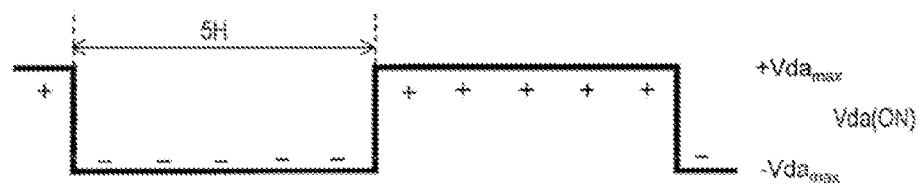

As illustrated in FIG. 19A, as with in FIG. 18E, a case where polarity inversion of the waveform of the data signal Vda occurs at a 10H period (every 5H) will be exemplified. Here, a case where an amplitude is a maximum value $|Vda_{max}|$ is described as the data signal Vda. As described above, polarity inversion of the waveform of the data signal Vda may occur at a two frame period (for each frame).

Figure 19B:
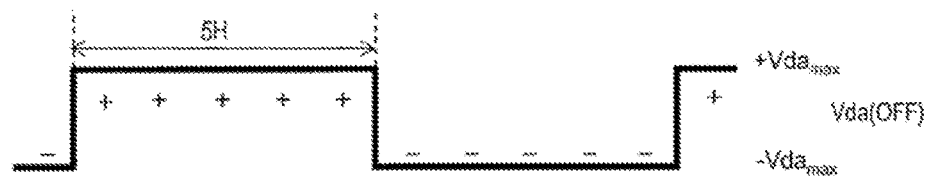
Figure 19C:
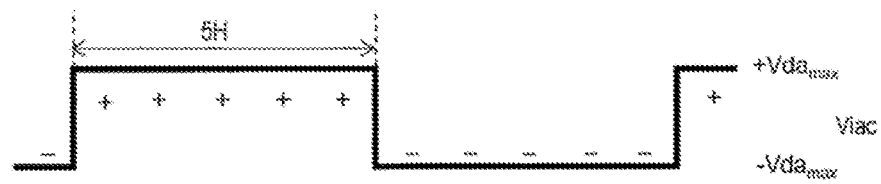

Here, as illustrated in FIG. 19C, the voltage Viac of the slot electrode is an oscillation voltage having a polarity opposite to a polarity of a data signal Vda (ON), and having the same oscillation period as an oscillation period of the data signal Vda (ON). An amplitude of the voltage Viac of the slot electrode is equal to the maximum value $|Vda_{max}|$ of the amplitude of the data signal Vda. That is, it is assumed that the slot voltage Viac is a voltage having the same period of polarity inversion as a period of polarity inversion of the data signal Vda (ON) and having a polarity opposite to the polarity of the data signal Vda (ON) (a phase differs by 180°), and oscillating between $-Vda_{max}$ and $+Vda_{max}$.

Figure 19D:
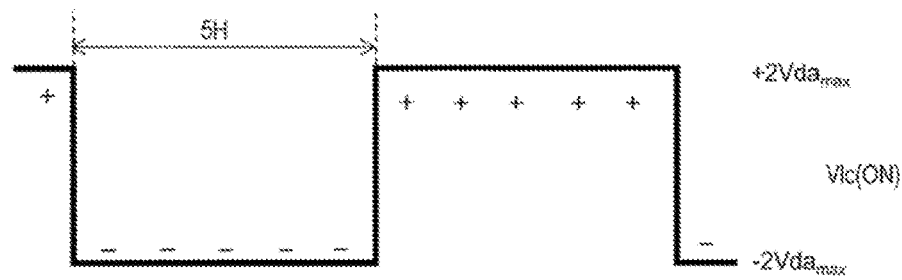

Since a voltage Vlc applied to the liquid crystal capacitance of each antenna unit is the voltage of the patch electrode with respect to the voltage Viac (FIG. 19C) of the slot electrode (that is, the voltage of the data signal Vda (ON) illustrated in FIG. 19A), when the amplitude of the data signal Vda oscillates at $\pm Vda_{max}$, the voltage applied to the liquid crystal capacitance has a waveform oscillating at an amplitude twice $Vda_{max}$ as illustrated in FIG. 19D. Accordingly, a maximum amplitude of the data signal Vda required to cause a maximum amplitude of the voltage Vlc applied to the liquid crystal capacitance to be $\pm Vda_{max}$ is $\pm Vda_{max}/2$.

The maximum amplitude of the data signal Vda can be halved by using such a slot voltage Viac and thus, for example, an advantage of enabling use of a general-purpose driver IC having a breakdown voltage of 20 V or less as a driver circuit configured to output the data signal Vda can be obtained.

Note that to cause a voltage Vlc (OFF) applied to the liquid crystal capacitance of each antenna unit to be zero as illustrated in FIG. 19E, a data signal Vda (OFF) may have the same waveform as the waveform of the slot voltage Viac as illustrated in FIG. 19B.

For example, a case where the maximum amplitude of the voltage Vlc applied to the liquid crystal capacitance is +15 V will be considered. When the Vidc illustrated in FIG. 18F is used as the slot voltage to obtain Vidc=0 V, the maximum amplitude of the Vda illustrated in FIG. 18E becomes $\pm 15$ V. In contrast, when the Viac illustrated in FIG. 19C is used as the slot voltage and a maximum amplitude of the Viac is 7.5 V, a maximum amplitude of the Vda (ON) illustrated in FIG. 19A becomes $\pm 7.5$ V.

When the voltage Vlc applied to the liquid crystal capacitance is 0 V, the Vda illustrated in FIG. 18E may be set to 0 V, and a maximum amplitude of the Vda (OFF) illustrated in FIG. 19B may be set to $\pm 7.5$ V.

In a case where the Viac illustrated in FIG. 19C is used, the amplitude of the voltage Vlc applied to the liquid crystal capacitance is different from the amplitude of Vda and thus, appropriate conversion is necessary.

Signals as exemplified in FIG. 20A to FIG. 20E can also be used. The signals illustrated in FIG. 20A to FIG. 20E are the same as the signals illustrated in FIG. 19A to FIG. 19E in that the voltage Viac of the slot electrode is an oscillation voltage having an oscillation phase shifted by 180° from an oscillation phase of the data signal Vda (ON) as illustrated FIG. 20C. However, as illustrated in each of FIG. 20A to FIG. 20C, any of the data signals Vda (ON) and Vda (OFF) and the slot voltage Viac is a voltage oscillating between 0 V and a positive voltage. An amplitude of the voltage Viac of the slot electrode is equal to the maximum value $|Vda_{max}|$ of the amplitude of the data signal Vda.

When such a signal is used, the driving circuit only needs to output a positive voltage, and contributes to cost reduction. Even in the case where the voltage oscillating between 0 V and a positive voltage is used in this way, a polarity of the voltage Vlc (ON) applied to the liquid crystal capacitance is inverted as illustrated in FIG. 20D. In a voltage waveform illustrated in FIG. 20D, + (positive) indicates that the voltage of the patch electrode is higher than the slot voltage, and − (negative) indicates that the voltage of the patch electrode is lower than the slot voltage. That is, a direction (polarity) of an electric field applied to the liquid crystal layer is inverted as with the other examples. An amplitude of the voltage Vlc (ON) applied to the liquid crystal capacitance is the $Vda_{max}$.

Figure 20A:
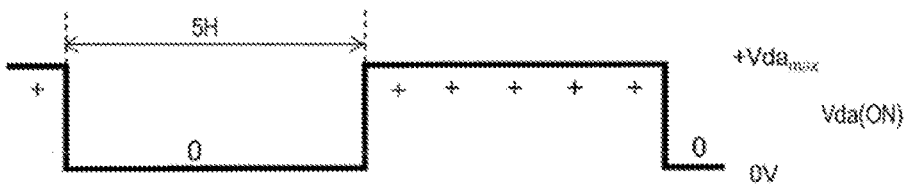
FIG. 20A to FIG. 20E are each a view illustrating yet another example of a waveform of each signal used for driving the scanning antenna according to an embodiment.
Figure 20B:
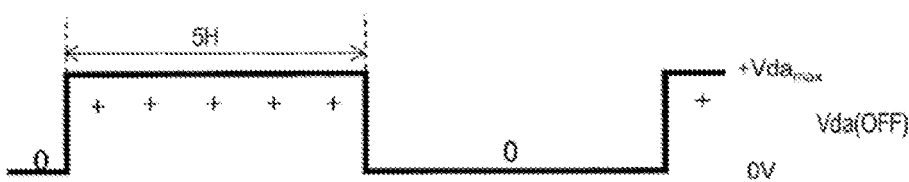
Figure 20C:
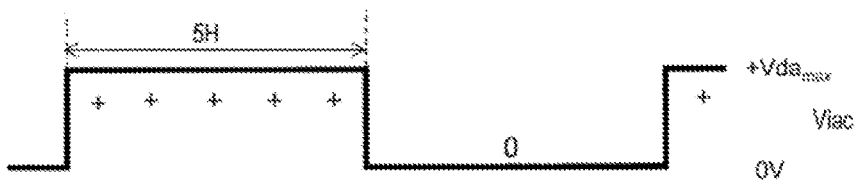
Figure 20D:
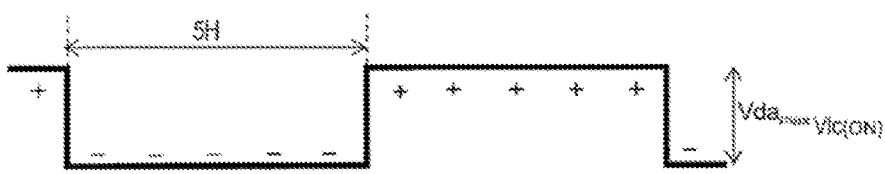
Figure 20E:

Note that, to make the voltage Vlc (OFF) applied to the liquid crystal capacitance of each antenna unit zero as illustrated in FIG. 20E, the data signal Vda (OFF) may have the same waveform as the waveform of the slot voltage Viac as illustrated in FIG. 20B.

The driving method described with reference to FIG. 19A to FIG. 19E and FIG. 20A to FIG. 20E including oscillating (inverting) the voltage Viac of the slot electrode corresponds to a driving method including inverting a counter voltage (may be referred to as "common reversal driving") in terms of the driving method of an LCD panel. In an LCD panel, since flicker cannot be suppressed sufficiently, the common reversal driving is not adopted. In contrast, in the scanning antenna, since flicker does not become problematic, the slot voltage can be inverted. The oscillation (inversion) is performed for each frame, for example (the 5H in FIG. 19A to FIG. 19E and FIG. 20A to FIG. 20E is set to 1V (vertical scanning period or frame)).

In the above description, although the example in which the voltage Viac of the slot electrode is applied as one voltage value, that is, the example in which the slot electrode common to all the patch electrodes is provided, the slot electrode may be divided corresponding to one row or two or more rows of the patch electrodes. Here, the row refers to a set of the patch electrodes connected to one gate bus line via the TFT. When the slot electrode is divided into a plurality of row portions in this way, polarities of voltage of the respective portions of the slot electrode can be made independent from one another. For example, in any frame, polarities of the voltage applied to the patch electrodes connected to the gate bus lines adjacent to each other can be inverted. In this way, it is possible to perform not only row inversion in which the polarities are inverted for each single row (1H inversion) of the patch electrodes, but also m-row inversion (mH inversion) in which the polarities are inverted every two or more rows. Of course, the row inversion and the frame reversal can be combined.

From a viewpoint of simplicity of driving, it is preferable that in any frame, the polarities of the voltage applied to the patch electrodes be all the same, and the polarities be inverted for each frame.

Example of Antenna Unit Array and Connection of Gate Bus Line and Source Bus Line In the scanning antenna according to an embodiment of the disclosure, the antenna units are arranged in a concentric circle shape, for example.

For example, in a case where the antenna units are arranged in m concentric circles, one gate bus line is provided, for example, for each circle and a total of m gate bus lines is provided. Assuming that an outer diameter of the transmission and/or reception region R1 is, for example, 800 mm, m is, for example, 200. Assuming that the innermost gate bus line is the first one, n (30, for example) antenna units are connected to the first gate bus line and nx (620, for example) antenna units are connected to the mth gate bus line.

In such arrangement, the number of the antenna units connected to each gate bus line is different. In addition, although m antenna units are connected to the nx source bus lines connected to the nx antenna units constituting the outermost circle, the number of the antenna units connected to the source bus lines connected to the antenna units constituting the inner circle becomes less than m.

In this way, the arrangement of the antenna units in the scanning antenna is different from the arrangement of pixels (dots) in an LCD panel, and the number of the connected antenna units differs depending on the gate bus lines and/or the source bus lines. Accordingly, in a case where the capacitance (liquid crystal capacitance+auxiliary capacitance) of all the antenna units is set to be the same, connected electrical loads differ depending on the gate bus lines and/or the source bus lines. In such a case, there is a problem of occurrence of variation in writing of a voltage into the antenna unit.

Therefore, to prevent this, for example, the capacitance value of the auxiliary capacitance is preferably adjusted, or the number of the antenna units connected to the gate bus lines and/or the source bus lines is preferably adjusted to make the electrical loads connected to the respective gate bus lines and the respective source bus lines substantially the same.

The scanning antenna according to an embodiment of the disclosure is housed in, for example, a plastic housing, as necessary. A material having a small dielectric constant $\varepsilon_M$ that does not affect microwave transmission and/or reception is preferably used as a material for the housing. In addition, a through-hole may be provided in a portion corresponding to the transmission and/or reception region R1 of the housing. Further, a light blocking structure may be provided to prevent the liquid crystal material from being exposed to light. The light blocking structure is provided, for example, to block light passing from a side surface of the dielectric substrate 1 of the TFT substrate 101 and/or a side surface of the dielectric substrate 51 of the slot substrate 201 into the dielectric substrate 1 and/or the dielectric substrate 51 and entering the liquid crystal layer. A liquid crystal material having large dielectric anisotropy $\Delta\varepsilon_M$ may be prone to photodegradation, and it is preferable to block not only an ultraviolet ray but also short-wavelength blue light among visible light. The light blocking structure can be formed easily in a necessary location by using, for example, a light-blocking tape such as a black adhesive tape.

INDUSTRIAL APPLICABILITY

The embodiments according to the disclosure are used in a scanning antenna for satellite communication or satellite broadcasting mounted on a mobile body (a ship, an aircraft, and an automobile, for example) and inspection of the same.

REFERENCE SIGNS LIST

1 Dielectric substrate
2 Base insulating film
3 Gate electrode
4 Gate insulating layer
5 Semiconductor layer
6D Drain contact layer
6S Source contact layer
7D Drain electrode 7S Source electrode
7p Source connection wiring line
11 First insulating layer
15 Patch electrode
15p Patch connection section
17 Second insulating layer
18g, 18s, 18p Opening
19g Gate terminal upper connection section
19p Transfer terminal upper connection section
19s Source terminal upper connection section
21 Alignment mark
23 Protective conduction layer
51 Dielectric substrate
52, 52a, 52b Third insulating layer
52bU Upper insulating layer
52bL Lower insulating layer
54 Dielectric layer (air Layer)
55 Slot electrode
55L Lower layer
55M Main layer
55U Upper layer
55c Contact surface
57 Slot
58, 58a Fourth insulating layer
59a, 59b Conductive layer
59bU Upper conductive layer
59bL Lower conductive layer
60 Upper connection section
65 Reflective conductive plate
67 Adhesive layer
68 Heater resistive film
70 Power feed device
71 Conductive beads
72 Power feed pin
73 Sealing portion
101, 102, 103, 104 TFT substrate
201, 201A, 201B, 201C, 201D, 201E, 203 Slot substrate
1000 Scanning antenna
CH1, CH2, CH3, CH4, CH5, CH6 Contact hole
GD Gate driver
GL Gate bus line
GT Gate terminal section
SD Source driver
SL Source bus line
ST Source terminal section
PT Transfer terminal section
IT Terminal section
LC Liquid crystal layer
R1 Transmission and/or reception region
R2 Non-transmission and/or reception region
Rs Seal region
U Antenna unit, Antenna unit region

The invention claimed is:

1. A scanning antenna provided with an array of a plurality of antenna units, the scanning antenna comprising:
a thin-film transistor (TFT) substrate including a first dielectric substrate, a plurality of TFTs supported on the first dielectric substrate, a plurality of gate bus lines, a plurality of source bus lines, and a plurality of patch electrodes;
a slot substrate including a second dielectric substrate, a slot electrode supported on a first main surface of the second dielectric substrate, and an insulating layer disposed between the second dielectric substrate and the slot electrode;
a liquid crystal layer provided between the TFT substrate and the slot substrate; and
a reflective conductive plate disposed to face via a dielectric layer a second main surface opposite the first main surface of the second dielectric substrate,
wherein the slot electrode comprises a plurality of slots disposed corresponding to the plurality of patch electrodes,
the plurality of patch electrodes are each connected to a drain of a corresponding TFT,
the slot electrode has tensile stress, and
the insulating layer has compressive stress.

2. The scanning antenna according to claim 1,
wherein the slot electrode comprises a Cu layer, and has a thickness of from approximately 2 μm to approximately 6 μm, inclusive.

3. The scanning antenna according to claim 1,
wherein the insulating layer comprises a silicon nitride layer, and has a thickness of from approximately 200 nm to approximately 900 nm, inclusive.

4. The scanning antenna according to claim 3,
wherein the silicon nitride layer has a hydrogen removal amount of approximately $3\times10^{16}/cm^2$ or less.

5. The scanning antenna according to claim 3,
wherein the silicon nitride layer has a refractive index of approximately 1.805 or greater.

6. The scanning antenna according to claim 1,
wherein the insulating layer comprises a silicon oxide layer, and has a thickness of from approximately 200 nm to approximately 900 nm, inclusive.

7. The scanning antenna according to claim 6,
wherein the silicon oxide layer has a refractive index of from approximately 1.4 to approximately 1.6, inclusive.

8. The scanning antenna according to claim 1,
wherein the insulating layer comprises a silicon nitride layer and a silicon oxide layer,
the silicon nitride layer is closer to the slot electrode than the silicon oxide layer, and
the insulating layer has a thickness of from approximately 200 nm to approximately 900 nm, inclusive.

9. The scanning antenna according to claim 1,
wherein the insulating layer comprises a silicon nitride layer and a silicon oxide layer,
the silicon oxide layer is closer to the slot electrode than the silicon nitride layer, and
the insulating layer has a thickness of from approximately 200 nm to approximately 900 nm, inclusive.

10. The scanning antenna according to claim 1,
wherein the second dielectric substrate is a glass substrate, and has a thickness of from approximately 0.65 mm to approximately 0.74 mm, inclusive.

11. The scanning antenna according to claim 1,
wherein the slot substrate further comprises a conductive layer covering a surface of the slot electrode.

* * * * *